US012713611B2

(12) United States Patent
Kubo et al.

(10) Patent No.: US 12,713,611 B2
(45) Date of Patent: Aug. 18, 2026

(54) THREE-DIMENSIONAL MEMORY DEVICE WITH DIFFERENT WIDTH SUPPORT PILLAR STRUCTURES AND METHODS OF MAKING THE SAME

(71) Applicant: WESTERN DIGITAL TECHNOLOGIES, INC., San Jose, CA (US)

(72) Inventors: Tomohiro Kubo, Yokkaichi (JP); Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 338 days.

(21) Appl. No.: 18/493,036

(22) Filed: Oct. 24, 2023

(65) Prior Publication Data

US 2025/0133737 A1 Apr. 24, 2025

(51) Int. Cl.

| | |
|---|---|
| ***H10B 43/27*** | (2023.01) |
| ***H10B 41/27*** | (2023.01) |
| ***H10B 80/00*** | (2026.01) |
| ***H10W 42/00*** | (2026.01) |
| ***H10W 80/00*** | (2026.01) |
| ***H10W 90/00*** | (2026.01) |

(52) U.S. Cl.

CPC ............. *H10B 43/27* (2023.02); *H10B 41/27* (2023.02); *H10B 80/00* (2023.02); *H10W 42/121* (2026.01); *H10W 90/00* (2026.01); *H10W 80/211* (2026.01); *H10W 80/312* (2026.01); *H10W 80/327* (2026.01); *H10W 90/792* (2026.01)

(58) Field of Classification Search

None

See application file for complete search history.

(56) References Cited

U.S. PATENT DOCUMENTS

| | | | |
|---|---|---|---|
| 9,853,038 | B1 | 12/2017 | Cui |
| 10,192,784 | B1 | 1/2019 | Cui et al. |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Nduka E Ojeh

(74) *Attorney, Agent, or Firm* — THE MARBURY LAW GROUP PLLC

(57) ABSTRACT

A method of forming a three-dimensional memory device includes forming an alternating stack of insulating layers and sacrificial material layers, forming memory openings through the alternating stack, forming memory opening fill structures in the memory openings, forming a first support opening and a second support opening through the alternating stack, laterally expanding the first support opening without expanding the second support opening, forming a first dielectric support pillar structure and a second dielectric support pillar structure in the laterally-expanded first support opening and in the second support opening, respectively, and replacing the sacrificial material layers with electrically conductive layers. Each of the memory opening fill structures includes vertical semiconductor channel and a respective vertical stack of memory elements.

20 Claims, 62 Drawing Sheets

(56) References Cited

U.S. PATENT DOCUMENTS 10,256,245 B2 4/2019 Ariyoshi
10,269,820 B1 4/2019 Kaminaga
10,381,434 B1 8/2019 Pachamuthu et al.
10,475,879 B1 11/2019 Pachamuthu et al.
10,672,780 B1 6/2020 Kawamura et al.
10,700,089 B1 6/2020 Hojo et al.
10,854,629 B2 12/2020 Ge et al.
10,957,706 B2 3/2021 Otsu et al.
10,971,514 B2 4/2021 Otsu et al.
11,282,783 B2 3/2022 Otsu et al.
11,322,440 B2 5/2022 Kubo
11,342,347 B2 5/2022 Hinoue
11,355,515 B2 6/2022 Hojo et al.
11,398,497 B2 7/2022 Kajiwara et al.
11,404,427 B2 8/2022 Otsu et al.
11,444,101 B2 9/2022 Sato et al.
11,450,685 B2 9/2022 Yoshida
11,532,570 B2 12/2022 Mizuno et al.
11,637,118 B2 4/2023 Takuma et al.
11,637,119 B2 4/2023 Yamaguchi et al.
2014/0134842 A1 5/2014 Zhang et al.
2019/0198515 A1* 6/2019 Hosoda .................. H10B 43/35
2020/0312865 A1 10/2020 Ge et al.
2021/0210424 A1 7/2021 Otsu et al.
2021/0210503 A1 7/2021 Matsuno et al.
2021/0210504 A1 7/2021 Otsu et al.
2021/0358936 A1 11/2021 Takuma et al.
2021/0358937 A1 11/2021 Yamaguchi et al.
2021/0358941 A1 11/2021 Kajiwara et al.
2021/0391345 A1 12/2021 Otsu et al.
2021/0408035 A1 12/2021 Sato et al.
2022/0051979 A1 2/2022 Kuroko et al.
2022/0102273 A1 3/2022 Kubo
2022/0165747 A1 5/2022 Yang et al.
2022/0223614 A1* 7/2022 Takuma ................. H10B 41/10
2022/0254728 A1 8/2022 Matsuno et al.
2022/0254733 A1 8/2022 Mizuno et al.
2022/0254804 A1 8/2022 Yoshida
2022/0352091 A1 11/2022 Yu et al.
2022/0352093 A1 11/2022 Yamada et al.
2022/0352196 A1 11/2022 Shimomura et al.
2022/0352197 A1* 11/2022 Matsuno ................ H10B 41/10
2022/0375958 A1* 11/2022 Shimabukuro ........ H10B 43/10

OTHER PUBLICATIONS

U.S. Appl. No. 17/715,549, filed Apr. 7, 2022, SanDisk Technologies LLC.
U.S. Appl. No. 17/936,012, filed Sep. 28, 2022, SanDisk Technologies LLC.
U.S. Appl. No. 17/936,479, filed Sep. 29, 2022, SanDisk Technologies LLC.
U.S. Appl. No. 18/355,860, filed Jul. 20, 2023, SanDisk Technologies LLC.
U.S. Appl. No. 18/356,825, filed Jul. 21, 2023, SanDisk Technologies LLC.
U.S. Appl. No. 18/363,518, filed Aug. 1, 2023, Western Digital Technologies, Inc..
ISR-WO—Notification of Transmittal of The International Search Report and Written Opinion of the International Searching Authority for International Patent Application No. PCT/US2024/034642, mailed Oct. 11, 2024, 12 pages.
IPRP-WO—Notification Concerning Transmittal of Copy of International Preliminary Report on Patentability and Written Opinion of the International Searching Authority for International Patent Application No. PCT/US2024/034642, mailed May 7, 2026, 8 pages.

* cited by examiner

A'
hd2
S
hd1
65

49
32T
A

A'
hd2
S
65
hd1

58
32T
A 300
100
65
20B
(20)
122
9
20A
(20)
76
74
129
110
32T(32)
46
32
46
32
46
32
46
32
116
114
112
106
70
58

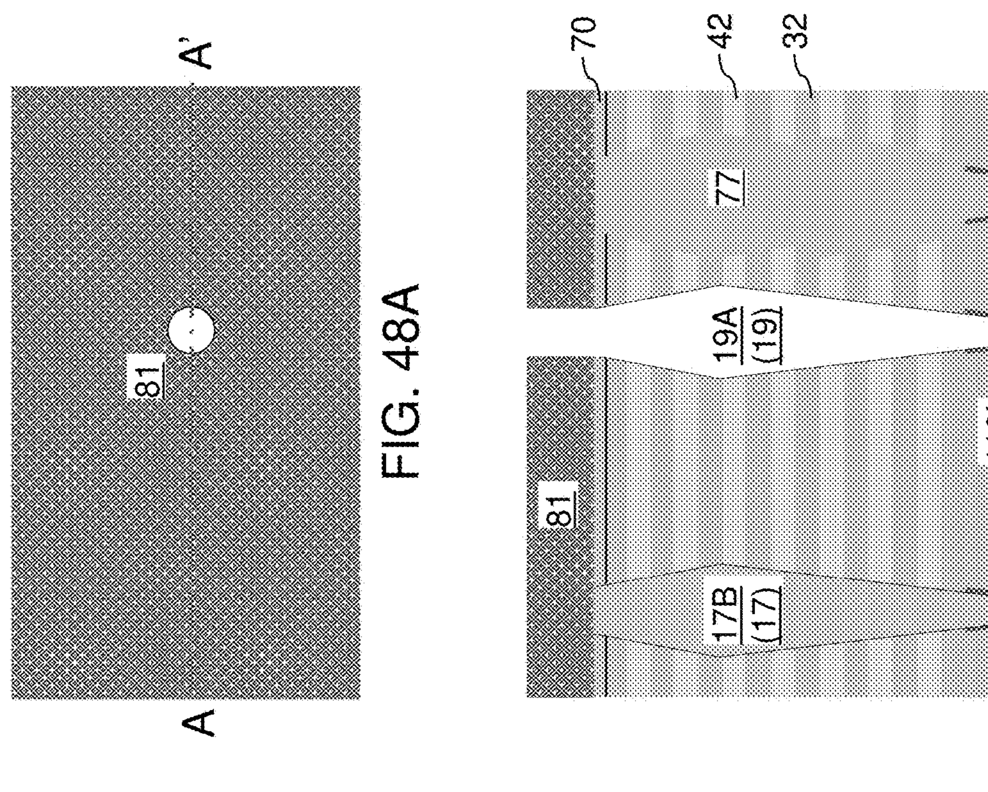
FIG. 48A
FIG. 48B
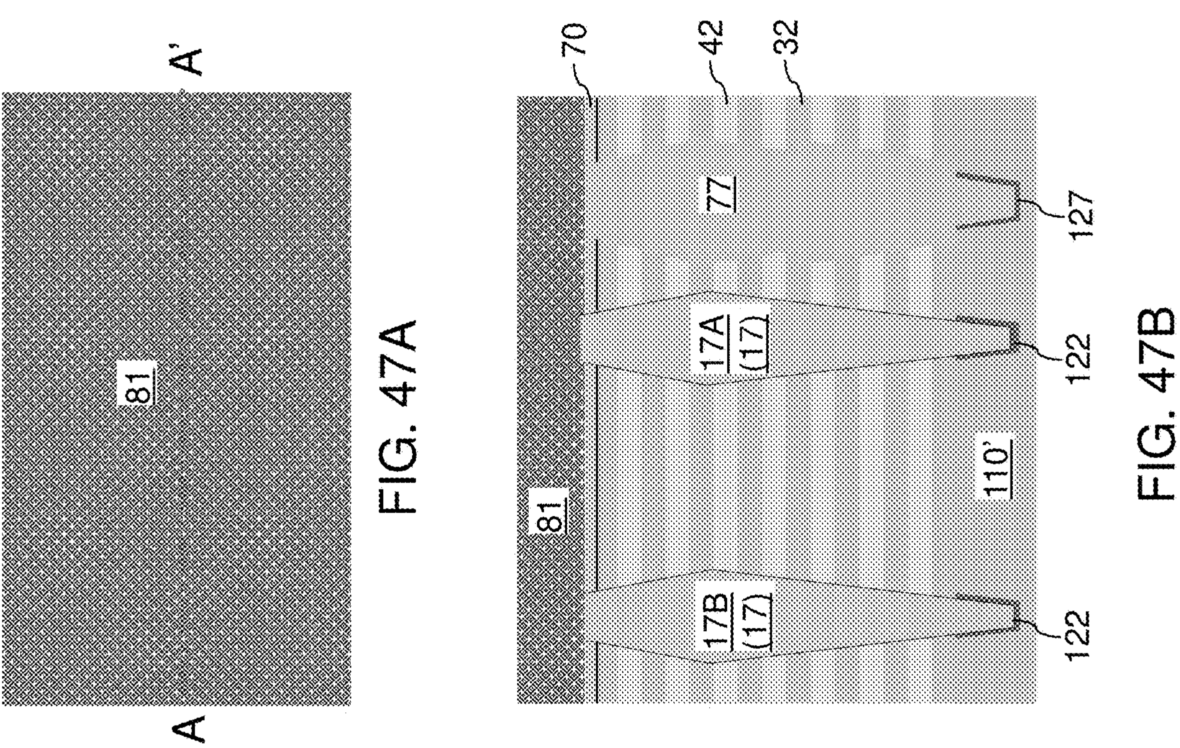
FIG. 47A
FIG. 47B

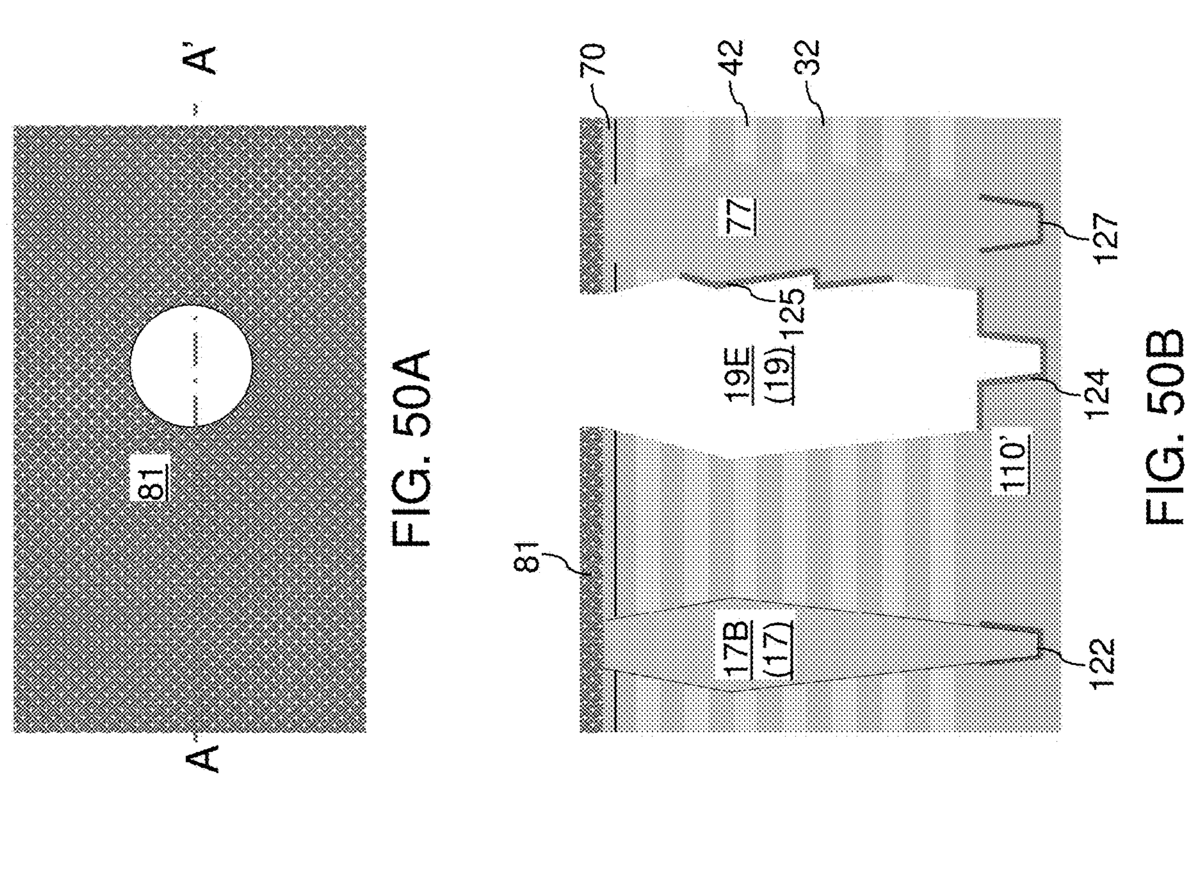
FIG. 50A
FIG. 50B
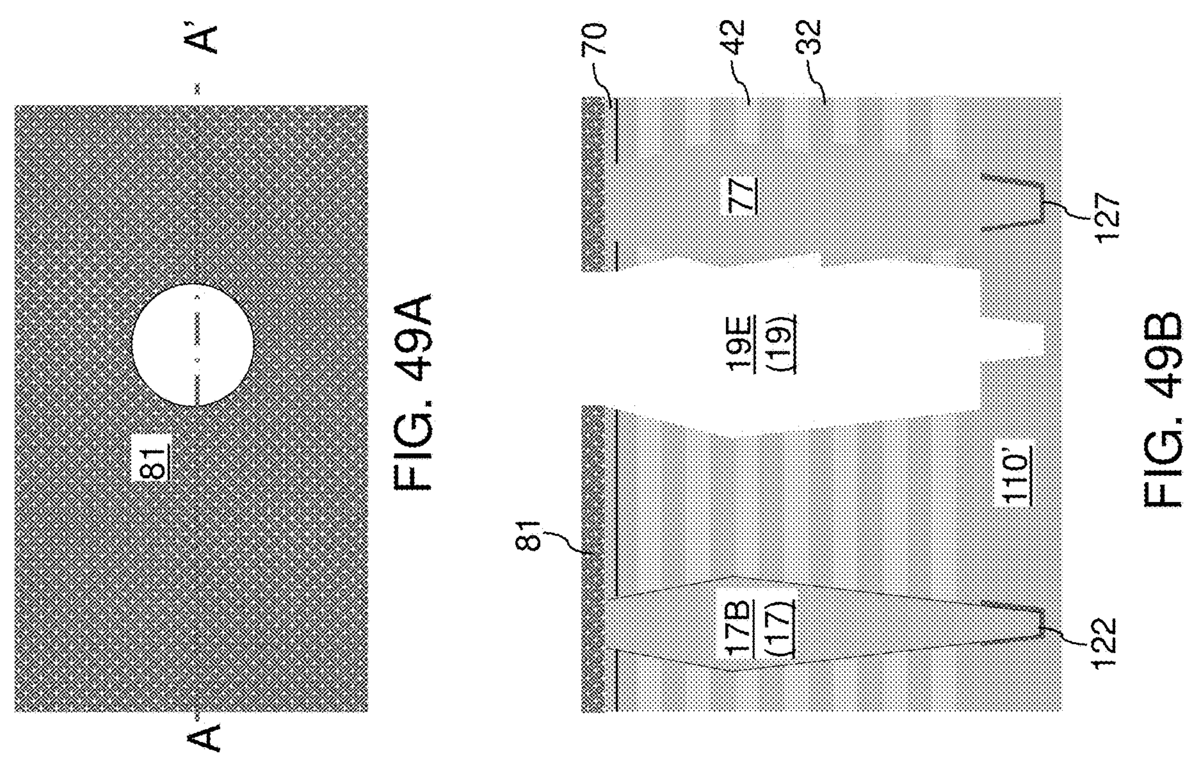
FIG. 49A
FIG. 49B

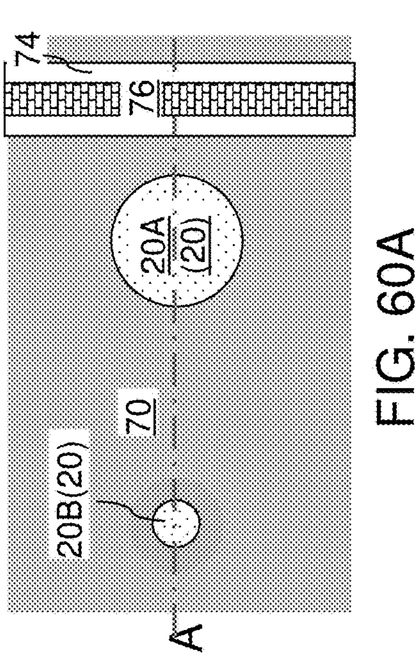
FIG. 60A
FIG. 60B
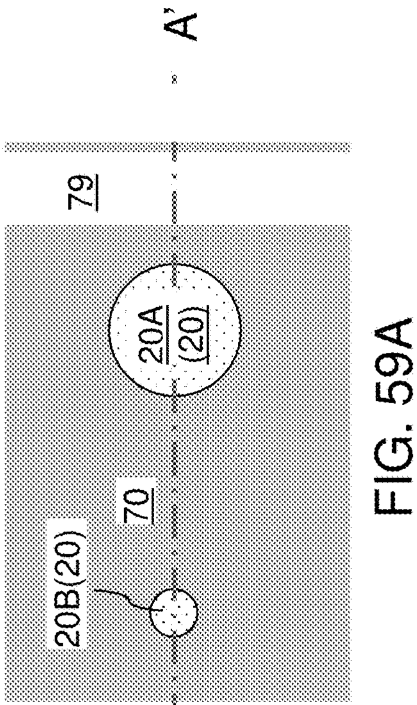
FIG. 59A
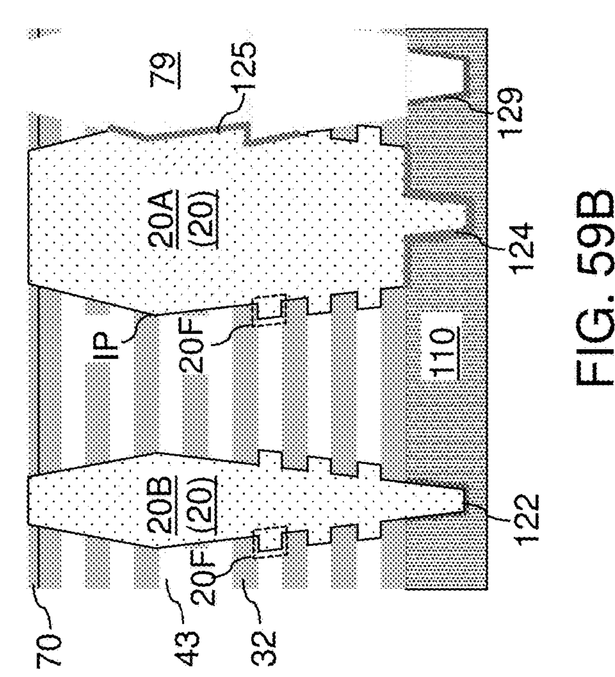
FIG. 59B

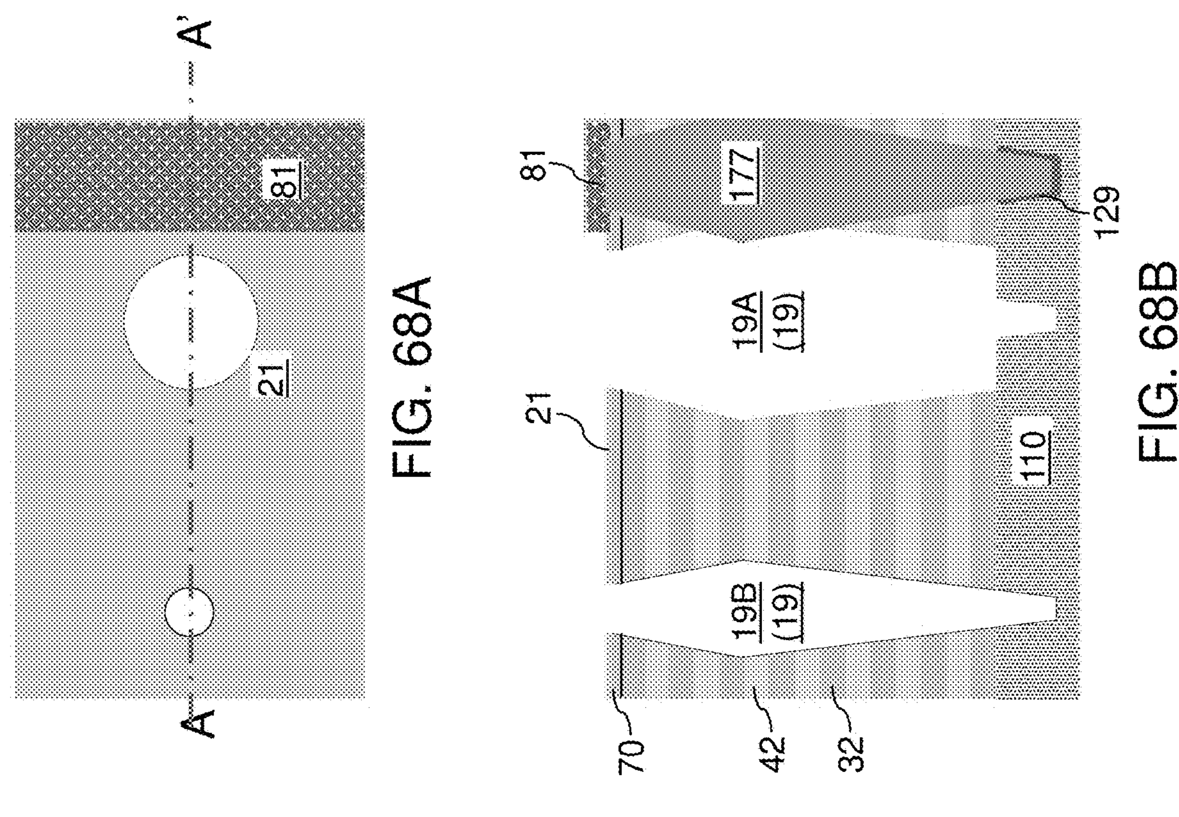
FIG. 68A
FIG. 68B
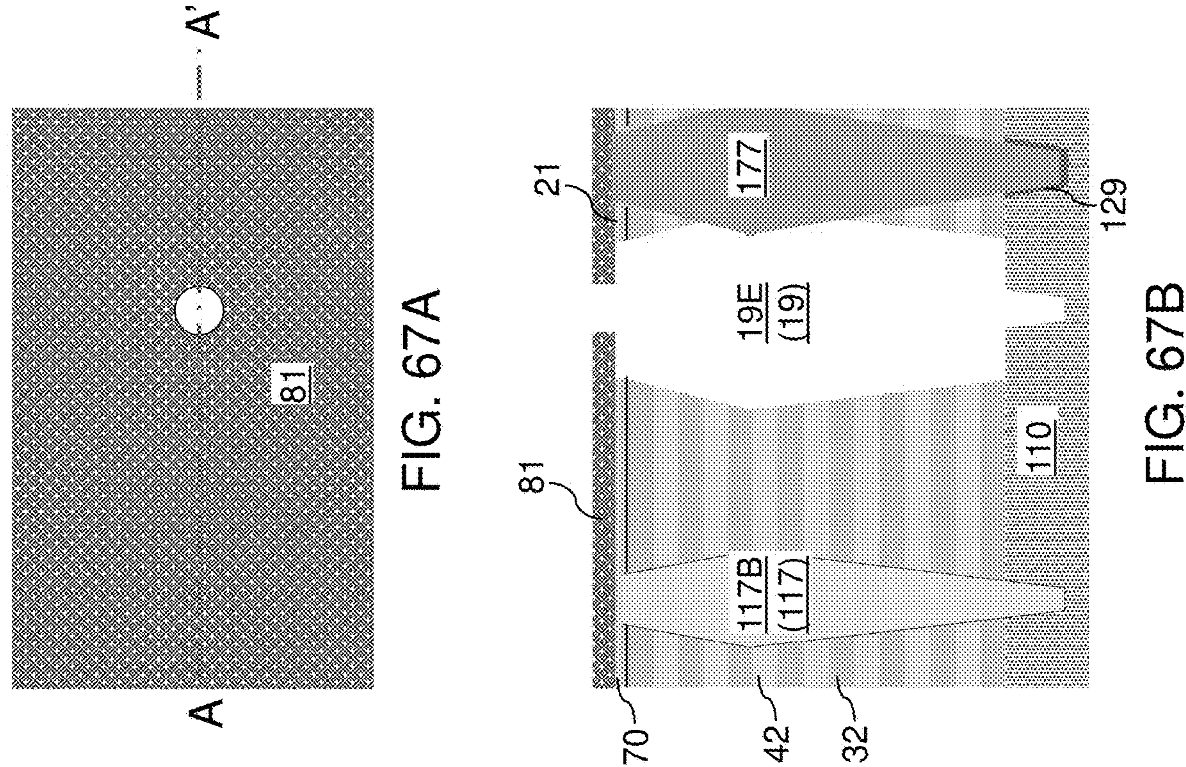
FIG. 67A
FIG. 67B

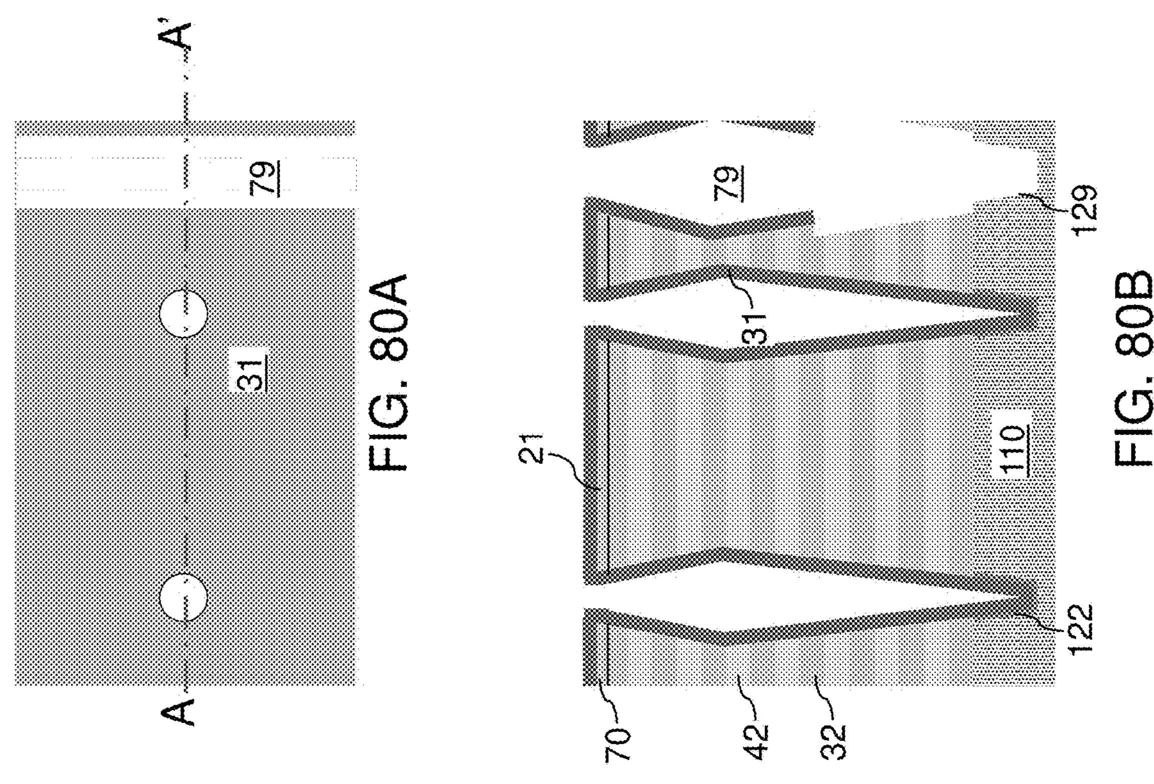
FIG. 80A
FIG. 80B
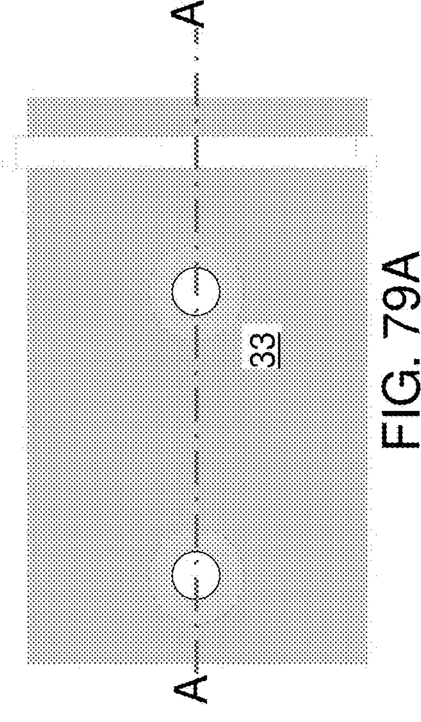
FIG. 79A
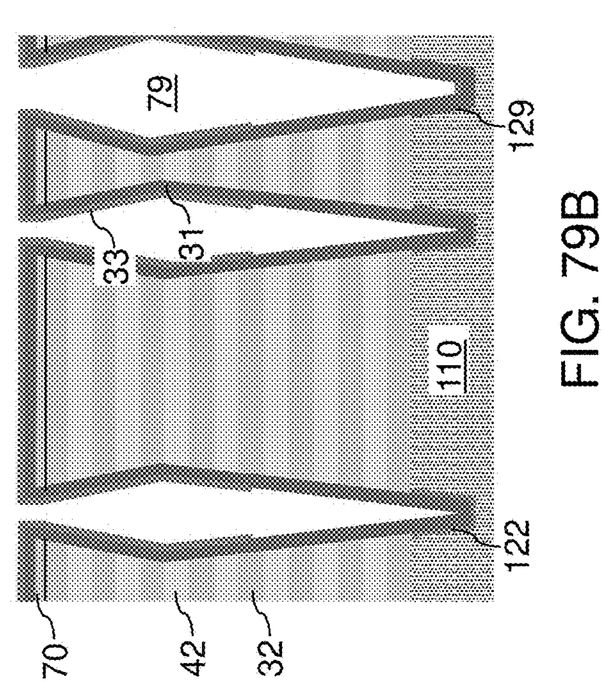
FIG. 79B

THREE-DIMENSIONAL MEMORY DEVICE WITH DIFFERENT WIDTH SUPPORT PILLAR STRUCTURES AND METHODS OF MAKING THE SAME

FIELD

The present disclosure relates generally to the field of semiconductor devices, and particularly to a three-dimensional memory device having different width support pillar structures and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises first and second alternating stacks of insulating layers and electrically conductive layers; a lateral isolation trench separating the first alternating stack from the second alternating stack; memory openings vertically extending through the alternating stack; memory opening fill structures located in the memory openings and comprising a vertical semiconductor channel and a respective vertical stack of memory elements located at levels of the electrically conductive layers; a first dielectric support pillar structure extending through the first alternating stack and having a first width; and a second dielectric support pillar structure extending through the first alternating stack and having a second width narrower than the first width, wherein the second dielectric pillar structure is located further from the lateral isolation trench than the first dielectric support pillar structure.

According to another aspect of the present disclosure, a method of forming a three-dimensional memory device includes forming an alternating stack of insulating layers and sacrificial material layers, forming memory openings through the alternating stack, forming memory opening fill structures in the memory openings, forming a first support opening and a second support opening through the alternating stack, laterally expanding the first support opening without expanding the second support opening, forming a first dielectric support pillar structure and a second dielectric support pillar structure in the laterally-expanded first support opening and in the second support opening, respectively, and replacing the sacrificial material layers with electrically conductive layers. Each of the memory opening fill structures includes vertical semiconductor channel and a respective vertical stack of memory elements.

BRIEF DESCRIPTION OF THE DRAWINGS

FIG. 6A is a vertical cross-sectional view. FIG. 6B is a top-down view of the first exemplary structure of FIG. 6A. The vertical plane A-A' is the cut plane of the vertical cross-sectional view of FIG. 6A. FIG. 6C is a top-down view of region C of the first exemplary structure of FIG. 6B. FIG. 6D is a vertical cross-sectional view along the vertical plane D-D' of FIGS. 6B and 6C.

FIG. 16A is a vertical cross-sectional view. FIG. 16B is a top-down view of the first exemplary structure of FIG. 16A. The vertical plane A-A' is the cut plane of the vertical cross-sectional view of FIG. 16A. FIG. 16C is a top-down view of region C of the first exemplary structure of FIG. 16B. FIG. 16D is a vertical cross-sectional view along the vertical plane D-D' of FIGS. 16B and 16C.

FIG. 17A is a vertical cross-sectional view. FIG. 17B is a top-down view of the first exemplary structure of FIG. 17A. The vertical plane A-A' is the cut plane of the vertical cross-sectional view of FIG. 17A. FIG. 17C is a top-down view of region C of the first exemplary structure of FIG. 17B. FIG. 17D is a vertical cross-sectional view along the vertical plane D-D' of FIGS. 17B and 17C.

FIG. 47A is a top-down view of a region of the third exemplary structure after formation of a hard mask layer according to the third embodiment of the present disclosure. FIG. 47B is a vertical cross-sectional view along the vertical plane A-A' of FIG. 47A.

FIG. 48A is a top-down view of a region of the third exemplary structure after formation of openings through the hard mask layer and removal of first sacrificial support opening fill structures according to the third embodiment of the present disclosure. FIG. 48B is a vertical cross-sectional view along the vertical plane A-A' of FIG. 48A.

FIG. 49A is a top-down view of a region of the third exemplary structure after lateral expansion of the first support openings according to the third embodiment of the present disclosure. FIG. 49B is a vertical cross-sectional view along the vertical plane A-A' of FIG. 49A.

FIG. 50A is a top-down view of a region of the third exemplary structure after formation of first dielectric liners and vertically-extending dielectric liners according to the third embodiment of the present disclosure. FIG. 50B is a vertical cross-sectional view along the vertical plane A-A' of FIG. 50A.

FIG. 59A is a top-down view of a region of the third exemplary structure after replacement of the in-process source-level material layers with source-level material layers and formation of lateral recesses according to the third embodiment of the present disclosure. FIG. 59B is a vertical cross-sectional view along the vertical plane A-A' of FIG. 59A.

FIG. 60A is a top-down view of a region of the third exemplary structure after formation of electrically conductive layers and isolation trench fill structures according to the third embodiment of the present disclosure. FIG. 60B is a vertical cross-sectional view along the vertical plane A-A' of FIG. 60A.

FIG. 61A is a top-down view of a region of a fourth exemplary structure after formation of support openings according to a fourth embodiment of the present disclosure. FIG. 61B is a vertical cross-sectional view along the vertical plane A-A' of FIG. 61A.

FIG. 62A is a top-down view of a region of the fourth exemplary structure after formation of sacrificial support opening fill structures according to the fourth embodiment of the present disclosure. FIG. 62B is a vertical cross-sectional view along the vertical plane A-A' of FIG. 62A.

FIG. 63A is a top-down view of a region of the fourth exemplary structure after formation of lateral isolation trenches and replacement of the in-process source-level material layers with source-level material layers according to the fourth embodiment of the present disclosure. FIG. 63B is a vertical cross-sectional view along the vertical plane A-A' of FIG. 63A.

FIG. 64A is a top-down view of a region of the fourth exemplary structure after formation of sacrificial isolation trench fill structures according to the fourth embodiment of the present disclosure. FIG. 64B is a vertical cross-sectional view along the vertical plane A-A' of FIG. 64A.

FIG. 67A is a top-down view of a region of the fourth exemplary structure after lateral expansion of the first support openings according to the fourth embodiment of the present disclosure. FIG. 67B is a vertical cross-sectional view along the vertical plane A-A' of FIG. 67A.

FIG. 68A is a top-down view of a region of the fourth exemplary structure after additional patterning of the hard mask layer according to the fourth embodiment of the present disclosure. FIG. 68B is a vertical cross-sectional view along the vertical plane A-A' of FIG. 68A.

FIG. 79A is a top-down view of a region of the sixth exemplary structure after deposition of a conformal cover material layer and a non-conformal etch mask layer according to the sixth embodiment of the present disclosure. FIG. 79B is a vertical cross-sectional view along the vertical plane A-A' of FIG. 79A.

FIG. 80A is a top-down view of a region of the sixth exemplary structure after removal of unmasked portions of the conformal cover material layer and lateral expansion of a lower portion of each lateral isolation trench according to the sixth embodiment of the present disclosure. FIG. 80B is a vertical cross-sectional view along the vertical plane A-A' of FIG. 80A.

DETAILED DESCRIPTION

Figure 1:
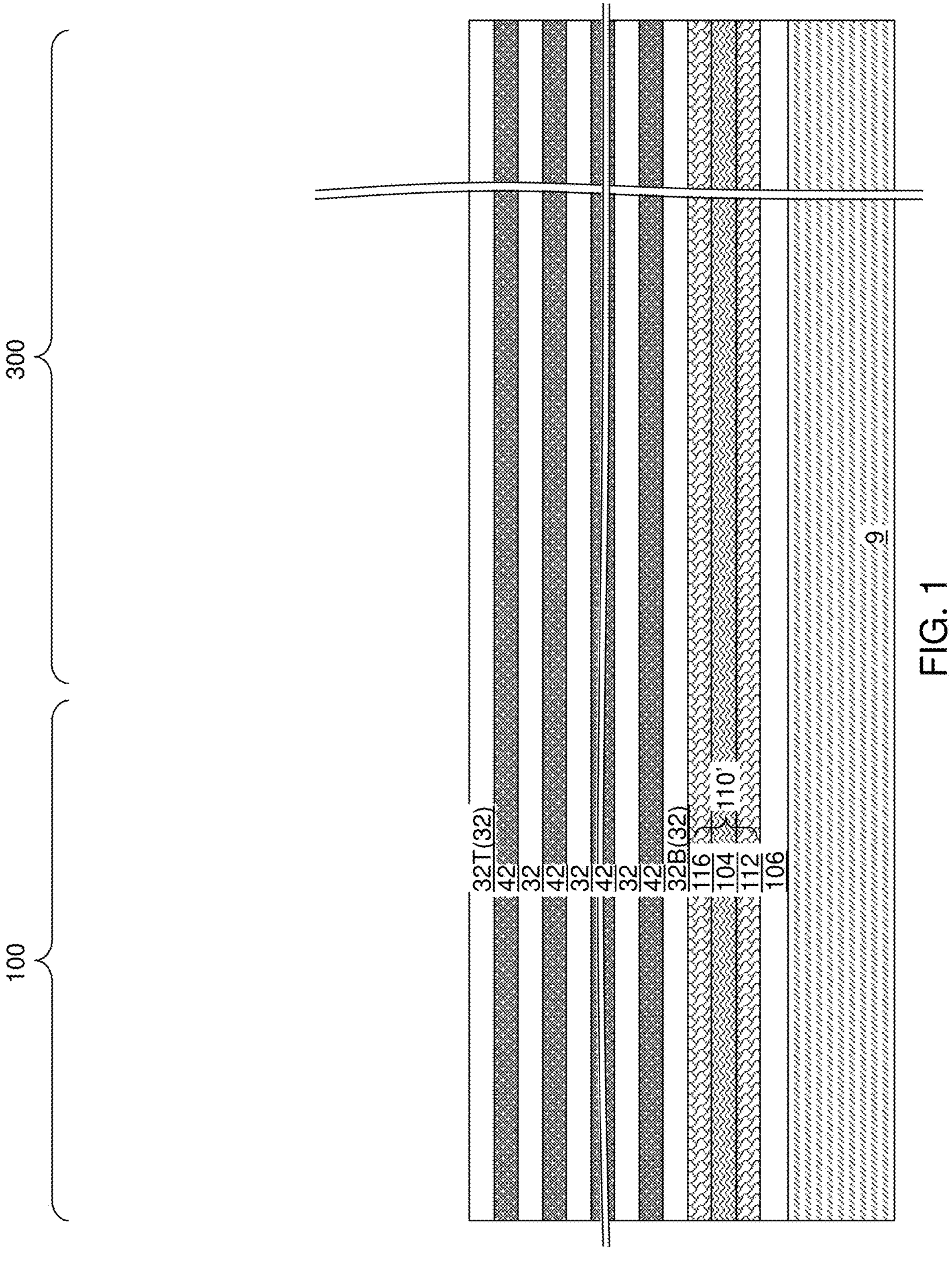
FIG. 1 is a schematic vertical cross-sectional view of a first exemplary structure for forming a memory die after formation of a stopper insulating layer, source-level material layers, and an alternating stack of insulating layers and sacrificial material layers over a carrier substrate according to a first embodiment of the present disclosure.

As discussed above, the present disclosure is directed to a three-dimensional memory device including different width (i.e., thickness) dielectric support pillar structures and methods for manufacturing the same by selectively enlarging a subset of the dielectric support pillar structures, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to the first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An insulating material layer can be formed on a top surface of the carrier substrate 9. The insulating material layer can be subsequently employed as a stopping material layer for a process that removes the carrier substrate 9, and is herein referred to as a stopper insulating layer 106, or as a backside pad dielectric layer. If a polishing process such as a chemical mechanical polishing process is employed to subsequently remove the carrier substrate 9, the stopper material layer 106 may be subsequently employed as a polishing stopper material layer. If an etch process such as a wet etch process is employed to subsequently remove the carrier substrate 9, the stopper material layer 106 may be subsequently employed as an etch stop material layer. In one embodiment, the stopper insulating layer 106 comprises a dielectric material such as undoped silicate glass, a doped silicate glass, or silicon nitride. The thickness of the stopper insulating layer 106 may be in a range from 50 nm to 600 nm, such as from 100 nm to 300 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner (not shown), a source-level sacrificial layer 104, an optional upper sacrificial liner (not shown), and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner (or selective to the lower source-level semiconductor layer 112) and the upper sacrificial liner (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner (if present) and the upper sacrificial liner (if present) include materials that may function as an etch stop material during removal of the source-level sacrificial layer 104. For example, the lower sacrificial liner and the upper sacrificial liner may include silicon oxide, silicon nitride, and/or a dielectric metal oxide. In one embodiment, each of the lower sacrificial liner and the upper sacrificial liner may include a silicon oxide layer having a thickness in a range from 2 nm to 30 nm, although lesser and greater thicknesses may also be used.

An alternating stack of first material layers and second material layers can be formed over the in-process source-level material layers 110'. In an alternative embodiment, the in-process source-level material layers 110' and the stopper material layer 106 may be omitted, and the alternating stack is formed directly on a surface of the semiconductor substrate 9. In another alternative embodiment described below with respect to FIGS. 26-28, a peripheral circuit is formed on the same substrate as the alternating stack. For example, the peripheral circuit may comprise word line driver regions, bit line driver regions, sense amplifier regions, input/output buffer regions, etc. In this alternative embodiment, a separate logic die containing the peripheral circuit described below with respect to FIG. 23 may be omitted. In this alternative embodiment, the alternating stack may be deposited on the in-process source-level material layers 110' or the in-process source-level material layers 110' may be omitted, and the alternating stack may be deposited on the stopper material layer 106.

In the alternating stack, the first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the substrate 9 (e.g., over the in-process source-level material layers 110', if present). The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed.

Figure 2:
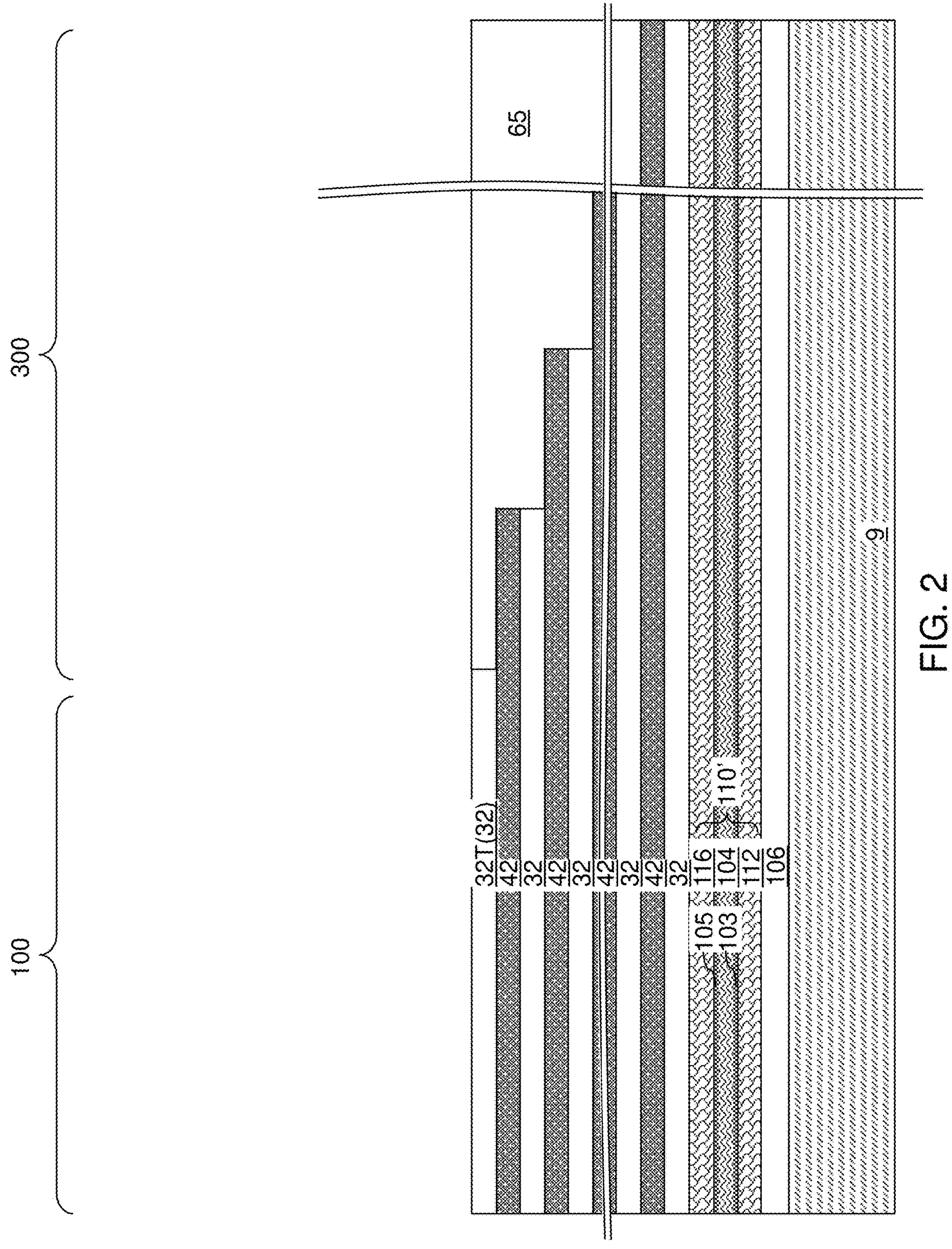
FIG. 2 is a schematic vertical cross-sectional view of the first exemplary structure after formation of stepped surfaces and a stepped dielectric material portion according to the first embodiment of the present disclosure.

Referring to FIG. 2, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65, which can be a retro-stepped dielectric material portion. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the stepped dielectric material portion 65 may, or may not, be doped with dopants such as B, P, and/or F.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 3A:
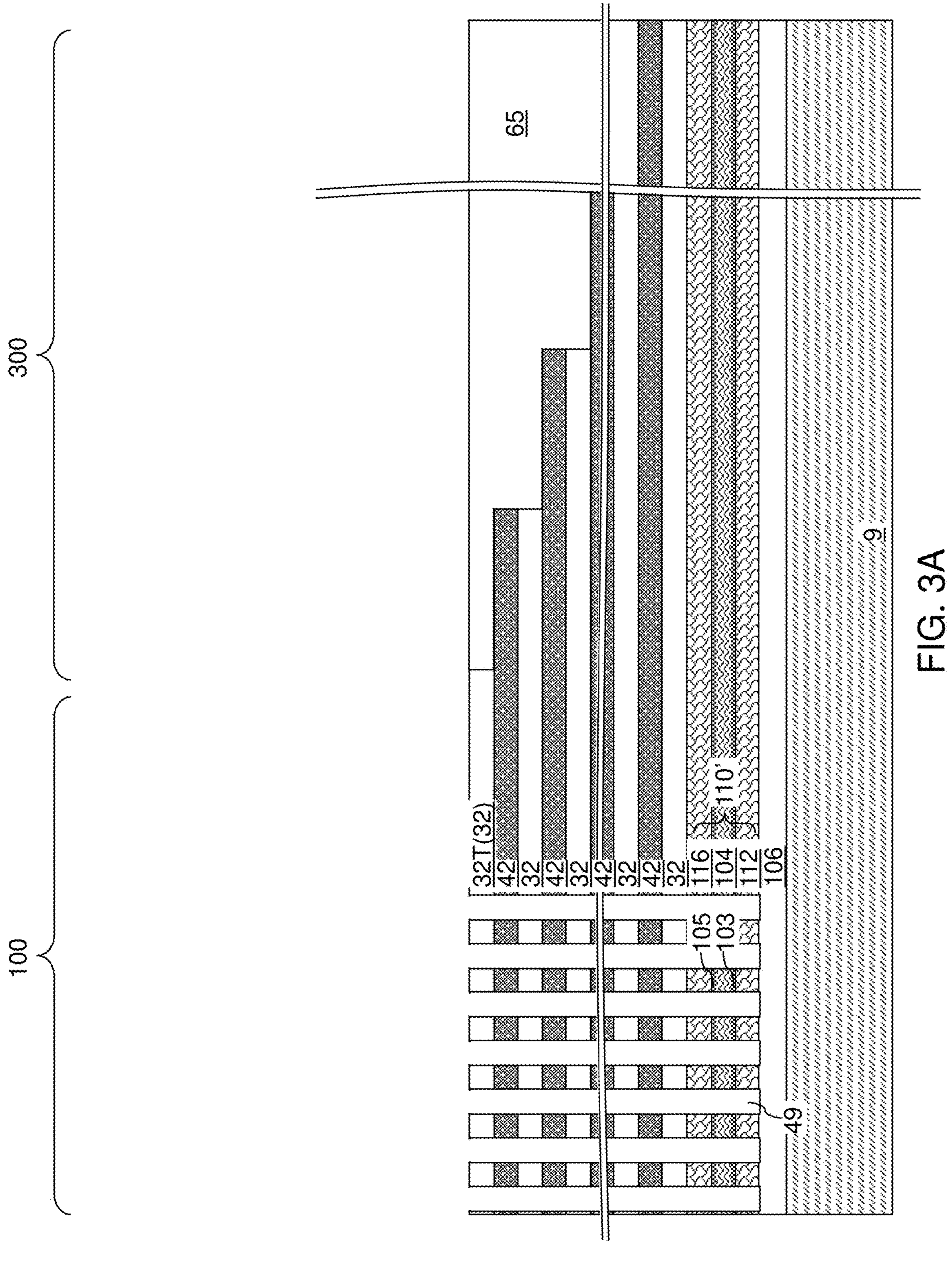
FIG. 3A is a schematic vertical cross-sectional view of the first exemplary structure after forming memory openings according to the first embodiment of the present disclosure.
Figure 3B:
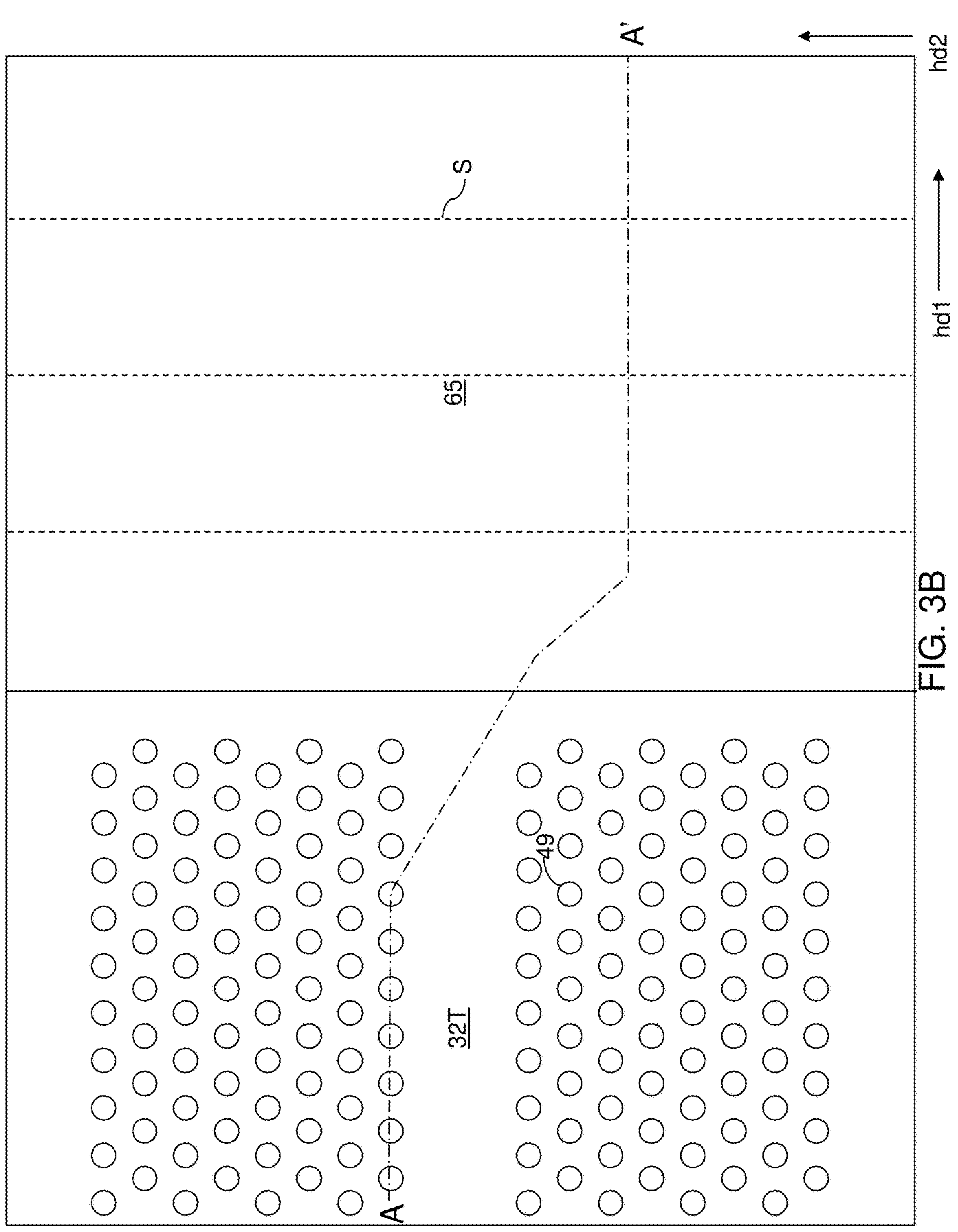
FIG. 3B is a top-down view of the first exemplary structure of FIG. 3A. The vertical plane A-A' is the cut plane of the vertical cross-sectional view of FIG. 3A.

Referring to FIGS. 3A and 3B, an etch mask layer (not shown) can be formed over the alternating stack (32, 42), and can be lithographically patterned to form openings therein. An anisotropic etch process can be performed to transfer the pattern of the openings in the etch mask layer through the alternating stack (32, 42). Memory openings 49 can be formed through the alternating stack (32, 42) in the memory array region 100. Each of the memory openings 49 can vertically extend through the alternating stack (32, 42) and into the in-process source-level material layers 110' In one embodiment, bottom surfaces of the memory openings 49 may be formed within the lower source-level semiconductor layer 112 or at an interface between the lower source-level semiconductor layer and the stopper insulating layer 106.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2.

FIGS. 4A-4D are sequential vertical cross-sectional views of a memory opening 49 during formation of a memory opening fill structure 58 according to the first embodiment of the present disclosure. The memory opening fill structure 58 may comprise a NAND string.

Figures 4A, 4B:
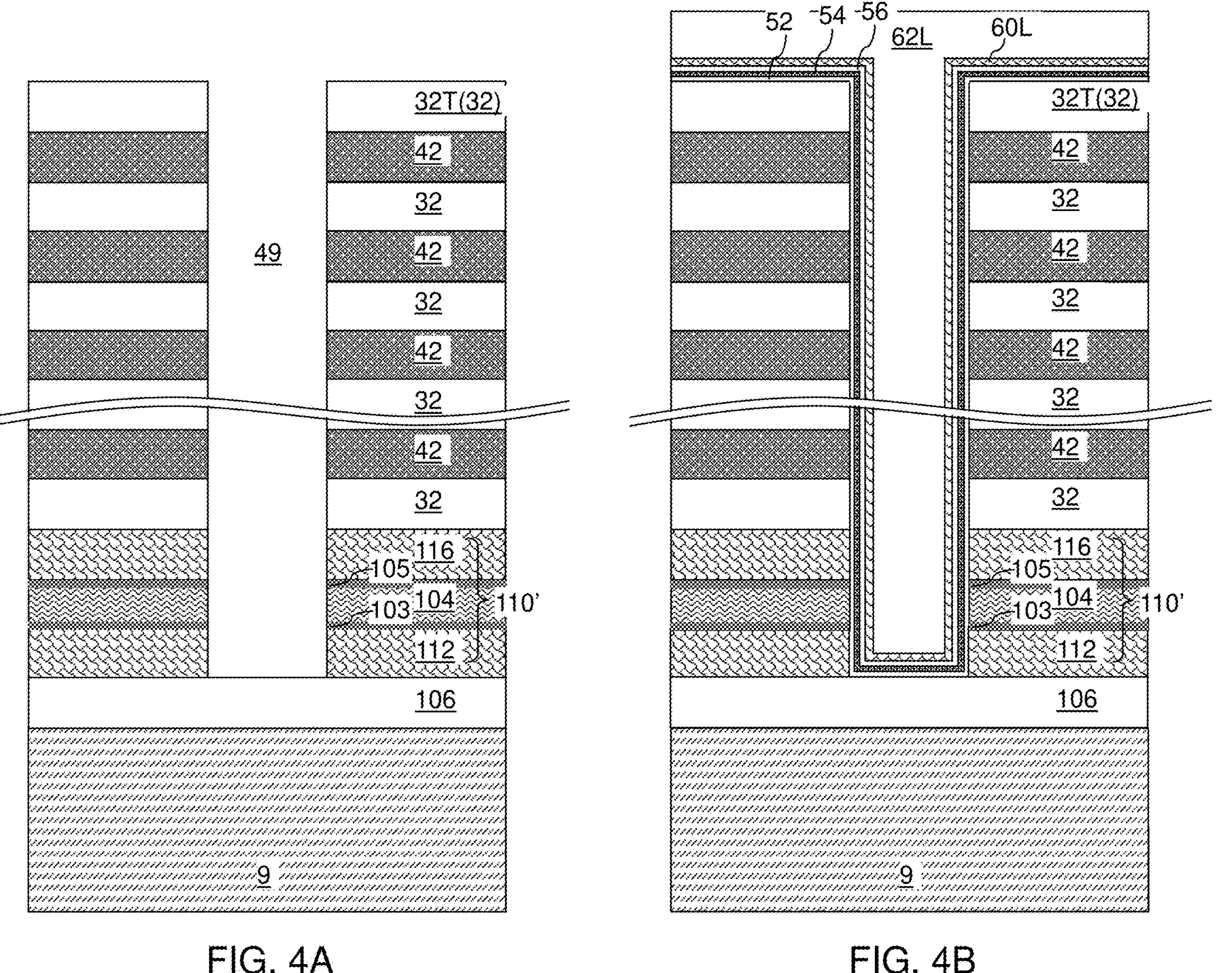
FIGS. 4A-4D are sequential vertical cross-sectional views of a memory opening during formation of a memory opening fill structure according to the first embodiments of the present disclosure.

Referring to FIG. 4A, a memory opening 49 is illustrated after the processing steps of FIGS. 3A and 3B. Referring to FIG. 4B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figures 4C, 4D:
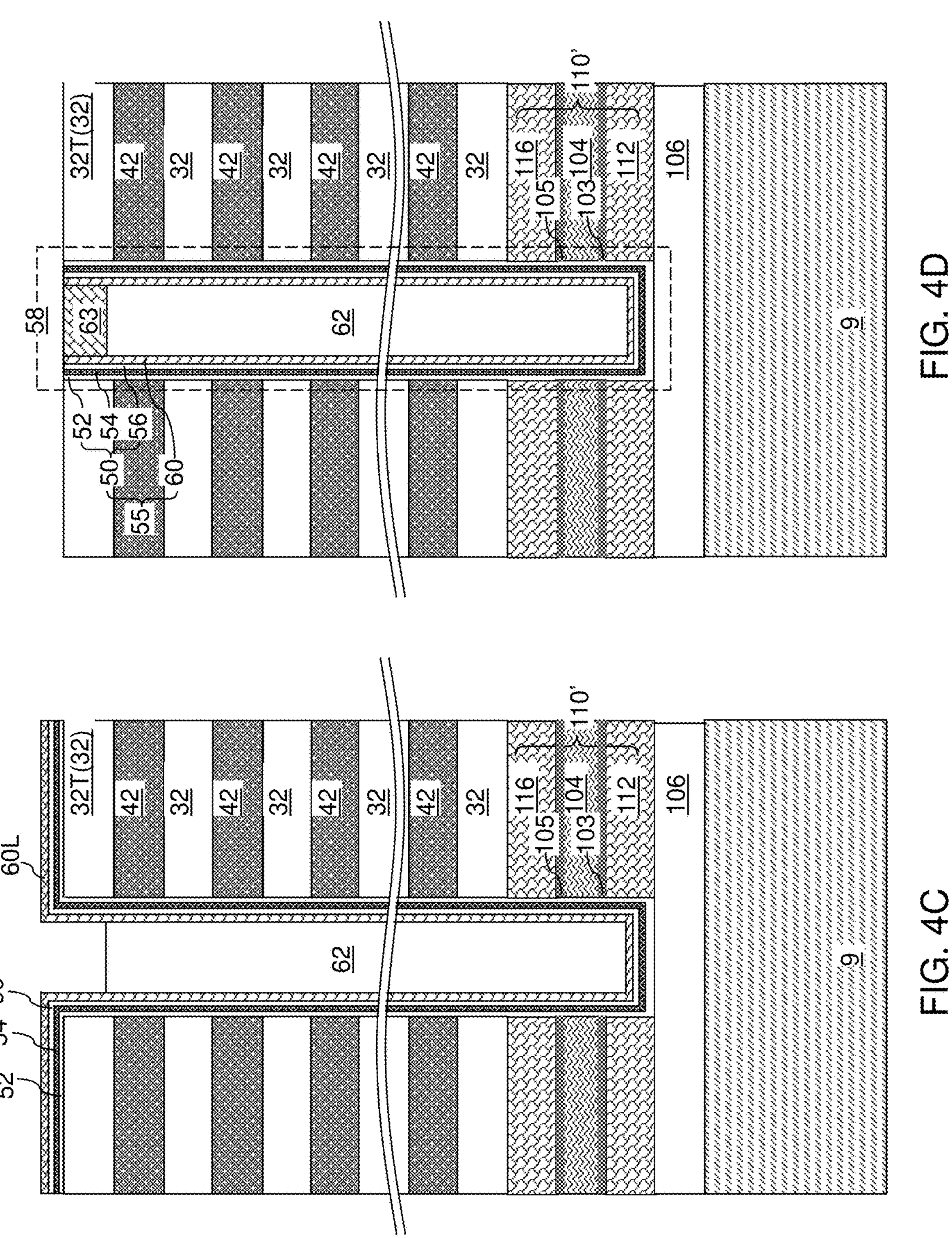

Referring to FIG. 4C, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Referring to FIG. 4D, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be subsequently replaced at least partly with electrically conductive layers.

Figure 5A:
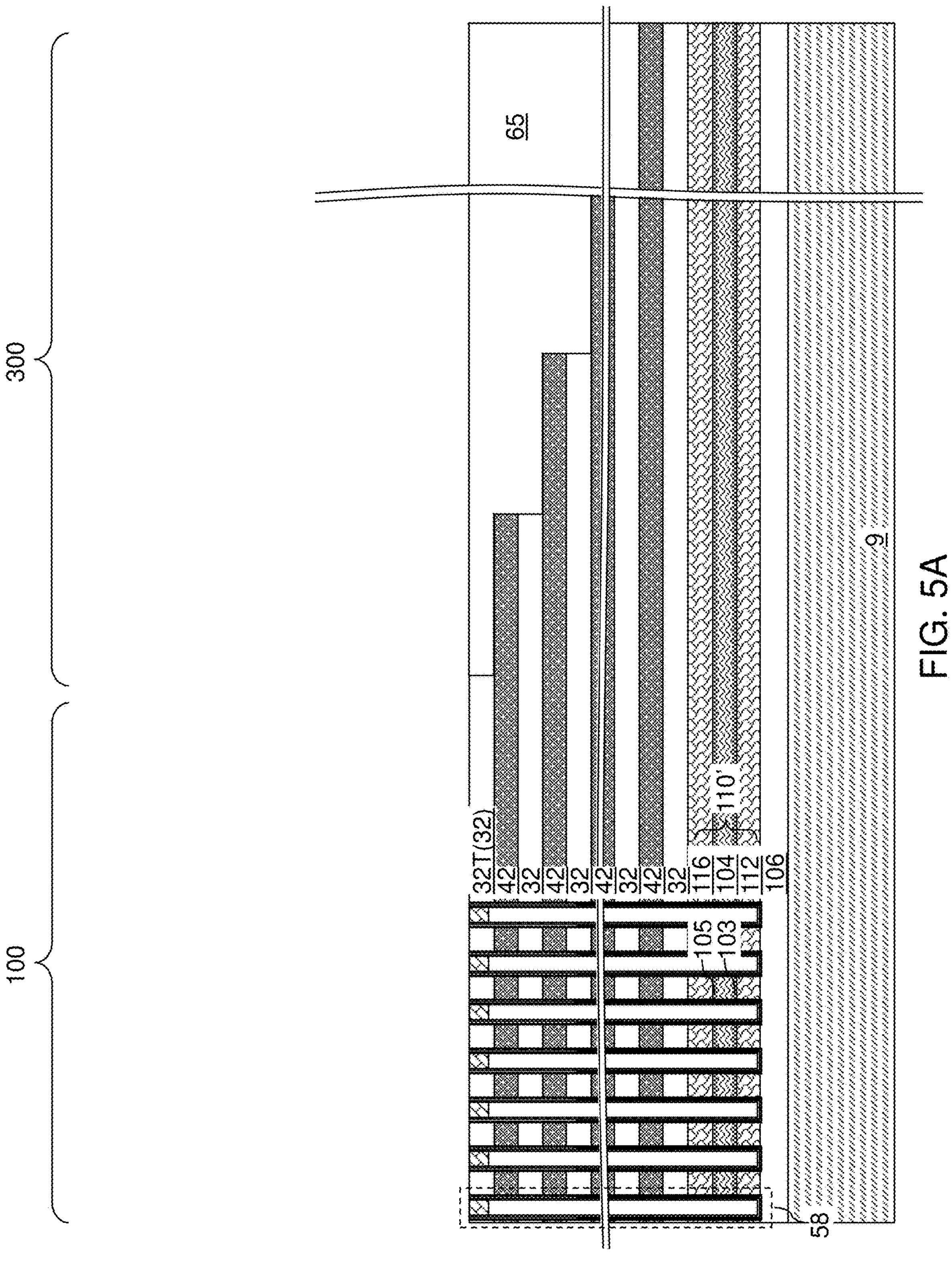
FIG. 5A is a vertical cross-sectional view of the first exemplary structure after formation of memory opening fill structures according to the first embodiment of the present disclosure.
Figure 5B:
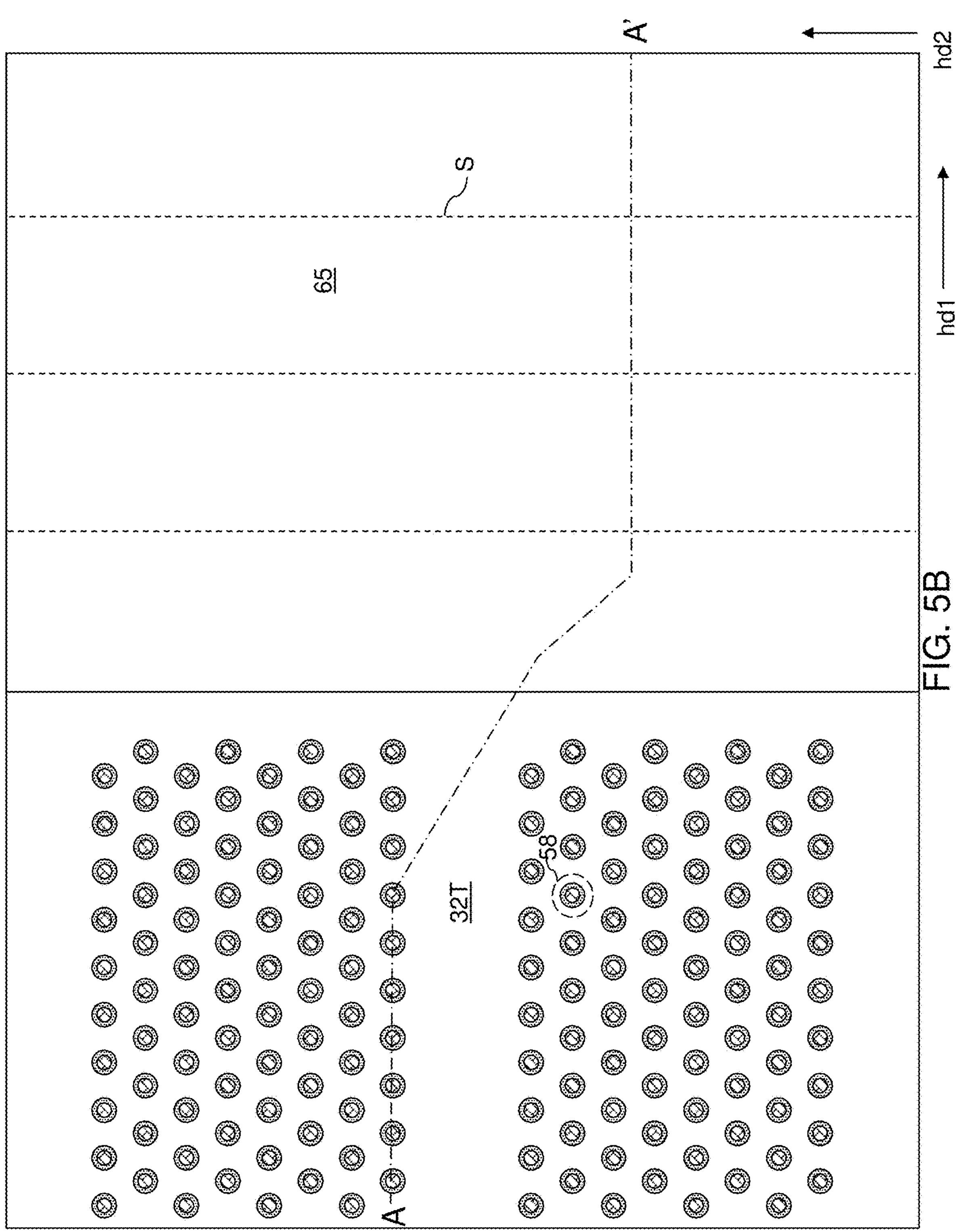
FIG. 5B is a top-down view of the first exemplary structure of FIG. 5A. The vertical plane A-A' is the cut plane of the vertical cross-sectional view of FIG. 5A.
Figure 6A:
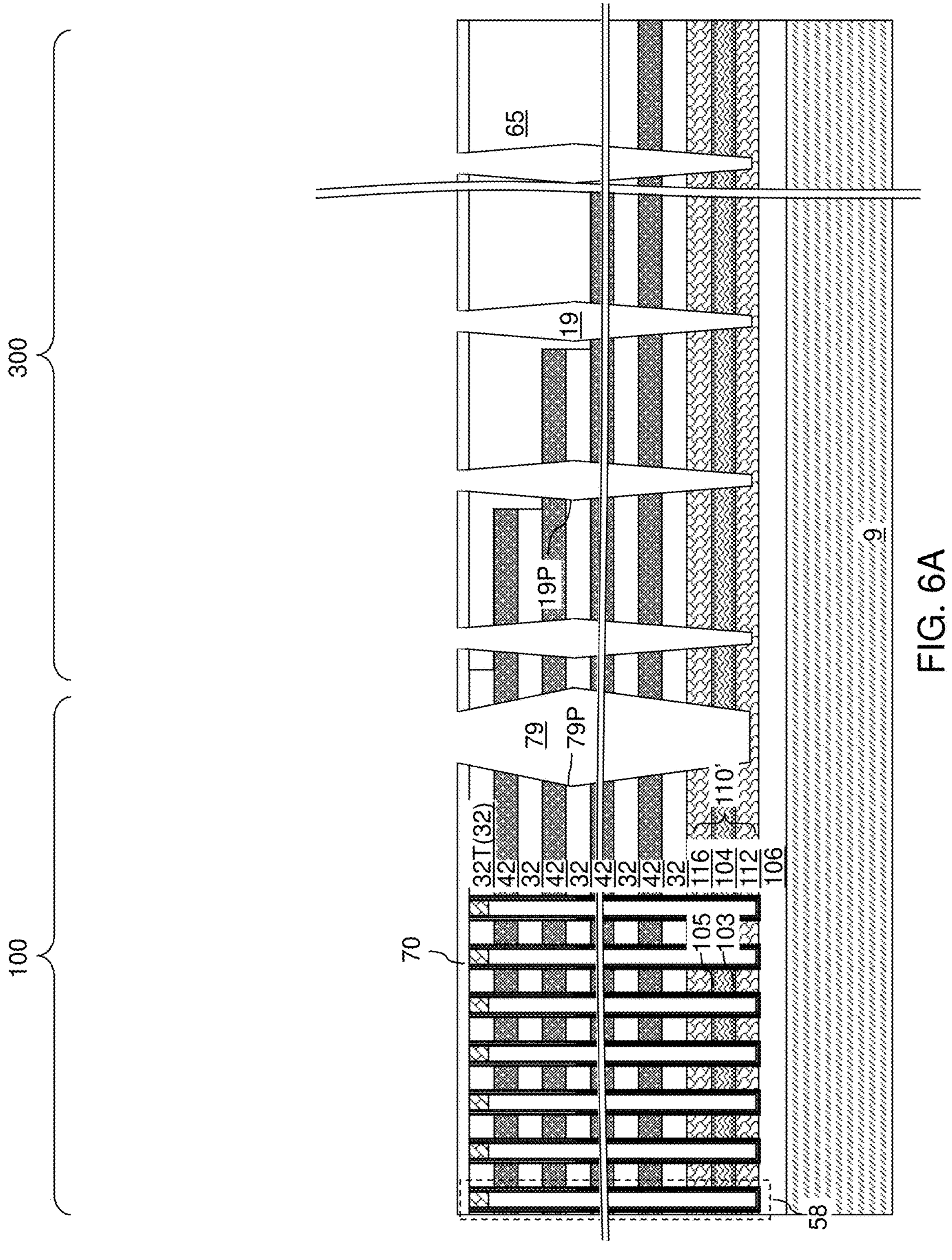
FIGS. 6A-6D are various views of the first exemplary structure after formation of support openings and lateral isolation trenches according to the first embodiment of the present disclosure.
Figure 6B:
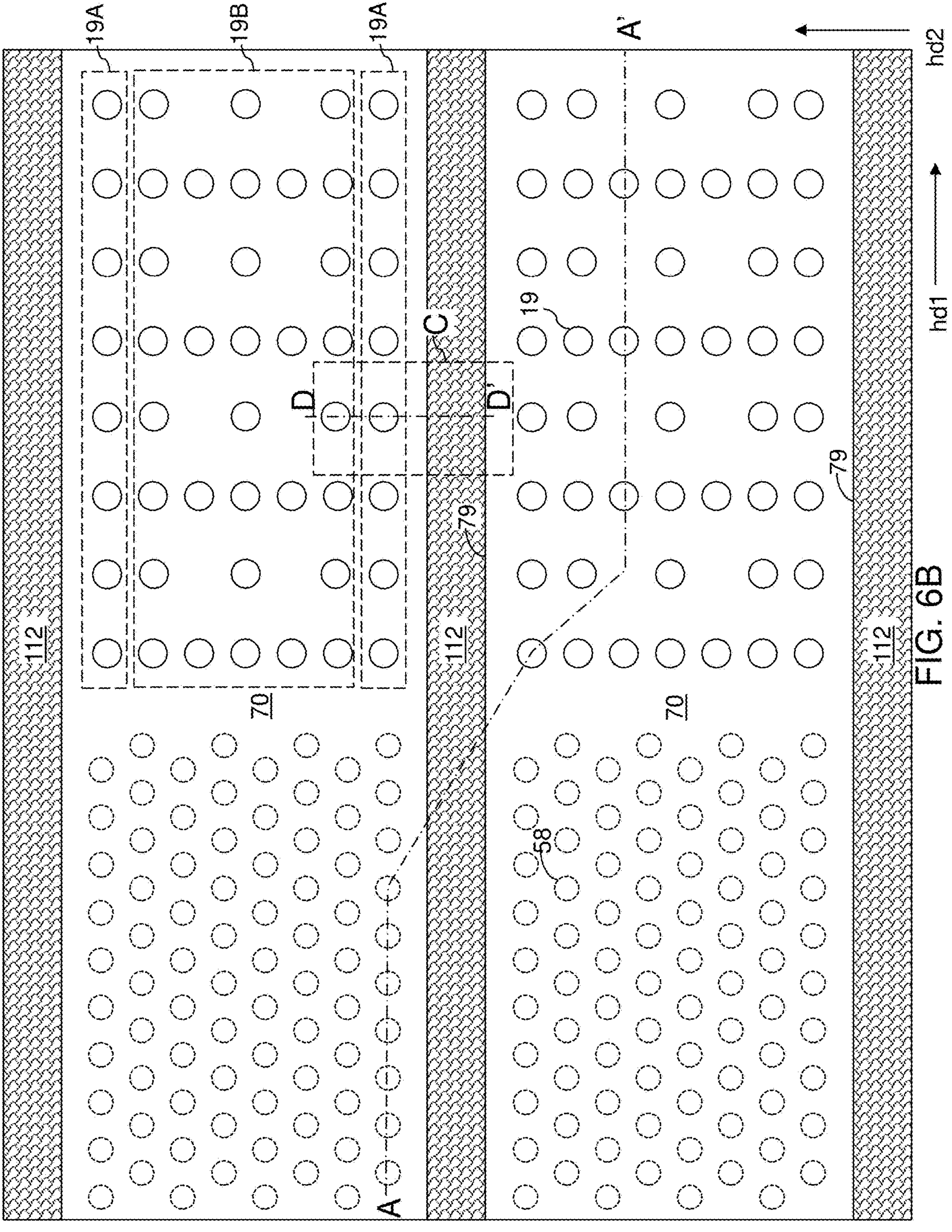
Figures 6C, 6D:
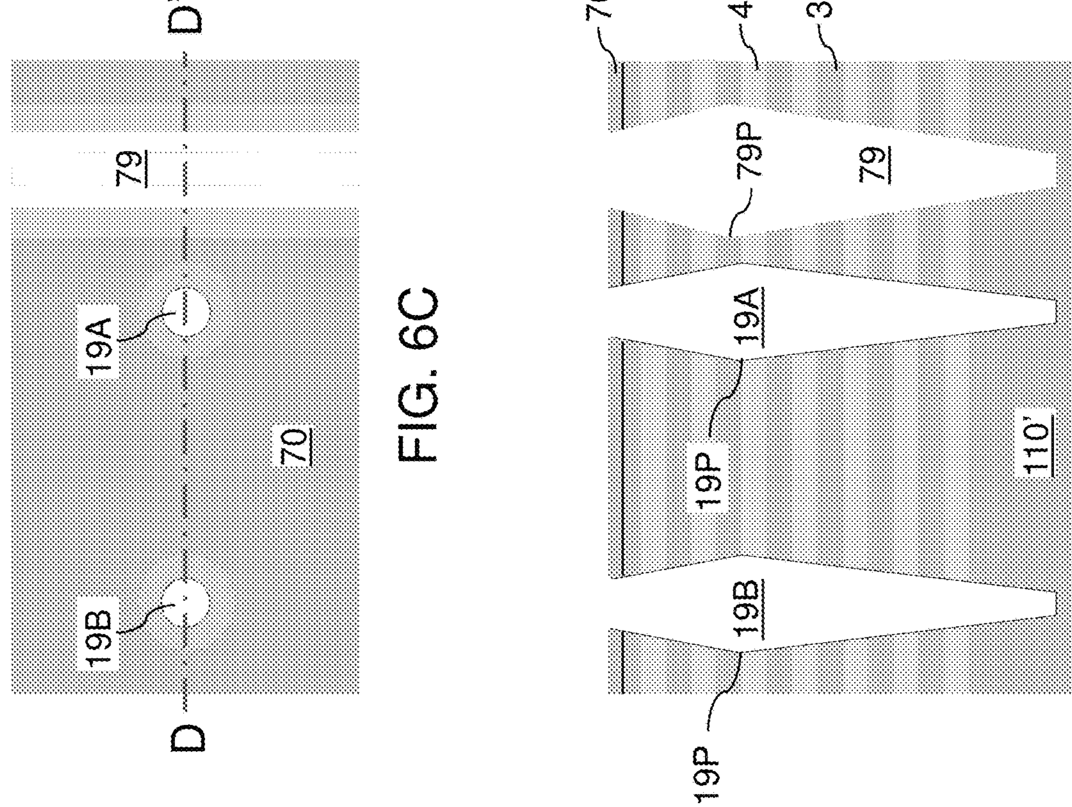

Referring to FIGS. 5A and 5B, the first exemplary structure is illustrated after formation of memory opening fill structures 58 within the memory openings 49. Each of the memory opening fill structures 58 may comprise a memory film 50 and a vertical semiconductor channel 60.

Referring to FIGS. 6A-6D, a dielectric material such as undoped silicate glass or a doped silicate glass can be deposited over the alternating stack (32, 42) to form an insulating cap layer 70. The thickness of the insulating cap layer 70 may be in a range from 100 nm to 600 nm, such as from 200 nm to 400 nm, although lesser and greater thicknesses may also be employed.

A photoresist layer (not shown) can be applied over the insulating cap layer 70, and can be lithographically patterned to form various openings therein. The openings in the photoresist layer comprise elongated openings that laterally extend along the first horizontal direction hd1 between neighboring clusters of memory opening fill structures 58 (e.g., between adjacent memory block areas). The openings in the photoresist layer further comprise arrays of discrete openings that are formed in areas of the stepped dielectric material portions 65 (e.g., in each memory block area).

An anisotropic etch process can be performed to transfer the pattern of the openings in the photoresist layer through the insulating cap layer 70, the alternating stack (32, 42), the stepped dielectric material portion 65, and the in-process source-level material layers 110' (if present). Lateral isolation trenches 79 and support openings 19 can be formed through the alternating stack (32, 42), the stepped dielectric material portion 65, the insulating cap layer 70, and the in-process source-level material layers 110' (if present). The lateral isolation trenches 79 and the support openings 19 vertically extend through each layer within the alternating stack (32, 42) and into an upper portion of a semiconductor material layer (which may be located in the in-process source-level material layers 110' or which may comprise a top portion of the substrate 9 if layers 110' are omitted)). The lateral isolation trenches 79 laterally extend along the first horizontal direction hd1 (e.g., word line direction). Each of the lateral isolation trenches 79 may comprise a respective pair of lengthwise sidewalls that are parallel to the first horizontal direction hd1 and vertically extend from the stopper insulating layer 106 to the top surface of the insulating cap layer 70. Each of the support openings 19 may comprise a continuously-extending sidewall that vertically extends from a top surface of the contact-level dielectric layer into the in-process source-level material layers 110' (if present). For example, the lower source-level semiconductor layer 112 can be physically exposed underneath each lateral isolation trench 79 and underneath each support opening 19.

In one embodiment, the lateral isolation trenches 79 may have a respective vertical cross-sectional profile including an inflection point 79P at which a tapered surface segment of a continuously-extending sidewall is adjoined to a reverse-tapered surface segment of a continuously-extending sidewall. As used herein, a tapered surface segment refers to a surface segment at which a lateral dimension of a volume of an element increases with a vertical distance from an underlying substrate 9, and a reverse-tapered surface segment refers to a surface segment at which the lateral dimension of the volume of the element decreases with a vertical distance from the underlying substrate 9. Generally, the sidewall of the lateral isolation trenches 79 may optionally have gradually changing slopes, and may optionally have a bowing vertical cross-sectional profile, with the largest width being at the inflection point 79P. The lateral isolation trenches 79 may have a maximum lateral width at along the second horizontal direction hd2 at the inflection point 79P in a range from 120 nm to 1,000 nm, such as from 240 nm to 600 nm, although lesser and greater lateral dimensions may be employed.

The support openings 19 may comprise first support openings 19A and second support openings 19B. The first support openings 19A may be proximal to a respective one of the lateral isolation trenches 79. The second support openings 19B may be laterally spaced from a most proximal one of the lateral isolation trenches 79 by at least one first support opening 19A along the second horizontal direction hd2. In one embodiment, the support openings 19 may have a respective vertical cross-sectional profile including a respective inflection point 19P at which a tapered surface segment of a continuously-extending sidewall is adjoined to a reverse-tapered surface segment of a continuously-extending sidewall. Generally, the sidewall of the support openings 19 may optionally have gradually changing slopes, and may optionally have a bowing vertical cross-sectional profile with the largest width at the inflection point 19P. The support openings 19 may have a maximum lateral dimension (such as a diameter) in a range from 20 nm to 400 nm, such as from 50 nm to 200 nm, although lesser and greater lateral dimensions may be employed. The photoresist layer can be subsequently removed, for example, by ashing.

Figure 7A:
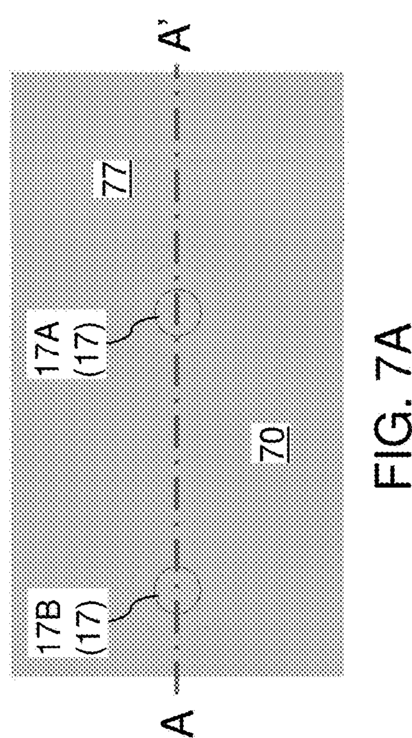
FIG. 7A is a top-down view of a region of the first exemplary structure after formation of sacrificial support opening fill structures and sacrificial isolation trench fill structures according to the first embodiment of the present disclosure.
Figure 7B:
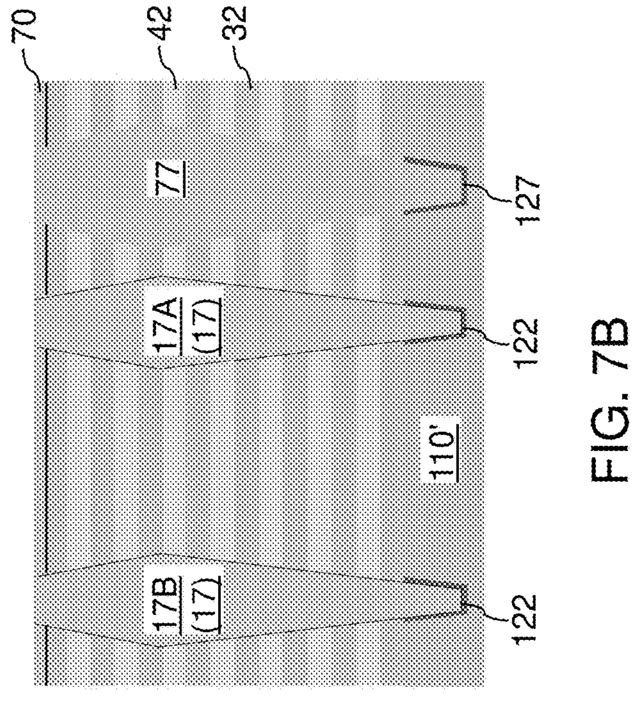
FIG. 7B is a vertical cross-sectional view along the vertical plane A-A' of FIG. 7A.

Referring to FIGS. 7A and 7B, exposed semiconductor material portions may be converted into dielectric liners by an oxidation and/or a nitridation process. Physically exposed surface portions of the in-process source-level material layers 110' (if present, or exposed surface portions of a semiconductor substrate 9 if layers 110' are not present)) are converted into dielectric liners (122, 127). For example, a thermal oxidation process, a thermal nitridation process, a plasma oxidation process, or a plasma nitridation process may be performed to convert physically exposed surface portions of the source-level semiconductor layers (112, 116) into the dielectric liners (122, 127), such as silicon oxide, silicon nitride or silicon oxynitride liners (122, 127). The dielectric liners (122, 127) may comprise support opening dielectric liners 122 and trench bottom dielectric liners 127 located at the bottoms of the support openings 19 and the lateral isolation trenches 79, respectively. For example, the oxidation process may comprise a catalytic water vapor generator (WVG) oxidation process to form silicon oxide dielectric liners 122 and 127. The WVG oxidation process does not oxidize the exposed sidewalls of the silicon nitride sacrificial layers 42.

A sacrificial fill material, such as amorphous silicon or polysilicon can be deposited in the support openings 19 and in the lateral isolation trenches 79. Excess portions of the sacrificial fill material can be removed from above the horizontal plane including the top surface of the insulating cap layer 70 by a planarization process, which may comprise a chemical mechanical polishing process or a recess etch process. Each remaining portion of the sacrificial fill material filling a lateral isolation trench 79 comprises a sacrificial isolation trench fill structure 77. Each remaining portion of the sacrificial fill material filling a first support opening 19A constitutes a first sacrificial support opening fill structure 17A. Each remaining portion of the sacrificial fill material filling a second support opening 19B constitutes a second sacrificial support opening fill structure 17B. The first sacrificial support opening fill structures 17A and the second sacrificial support opening fill structures 17B are collectively referred to as sacrificial support opening fill structures 17.

Figure 8A:
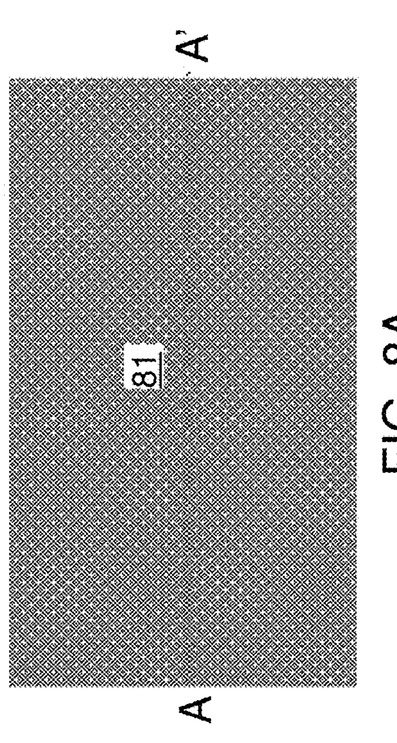
FIG. 8A is a top-down view of a region of the first exemplary structure after formation of a hard mask layer according to the first embodiment of the present disclosure.
Figure 8B:
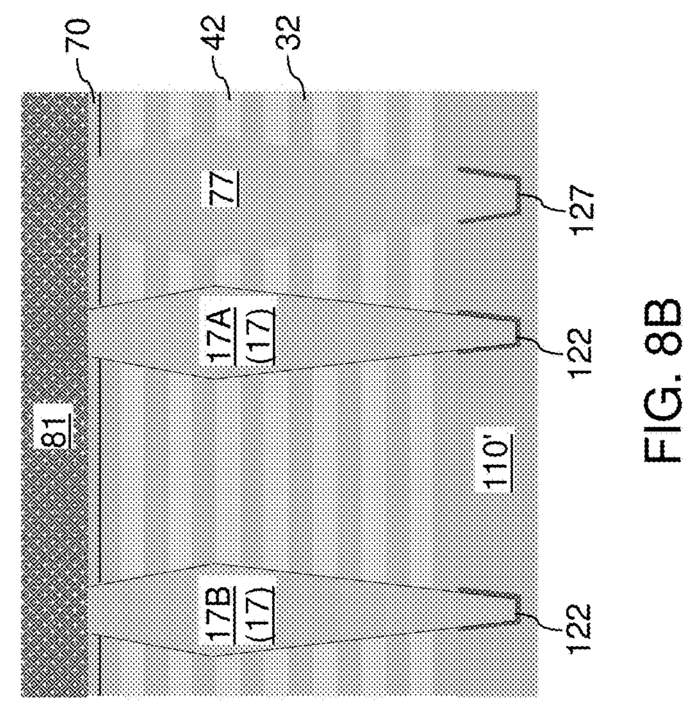
FIG. 8B is a vertical cross-sectional view along the vertical plane A-A' of FIG. 8A.

Referring to FIGS. 8A and 8B, a hard mask layer 81 can be formed over the insulating cap layer 70. The hard mask layer 81 comprises a hard mask material that is different from the material of the insulating cap layer 70. For example, the hard mask layer 81 may comprise silicon nitride, silicon oxide, a dielectric metal oxide, or a metallic material (such as TiN). The thickness of the hard mask layer 81 may be in a range from 30 nm to 300 nm, although lesser and greater thicknesses may also be employed.

Figures 9A, 9B, 10A, 10B:
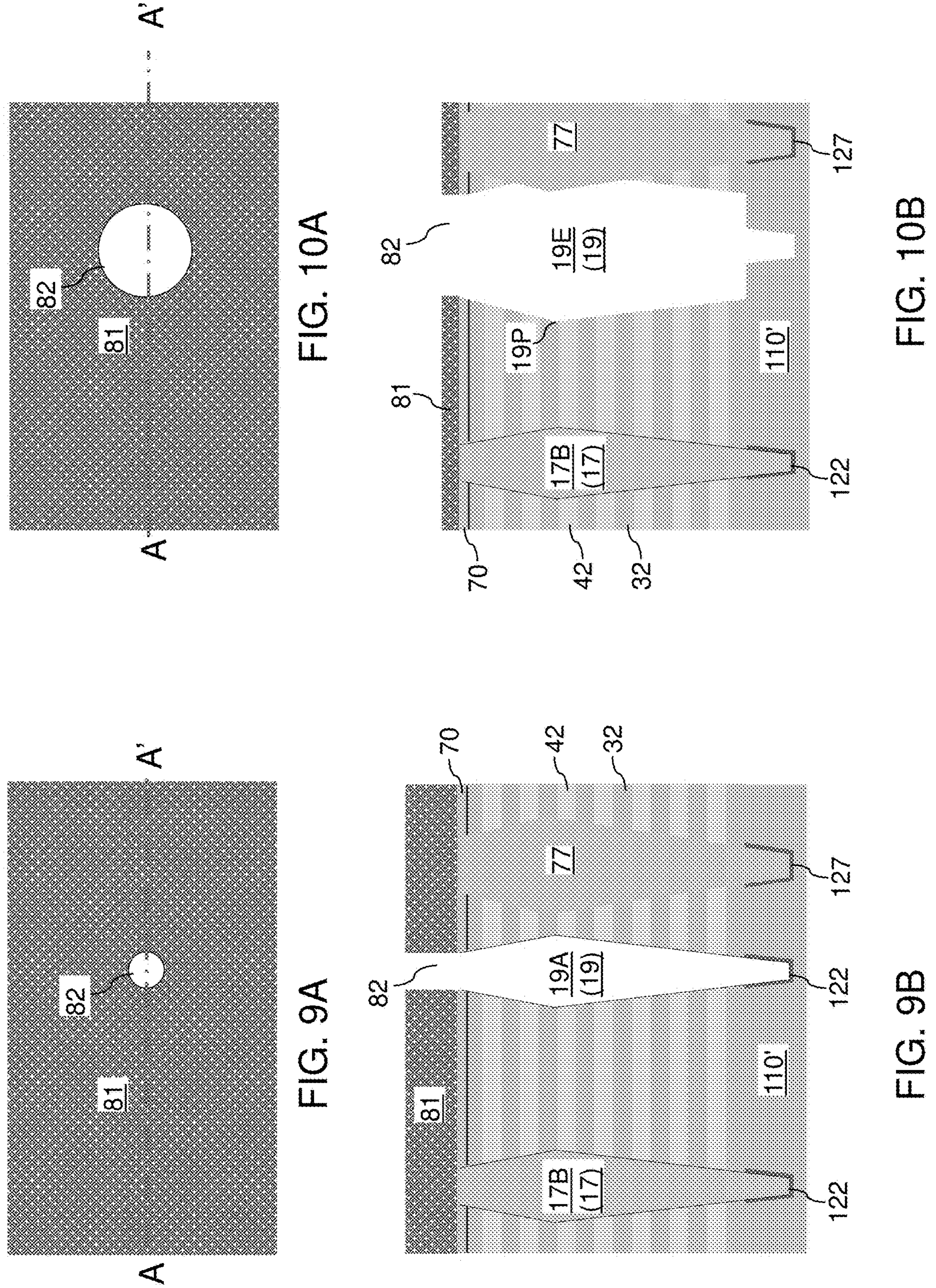
FIG. 9A is a top-down view of a region of the first exemplary structure after formation of openings through the hard mask layer and removal of first sacrificial support opening fill structures according to the first embodiment of the present disclosure.
FIG. 9B is a vertical cross-sectional view along the vertical plane A-A' of FIG. 9A.
FIG. 10A is a top-down view of a region of the first exemplary structure after lateral expansion of the first support openings according to the first embodiment of the present disclosure.
FIG. 10B is a vertical cross-sectional view along the vertical plane A-A' of FIG. 10A.

Referring to FIGS. 9A and 9B, the hard mask layer 81 can be patterned, for example, by applying a photoresist layer (not shown) thereupon, lithographically patterning the photoresist layer, and by transferring the pattern in the photoresist layer though the hard mask layer 81 by performing an anisotropic etch process. The photoresist layer can be subsequently removed, for example, by ashing. The openings 82 in the hard mask layer 81 can be formed within the areas of the first sacrificial support opening fill structures 17A. An isotropic etch process can be performed to remove the sacrificial fill material of the first sacrificial support opening fill structures 17A from underneath the openings 82 in the hard mask layer 81. In an illustrative example, if the first sacrificial support opening fill structures 17A comprise amorphous silicon, a wet etch process using hot trimethyl-2 hydroxyethyl ammonium hydroxide ("hot TMY") or tetramethyl ammonium hydroxide (TMAH) may be used to remove the first sacrificial support opening fill structures 17A selective to the materials of the alternating stack (32, 42) and the support opening dielectric liners 122.

Referring to FIGS. 10A and 10B, at least one isotropic etch process may be performed to isotropically etch portions of the alternating stack (32, 42) from around each of the first support openings 19A while the second sacrificial support opening fill structures 17B are covered with the hard mask layer 81. The first support openings 19A can be laterally expanded while the second support openings 19B (which are filled within the second sacrificial support opening fill structures 17B and covered with the hard mask layer 81) are not expanded in volume. The first support openings 19A can be converted into laterally-expanded first support openings 19E, which are also referred to as first support openings 19E.

The at least one isotropic etch process may comprise a first isotropic etch process that isotropically etches the materials of the insulating layers 32 and the insulating cap layer 70, and a second isotropic etch process that isotropically etches the material of the sacrificial material layers 42. For example, the first isotropic etch process may comprise a wet etch process employing buffered hydrofluoric acid, and the second isotropic etch process may comprise a wet etch process employing hot phosphoric acid. Alternatively, a single isotropic etch process which etches the materials of the insulating layers 32 and the sacrificial material layers 42 at about the same rate may be used. For example, dilute hydrofluoric acid in water (having a ratio of about 1:123) may be used to etch silicon oxide insulating layers 32 and silicon nitride sacrificial material layers 42 at about the same rate. Alternatively, only the sacrificial material layers 42 may be etched (e.g., by using hot phosphoric acids) without etching the insulating layers 32.

In summary, the first support openings 19A are laterally expanded by performing at least one isotropic etch process that removes portions of the sacrificial material layers 42 and optionally removes portions of the insulating layers 32 that are proximal to the first support openings 19A without significantly etching a semiconductor material layer (which may be, for example, the source-level semiconductor layers (112, 116) or a semiconductor substrate 9) that underlie the alternating stack (32, 42). In one embodiment, a subset of the support opening dielectric liners 122 that underlie the first support openings 19A may be collaterally removed during the isotropic etch process(es) that laterally expand the first support openings 19A. Each first support opening 19E vertically extends through each layer within the alternating stack (32, 42) and into an upper portion of a semiconductor material layer (which may be, for example, the source-level semiconductor layers (112, 116) or the semiconductor substrate 9) that underlies the alternating stack (32, 42). An annular horizontal surface of a semiconductor material layer (such as an annular top surface of the upper source-level semiconductor layer 116 or the semiconductor substrate 9) can be physically exposed upon underneath each first support opening 19E upon laterally expanding the first support openings 19A.

In one embodiment, the duration of the isotropic etch process(es) that form the laterally-expanded support openings 19E may be selected such that a surface segment of a respective sacrificial isolation trench fill structure 77 in the respective lateral isolation trench 79 is physically exposed to at least one of the laterally-expanded support openings 19E upon laterally expanding the first support openings 19A. For example, a middle surface segment of a respective sacrificial isolation trench fill structure 77 may be exposed to at least one of the laterally-expanded support openings 19E around the vertical level of the inflection point 19P, while the bottom and top surface segments of the respective sacrificial isolation trench fill structure 77 may be covered by the alternating stack (32, 42). Each laterally expanded first support opening 19E may have a downward-protruding volume that protrudes into an upper portion of a semiconductor material layer (which may be, for example, the source-level semiconductor layers (112, 116) or the semiconductor substrate 9). The hard mask layer 81 may be collaterally thinned during the isotropic etch process(es) that laterally expand(s) the first support openings 19A.

Figures 11A, 11B, 12A, 12B:
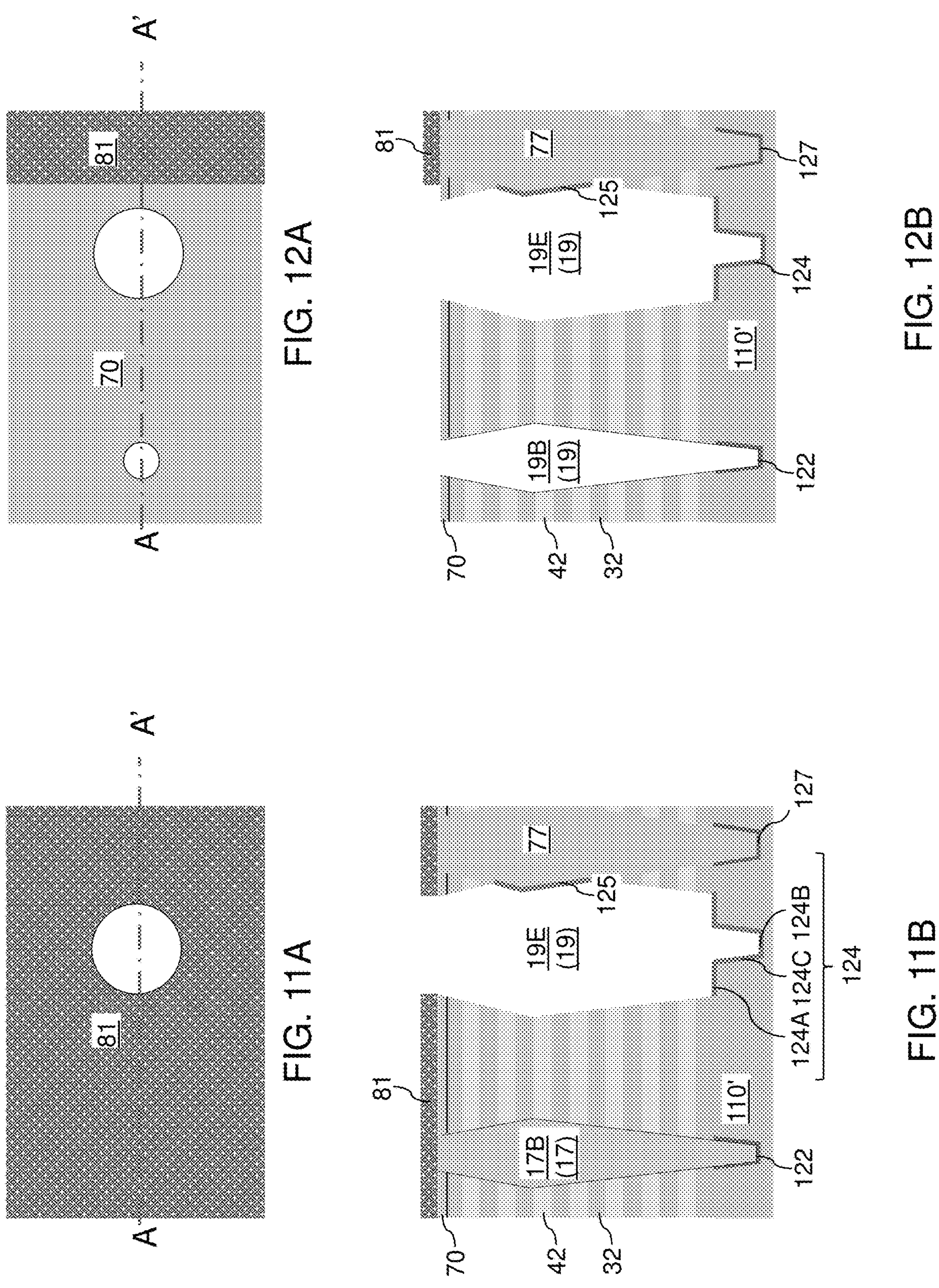
FIG. 11A is a top-down view of a region of the first exemplary structure after formation of first dielectric liners and vertically-extending dielectric liners according to the first embodiment of the present disclosure.
FIG. 11B is a vertical cross-sectional view along the vertical plane A-A' of FIG. 11A.
FIG. 12A is a top-down view of a region of the first exemplary structure after additional patterning of the hard mask layer according to the first embodiment of the present disclosure.
FIG. 12B is a vertical cross-sectional view along the vertical plane A-A' of FIG. 12A.

Referring to FIGS. 11A and 11B, a surface conversion process can be performed to convert physically exposed surface portions of the semiconductor material layer (which may be, for example, the source-level semiconductor layers (112, 116) or the semiconductor substrate 9) exposed in the laterally-expanded support openings 19E into first dielectric liners 124 and to convert physically exposed surface portions of the semiconductor sacrificial isolation trench fill structures 77 exposed in the laterally-expanded support openings 19E into vertically-extending dielectric liners 125. The surface conversion process may comprise a thermal oxidation process, a thermal nitridation process, a plasma oxidation process, or a plasma nitridation process.

The first dielectric liners 124 and the vertically-extending dielectric liners 125 may comprise silicon oxide or silicon nitride, and may have a thickness in a range from 1 nm to 6 nm, although lesser and greater thicknesses may also be employed. For example, the oxidation process may comprise a catalytic water vapor generator (WVG) oxidation process to form silicon oxide dielectric liners 124 and 125. The WVG oxidation process does not oxidize the exposed sidewalls of the silicon nitride sacrificial layers 42.

In one embodiment, each first dielectric liner 124 comprises an annular dielectric plate portion 124P, a cylindrical dielectric portion (which may optionally be tapered) 124C connected to an inner periphery of the annular dielectric plate portion, 124P and a bottom dielectric plate portion 124B connected to a bottom periphery of the cylindrical dielectric portion 124C.

Referring to FIGS. 12A and 12B, the hard mask layer 81 may be additionally patterned to remove portions of the hard mask layer 81 that overlies the second sacrificial support opening fill structures 17B. The memory opening fill structures 58 and the sacrificial isolation trench fill structures 77 remain covered by the remaining portions of the hard mask layer 81 at this processing step.

A selective etch process can be performed to remove the second sacrificial support opening fill structures 17B from the second support openings 19B. In an illustrative example, if the second sacrificial support opening fill structures 17B comprise amorphous silicon, a wet etch process using hot trimethyl-2 hydroxyethyl ammonium hydroxide ("hot TMY") or tetramethyl ammonium hydroxide (TMAH) may be used to remove the second sacrificial support opening fill structures 17B selective to the materials of the alternating stack (32, 42), the hard mask layer 81 and the support opening dielectric liners 122.

Figure 13A:
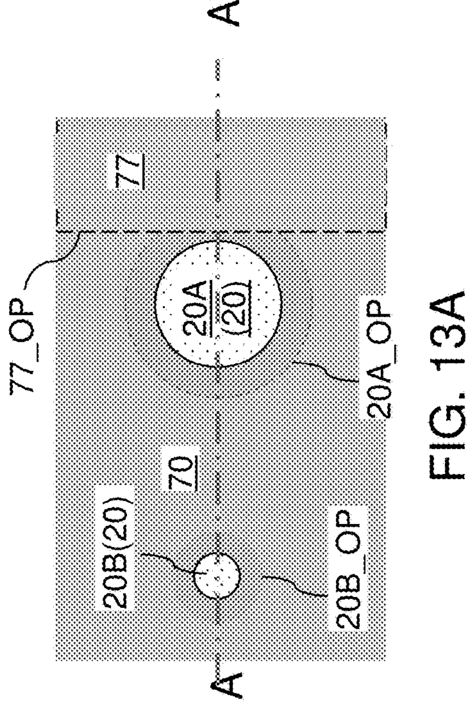
FIG. 13A is a partial see-through top-down view of a region of the first exemplary structure after formation of first dielectric support pillar structures and second dielectric support pillar structures according to the first embodiment of the present disclosure.
Figure 13B:
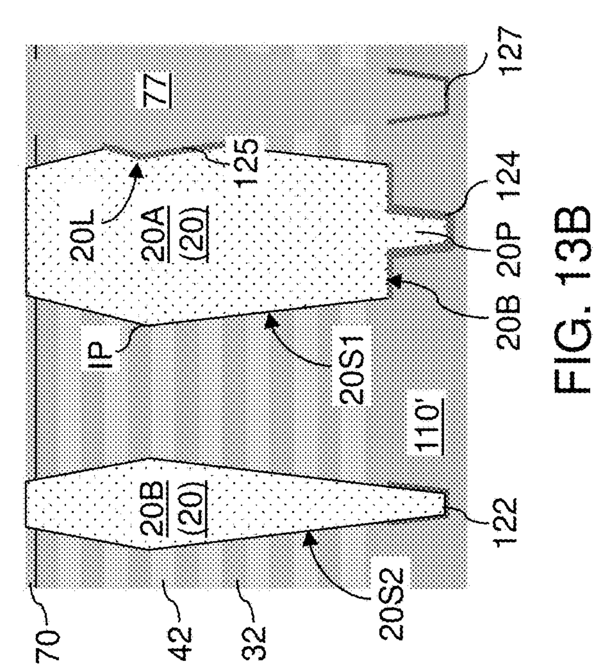
FIG. 13B is a vertical cross-sectional view along the vertical plane A-A' of FIG. 13A.

Referring to FIGS. 13A and 13B, a dielectric fill material, such as undoped silicate glass (i.e., silicon oxide) or a doped silicate glass, can be conformally deposited in the volumes of the support openings (19E, 19B). Excess portions of the dielectric fill material can be removed from above the horizontal plane including the top surface of the insulating cap layer 70 by performing a planarization process, which may comprise a chemical mechanical polishing process and/or a recess etch process. The remaining portions of the hard mask layer 81 may be removed during or after the planarization process. Each remaining portion of the dielectric fill material that fills a laterally expanded first support opening 19E constitutes a first dielectric support pillar structure 20A. Each remaining portion of the dielectric fill material that fills a second support opening 19B constitutes a second dielectric support pillar structure 20B. The first dielectric support pillar structures 20A and the second dielectric support pillar structures 20B are collectively referred to as dielectric support pillar structures 20. The dielectric support pillar structures 20 may comprise silicon oxide dielectric pillar structures. The first dielectric support pillar structures 20A are wider than the second dielectric support pillar structures 20B in a direction parallel to the top surface of the substrate 9.

The maximum lateral extent of a sacrificial trench opening fill structure 77 is illustrated in FIG. 13A as an outer periphery 77_OP, the maximum lateral extent of a first dielectric support pillar structure 20A is illustrated as an outer periphery 20A_OP, and the maximum lateral extent of a second dielectric support pillar structure 20B is illustrated as an outer periphery 20B_OP.

In one embodiment, each first dielectric support pillar structure 20A comprises a first continuously-extending sidewall 20S1 that extends vertically through each layer within the alternating stack (32, 42) and an annular horizontal bottom surface 20H having an outer periphery that is adjoined to a bottom edge of the first continuously-extending sidewall 20S1. In one embodiment, each first dielectric support pillar structure 20A comprises a downward-protruding portion 20P that protrudes downward from the annular horizontal bottom surface 20H into a semiconductor material layer (which may be, for example, the source-level semiconductor layers (112, 116) or the semiconductor substrate 8).

In one embodiment, each first continuously-extending sidewall 20S1 may be free of any horizontally-extending surface segment, and thus, may be free of any horizontally-extending step. In one embodiment, a vertical cross-sectional profile of at least some of the first dielectric support pillar structures 20A may comprise a respective inflection point IP at which a tapered surface segment of the first continuously-extending sidewall is adjoined to a reverse-tapered surface segment of the first continuously-extending sidewall.

In one embodiment, at least one the first dielectric support pillar structures 20A may comprise a respective lateral indentation 20L that is contacted by a respective vertically-extending dielectric liner 125. Each lateral indentation 20L may have a vertical extent that is less than a total vertical extent of the alternating stack (32, 42).

In one embodiment, at least some of the second dielectric support pillar structures 20B may comprise a respective second continuously-extending sidewall 20S2 that extends vertically through each layer within the alternating stack (32, 42) and into an upper portion of the semiconductor material layer (which may be, for example, the source-level semiconductor layers (112, 116) or a semiconductor substrate) to a bottommost surface of the second dielectric support pillar structure 20B without any horizontally-extending surface segment therein.

Figure 14A:
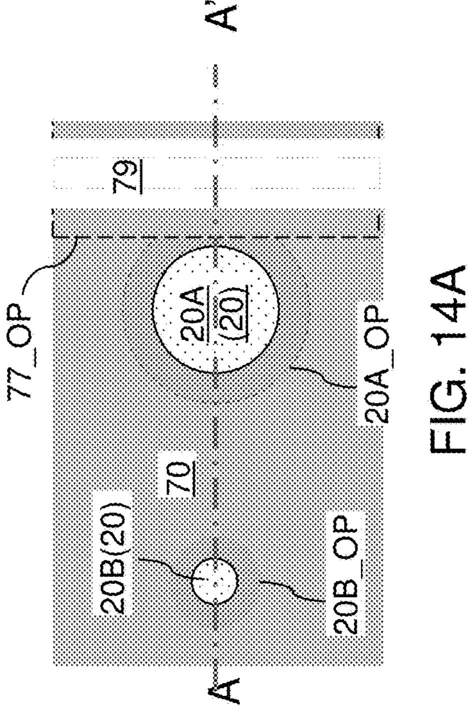
FIG. 14A is a partial see-through top-down view of a region of the first exemplary structure after removal of the sacrificial isolation trench fill structures according to the first embodiment of the present disclosure.
Figure 14B:
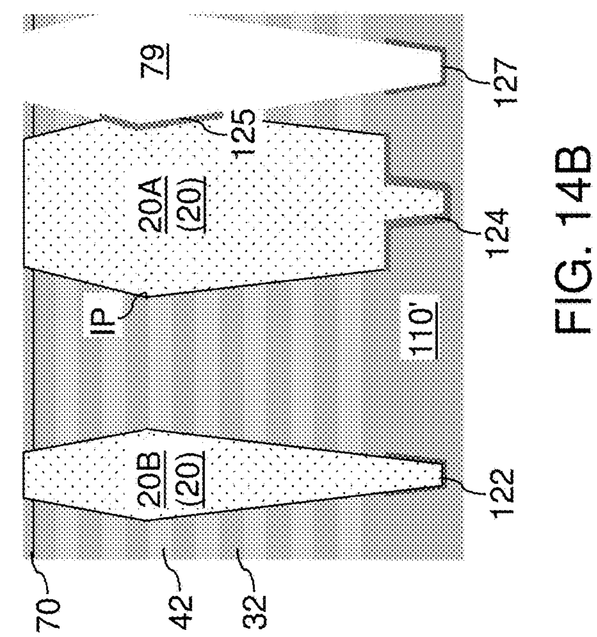
FIG. 14B is a vertical cross-sectional view along the vertical plane A-A' of FIG. 14A.

Referring to FIGS. 14A and 14B, a selective isotropic etch process can be performed to remove the sacrificial isolation trench fill structures 77 selective to the materials of the alternating stacks (32, 42), the insulating cap layer 70, the dielectric support pillar structures (20A, 20B), and the trench bottom dielectric liners 127. Voids are formed in the volumes of the lateral isolation trenches 79.

Figure 15:
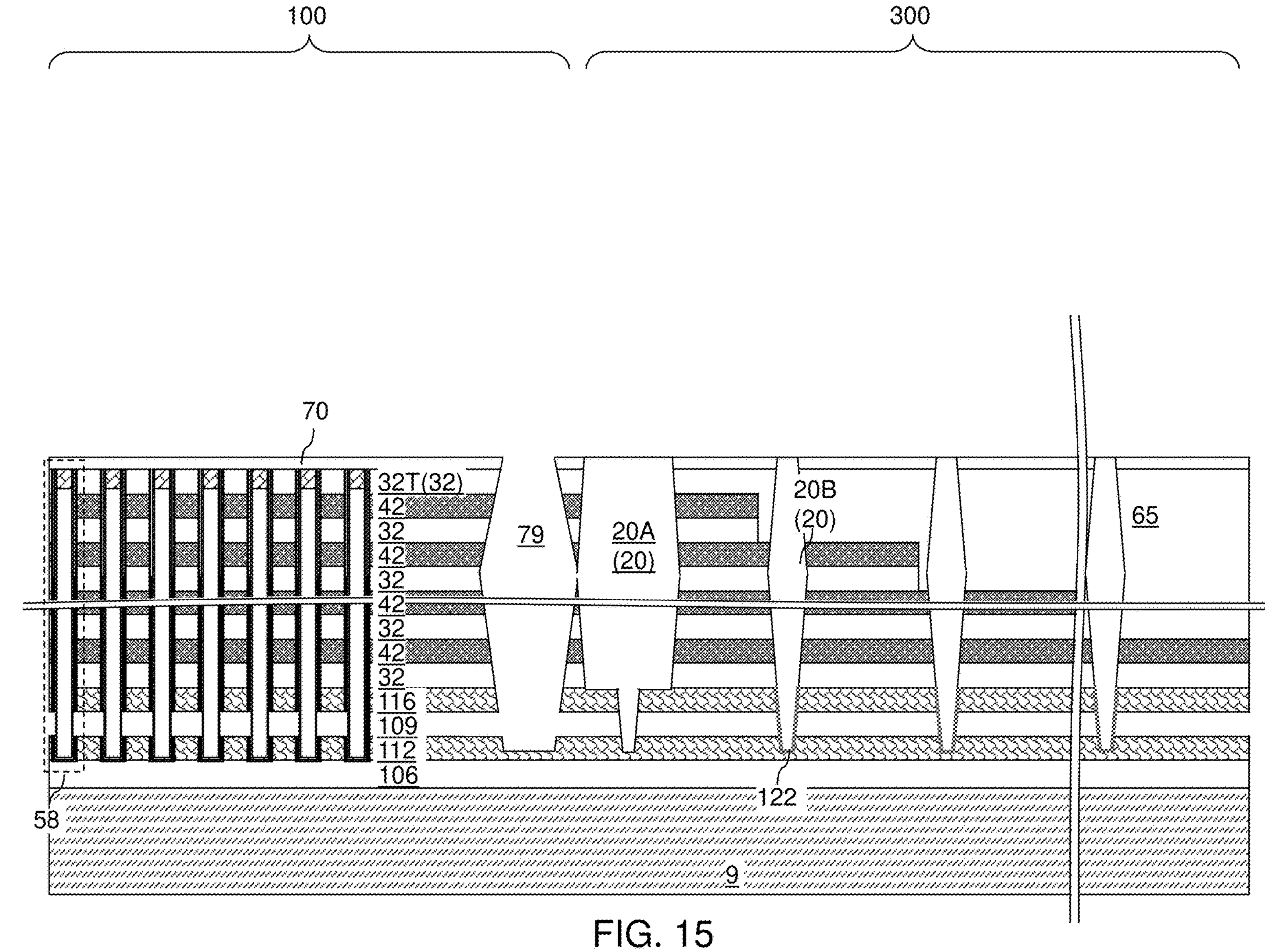
FIG. 15 is a vertical cross-sectional view of the first exemplary structure after formation of a source-level cavity according to the first embodiment of the present disclosure.
Figure 16A:
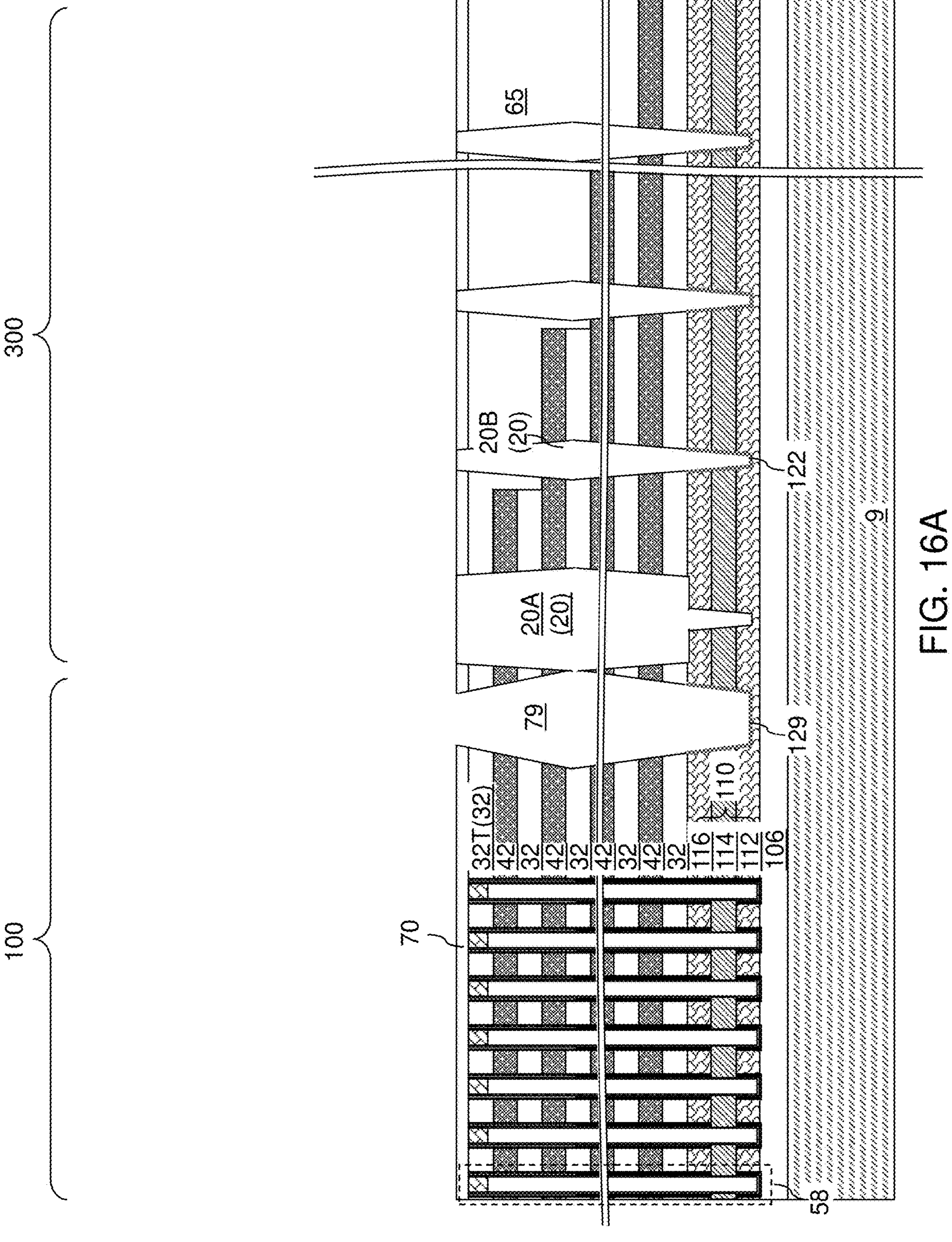
FIGS. 16A-16D are various views of the first exemplary structure after formation of a source contact layer according to the first embodiment of the present disclosure.
Figure 16B:
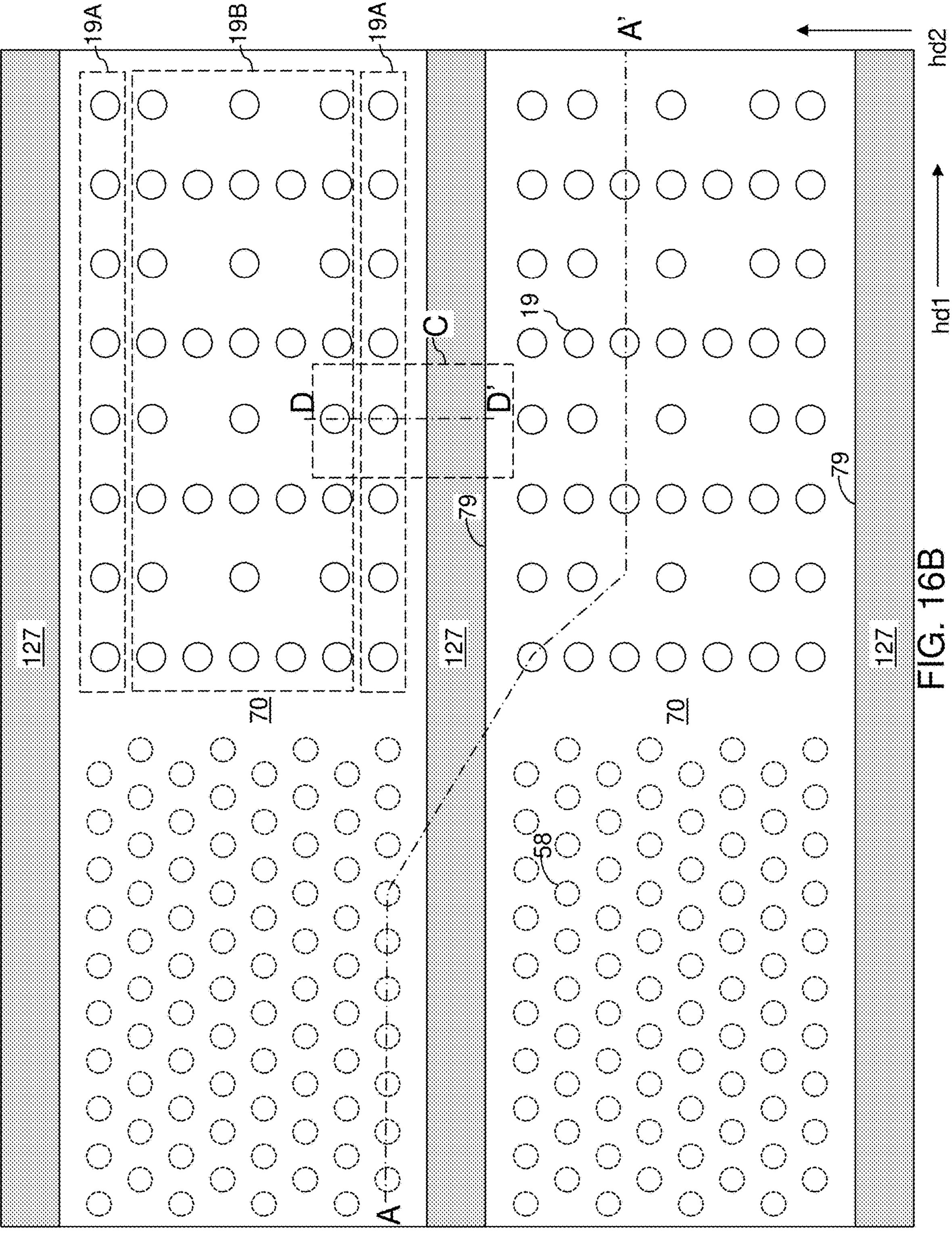
Figure 16C:
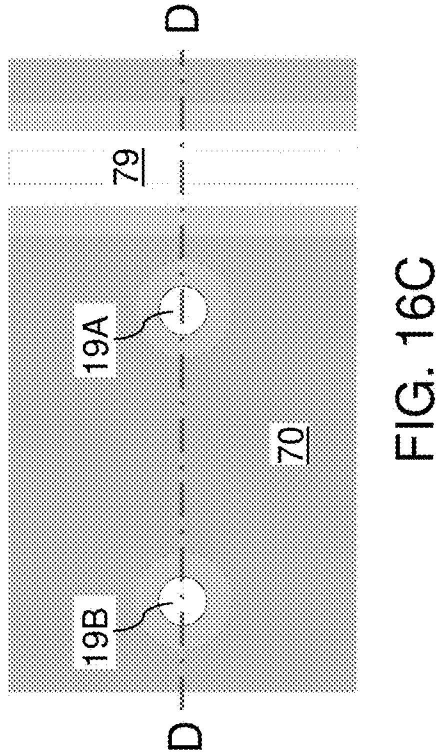
Figure 16D:
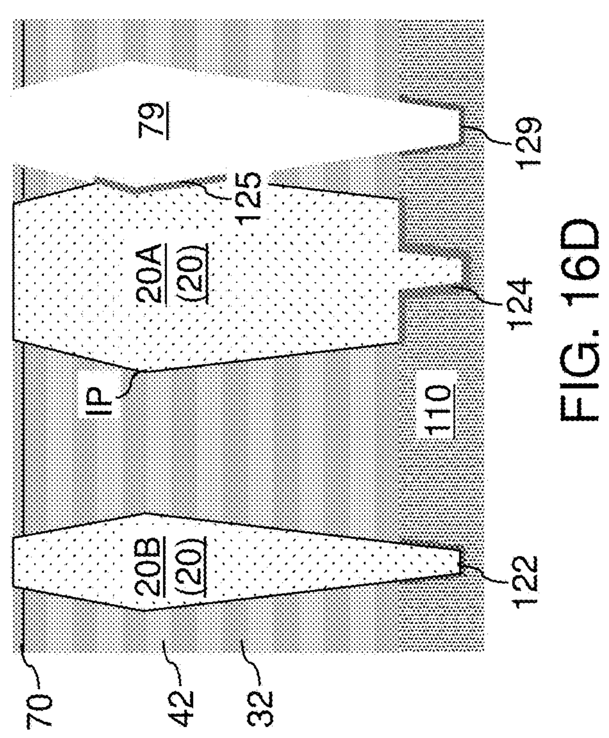

Referring to FIG. 15, if the in-process source-level material layers 110' are used, then the source-level sacrificial layer 104 is selectively removed through the lateral isolation trenches 79. An etchant that etches the material of the source-level sacrificial layer 104 selective to the materials of the alternating stack (32, 42), the contact-level dielectric layer 80, the stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the contact-level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Referring to FIGS. 16A-16D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Optionally, a dielectric surface conversion process, such as an oxidation process or a nitridation process, may be performed to convert physically exposed surface portions of the source layer 110 from underneath each lateral isolation trench 79 to form trench bottom dielectric liners 129. The source layer 110 includes semiconductor material layers such as a stack of a lower source-level semiconductor layer 112, a source contact layer 114, and an upper source-level semiconductor layer 116.

Referring to FIGS. 17A-17D, an isotropic etch process can be performed to remove the sacrificial material layers 42 selective to the insulating layers 32, the stopper insulating layer 106, the memory opening fill structures 58, the sacrificial etch stop liners 71, and the source layer 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon oxide, the isotropic etch process may comprise a wet etch process employing hot phosphoric acid, which is a process in which the first exemplary structure is immersed in phosphoric acid at, or near, the boiling point of the phosphoric acid. A suitable clean process may be performed as needed.

Figure 17A:
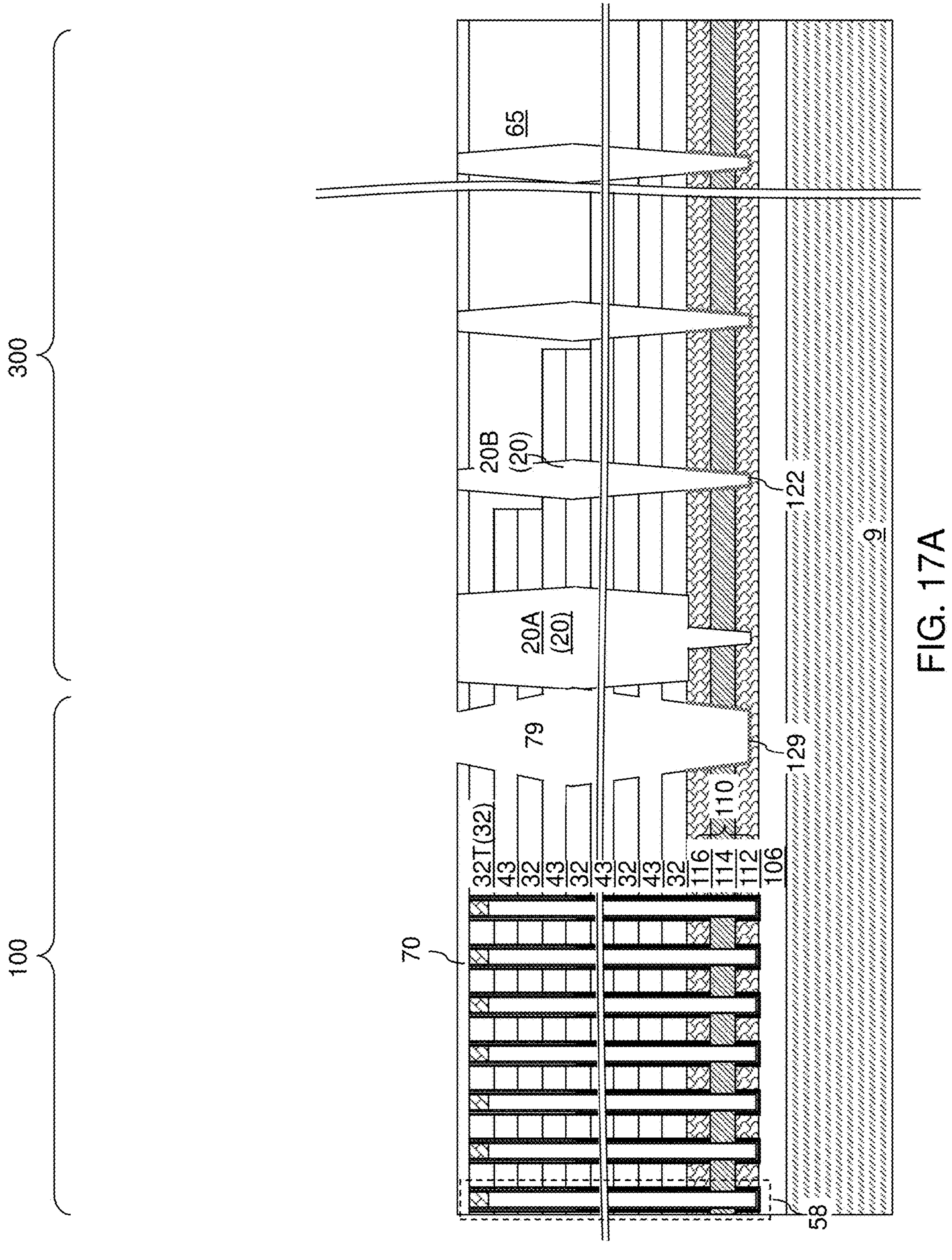
FIGS. 17A-17D are various views of the first exemplary structure after formation of trench bottom dielectric liners and laterally-extending cavities according to the first embodiment of the present disclosure.
Figure 17B:
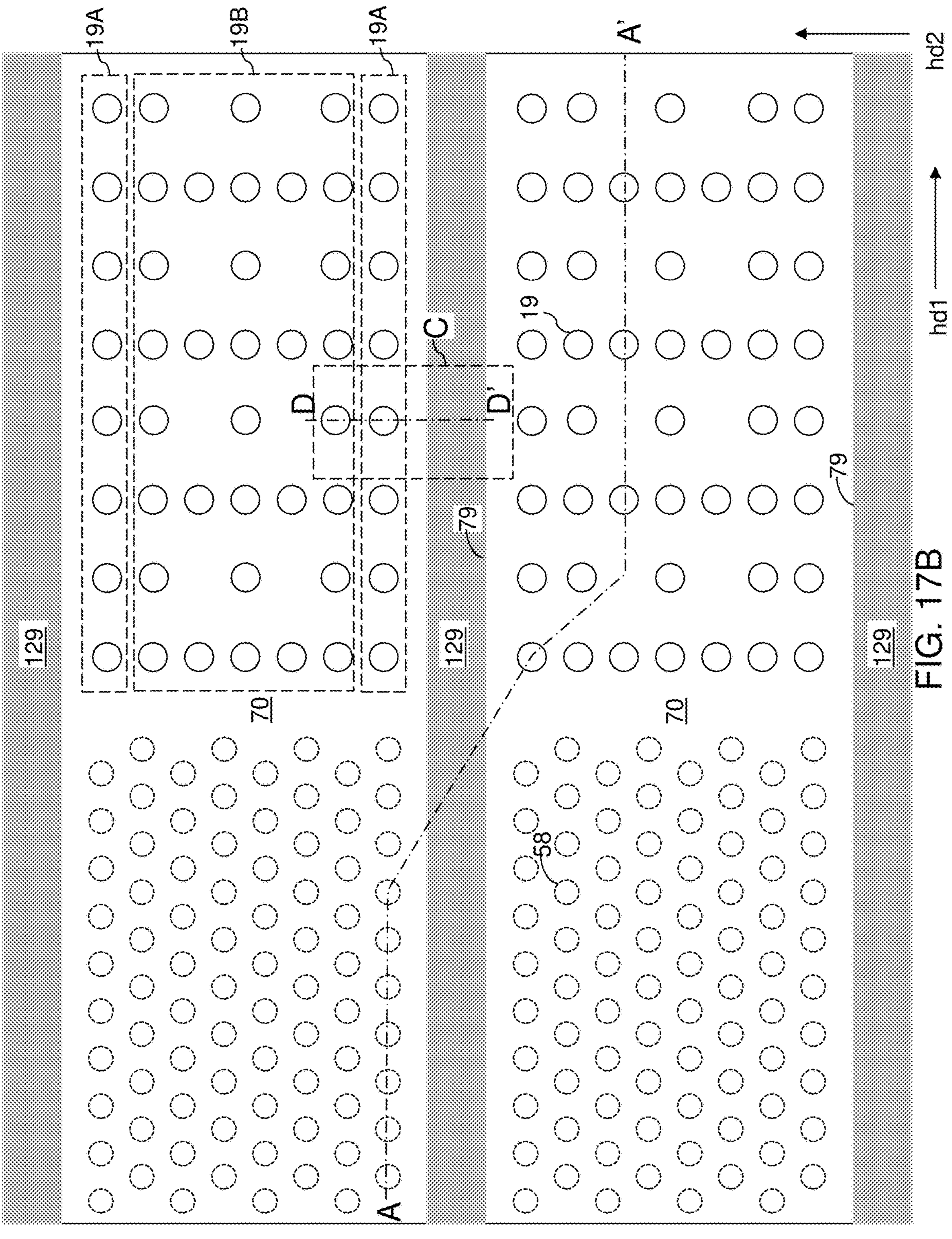
Figure 17C:
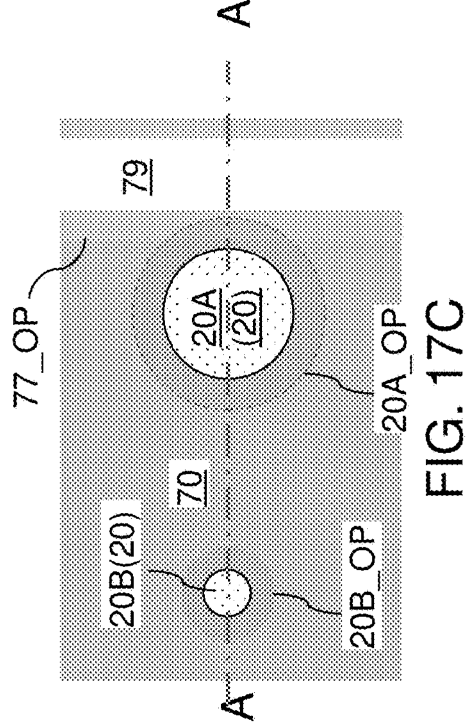
Figure 17D:
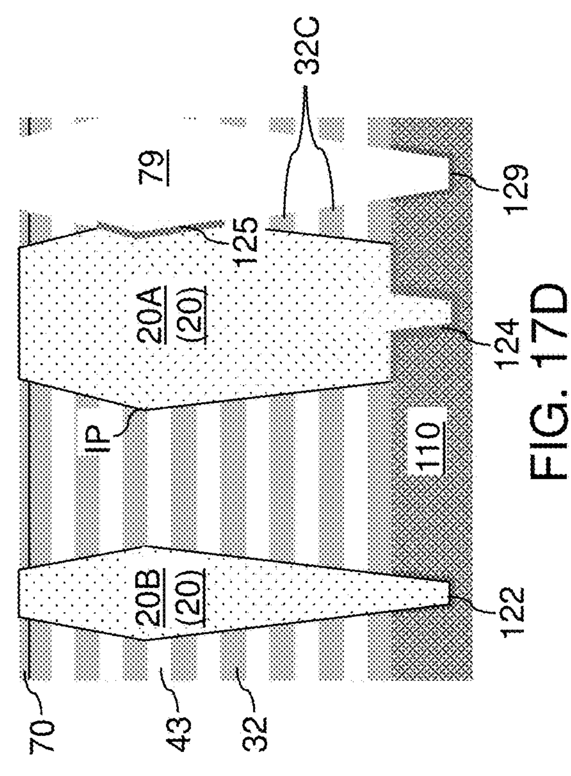

According to an aspect of the present disclosure, the first dielectric support pillar structures 20A provide enhanced structural support to the insulating layers 32, the insulating cap layer 70, and the stepped dielectric material portion 65 due to the increase in the lateral dimension of each first dielectric support pillar structure 20A. Further, edges of the first dielectric support pillar structures 20A can be self-aligned to the lateral boundaries of the lateral isolation trenches 79 due to the self-alignment of the volumes of the laterally-expanded first support openings 19E at the processing steps of FIGS. 10A and 10B. Thus, pattern collapse can be reduced or prevented through use of the wider first dielectric support pillar structures 20A. Specifically, the horizontal length of the cantilevered portions 32C of the insulating layers 32 located between the first dielectric support pillar structures 20A the adjacent to the lateral isolation trenches 79 is reduced, as shown in FIG. 17D. This reduces or eliminates the downward deflection of these cantilevered portions 32C of the insulating layers 32 into of the first the laterally-extending cavities 43.

Figure 18:
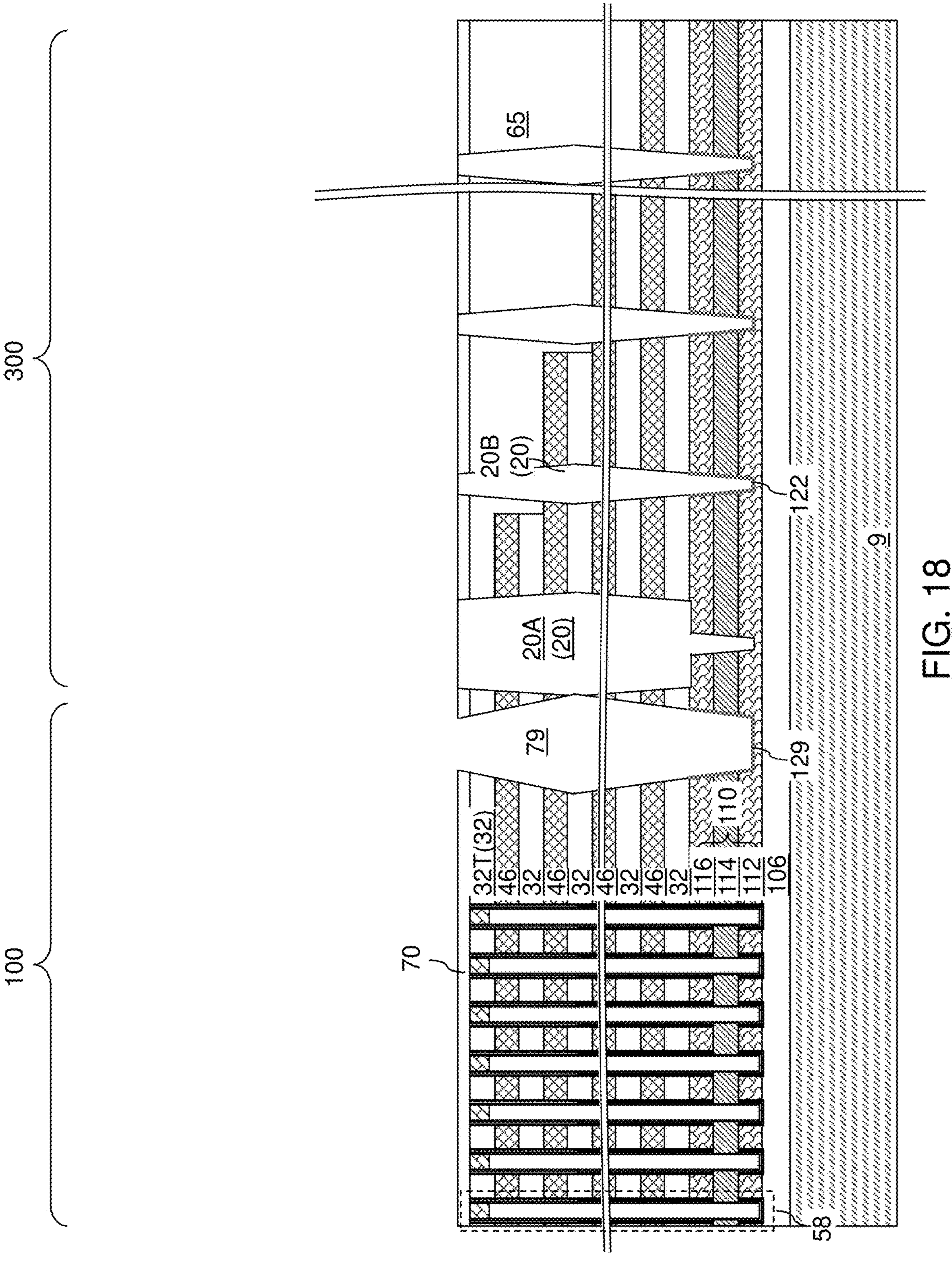
FIG. 18 is a vertical cross-sectional view of the first exemplary structure after formation of electrically conductive layers according to the first embodiment of the present disclosure.

Referring to FIG. 18, a backside blocking dielectric layer (not shown) can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the insulating cap layer 70 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46. An alternating stack of insulating layers 32 and electrically conductive layers 46 can be formed between each neighboring pair of lateral isolation trenches 79 over the carrier substrate 9. A plurality of alternating stacks of insulating layers 32 and electrically conductive layers 46 can be laterally spaced apart among one another by the lateral isolation trenches 79. The electrically conductive layers 46 include the word lines and the select gate electrodes (46D, 46S).

Referring to FIGS. 19A and 19B, an insulating liner material may be conformally deposited in the lateral isolation trenches 79, and an anisotropic etch process can be performed to remove horizontally-extending portions of the insulating liner material. Each remaining vertically-extending portion of the insulating liner material constitutes an insulating spacer 74, which can have straight inner sidewalls due to the anisotropic etch process. A center portion of each trench bottom dielectric liner 129 can be removed, and a surface of a semiconductor material layer, such as the lower source-level semiconductor layer 112 or the semiconductor substrate 9, can be physically exposed underneath each void that is laterally surrounded by a respective insulating spacer 74.

At least one electrically conductive material can optionally be deposited in remaining volumes of the lateral isolation trenches 79. Excess portions of the at least one electrically conductive material can be removed from above the horizontal plane including the top surface of the insulating cap layer 70 by a planarization process such as a chemical mechanical polishing process. Each remaining portion of the at least one electrically conductive material that is located within a respective lateral isolation trench 79 constitutes a conductive wall structure 76, which is a source contact via structure that contacts the source layer 110 (or a doped source region in the semiconductor substrate 9).

Each contiguous combination of an insulating spacer 74 and a conductive wall structure 76 fills a respective lateral isolation trench, and constitutes an isolation trench fill structure (74, 76). Thus, each isolation trench fill structure (74, 76) comprises an insulating spacer 74 and a conductive wall structure 76, and vertically extends at least from a horizontal plane including a topmost surface of the alternating stack (32, 42) to a semiconductor material layer (which may be, for example, any semiconductor layer in the source layer 110 or a doped source region in the substrate 9).

Figure 20A:
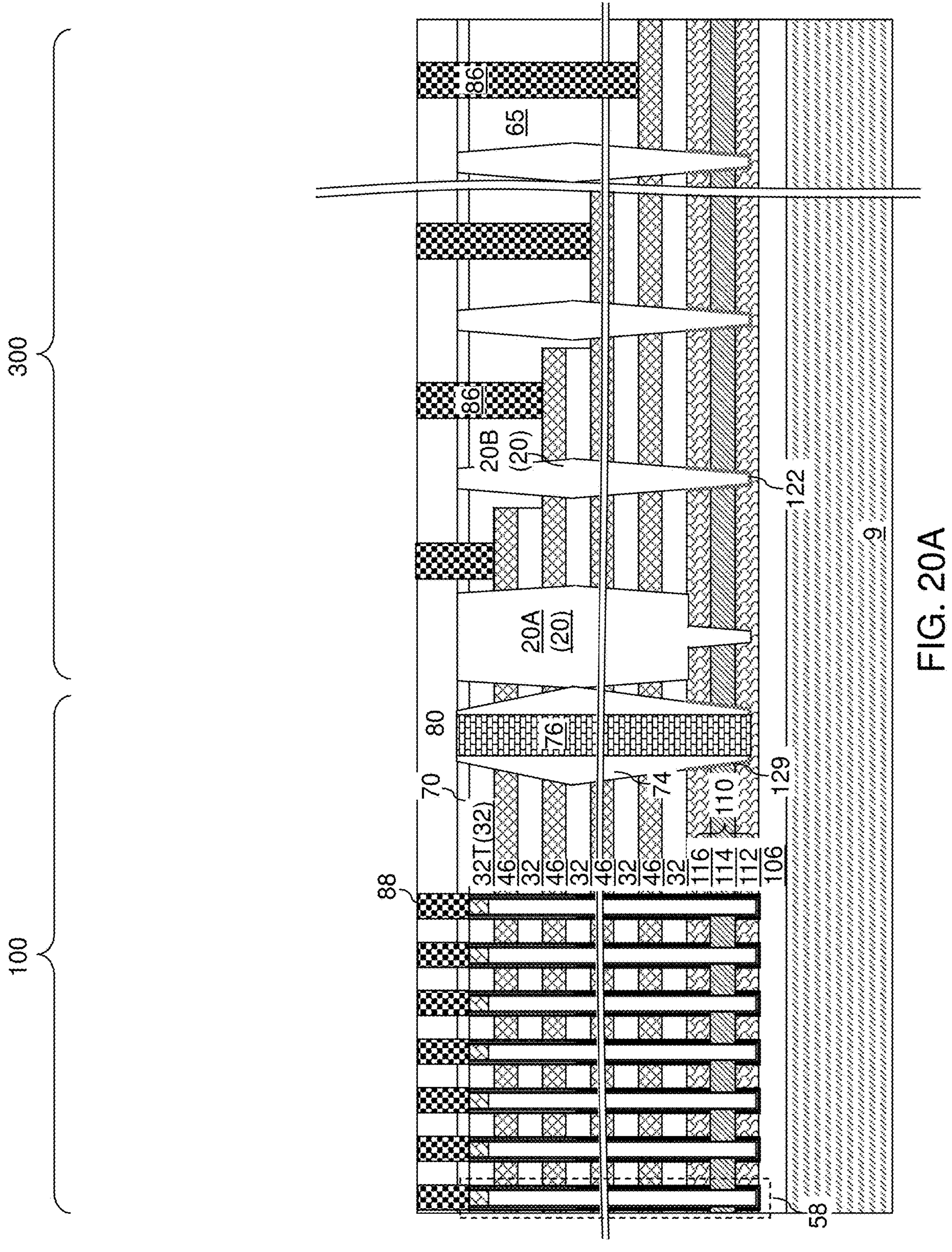
FIG. 20A is a vertical cross-sectional view of the first exemplary structure after formation of contact via structures according to the first embodiment of the present disclosure.
Figure 20B:
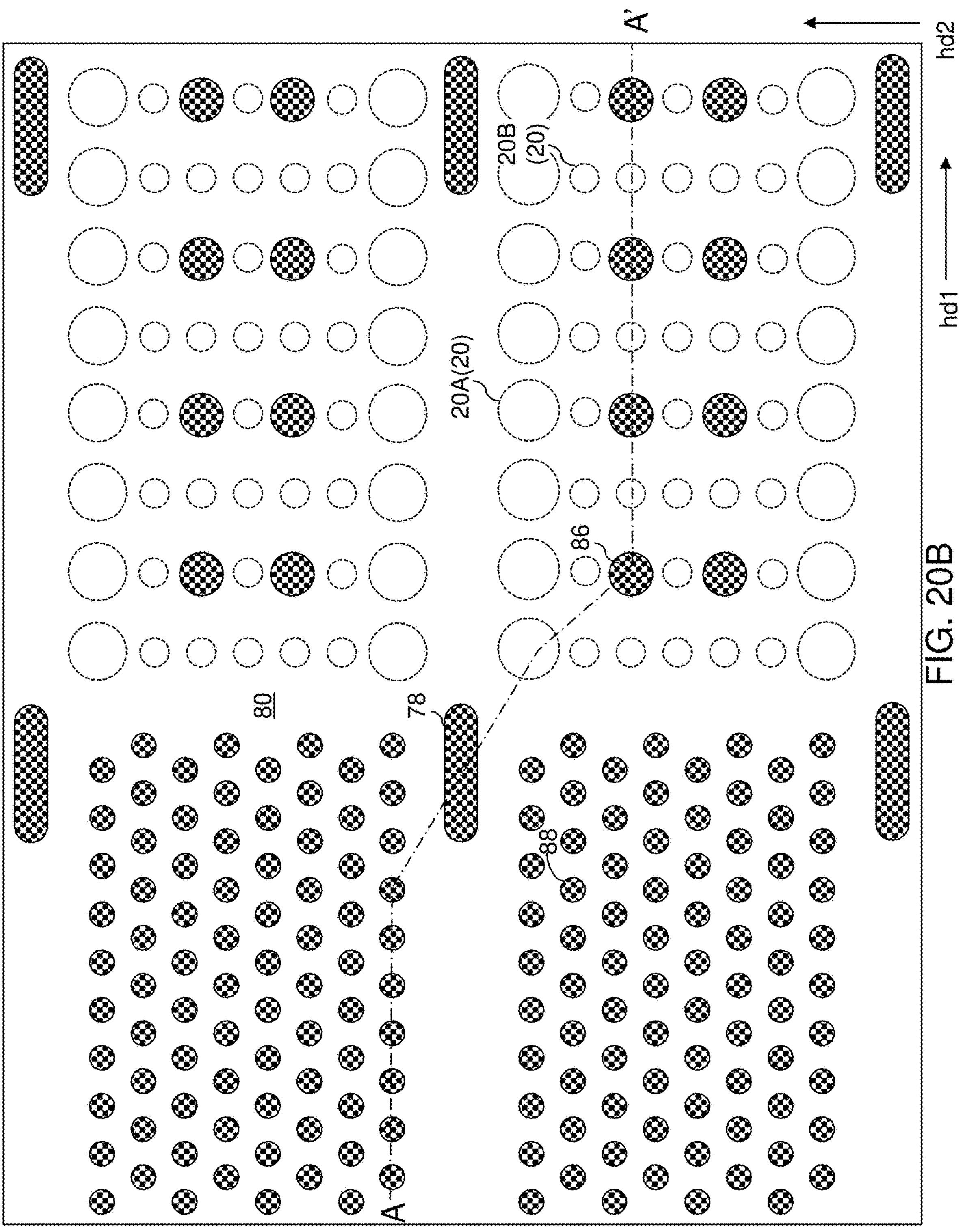
FIG. 20B is a top-down view of the first exemplary structure of FIG. 20A. The vertical plane A-A' is the cut plane of the vertical cross-sectional view of FIG. 20A.

Referring to FIGS. 20A and 20B, a contact-level dielectric layer 80 can be formed above the insulating cap layer 70. The contact-level dielectric layer 80 comprises a dielectric material such as undoped silicate glass or a doped silicate glass, and may have a thickness in a range from 100 nm to 800 nm, such as from 200 nm to 500 nm, although lesser and greater thicknesses may also be employed.

A photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the stepped dielectric material portion 65. Drain contact via cavities can be formed through the contact-level dielectric layer 80 over the memory opening fill structures 58. Layer contact via structures can be formed through the contact-level dielectric layer 80 and the stepped dielectric material portion 65 on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46.

Figure 21A:
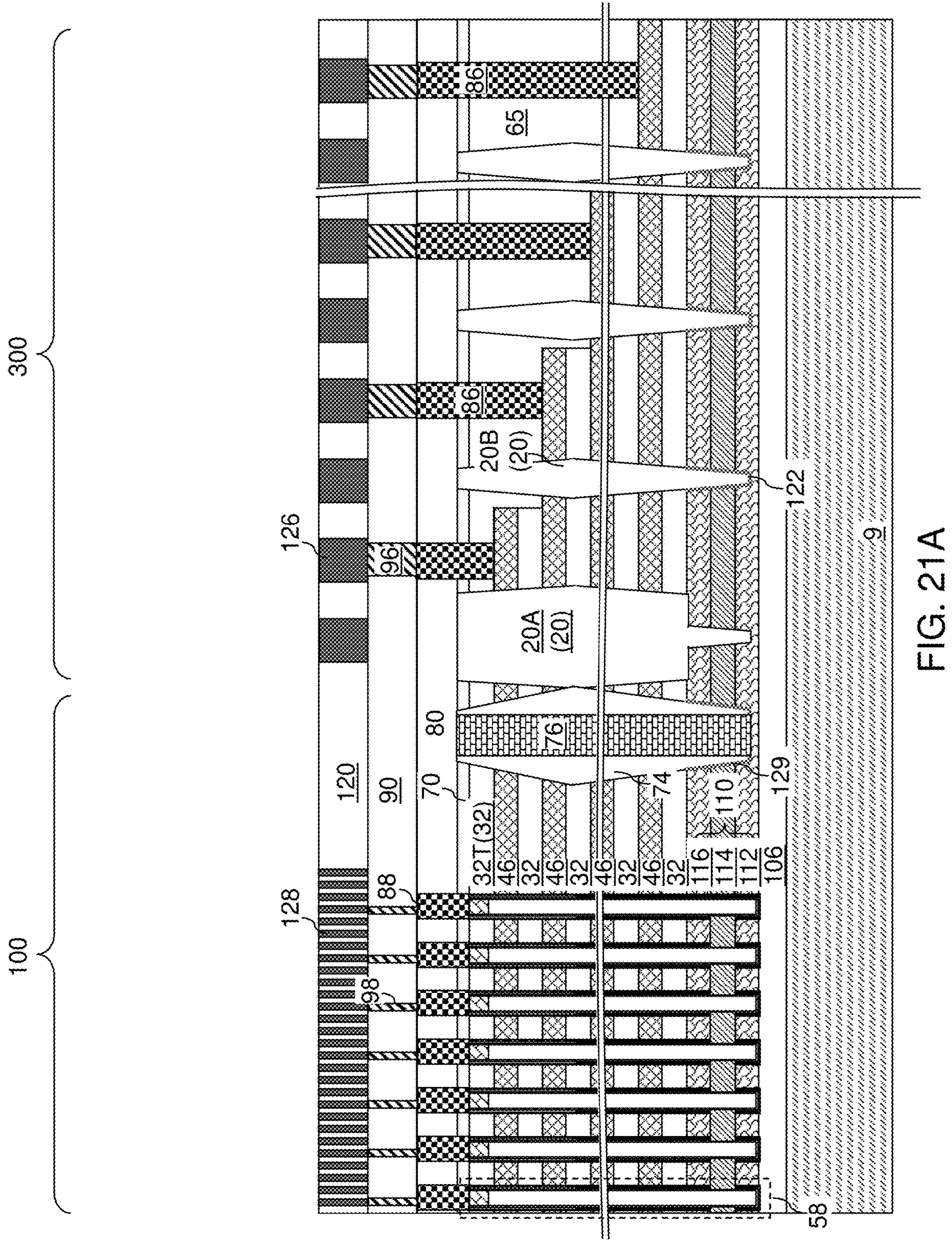
FIG. 21A is a vertical cross-sectional view of the first exemplary structure after formation of bit lines and bit-line-level metal lines according to the first embodiment of the present disclosure.
Figure 21B:
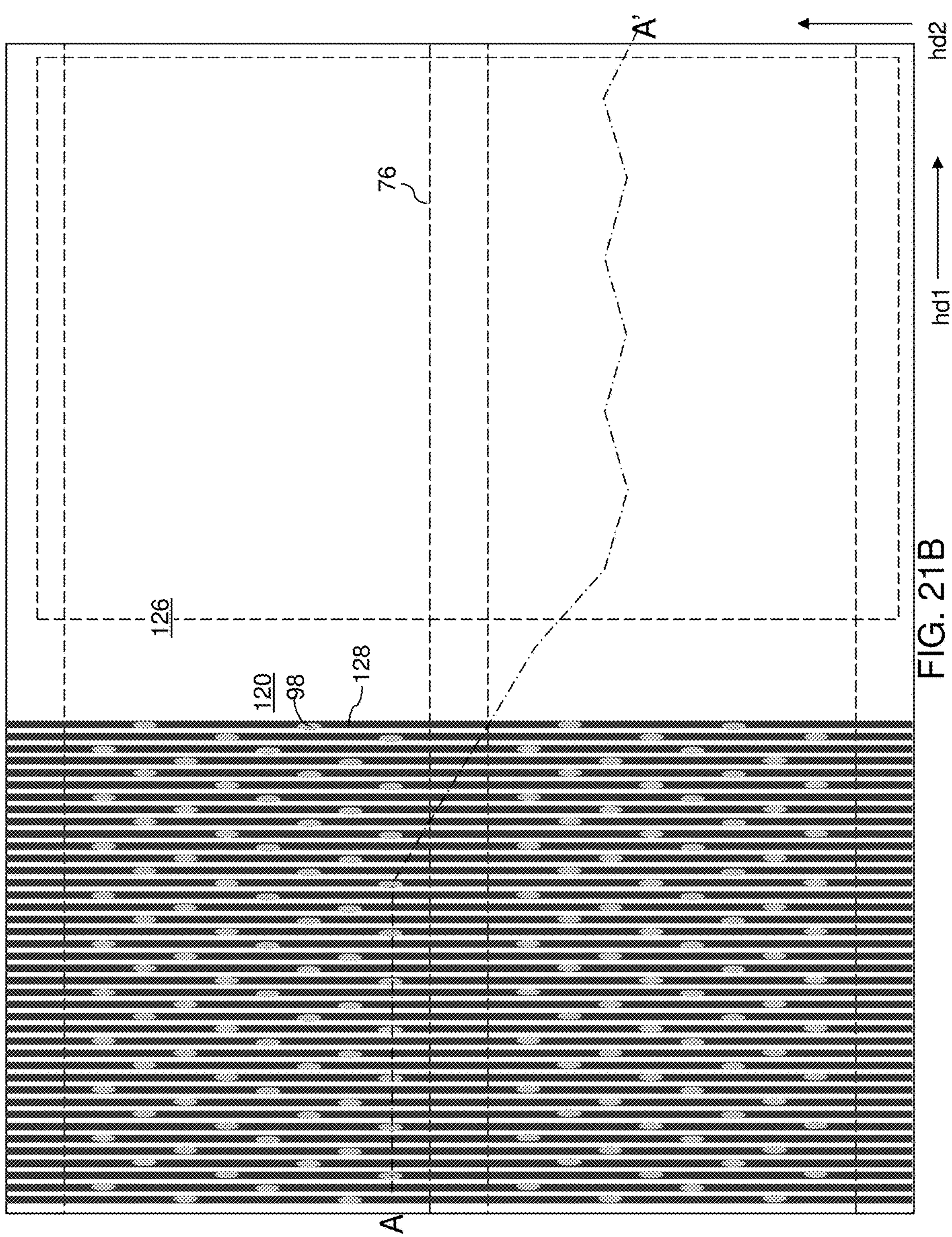
FIG. 21B is a top-down view of the first exemplary structure of FIG. 21A. The vertical plane A-A' is the cut plane of the vertical cross-sectional view of FIG. 21A.

Referring to FIGS. 21A and 21B, a connection-level dielectric layer 90 can be formed above the contact-level dielectric layer 80. Connection via cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 22:
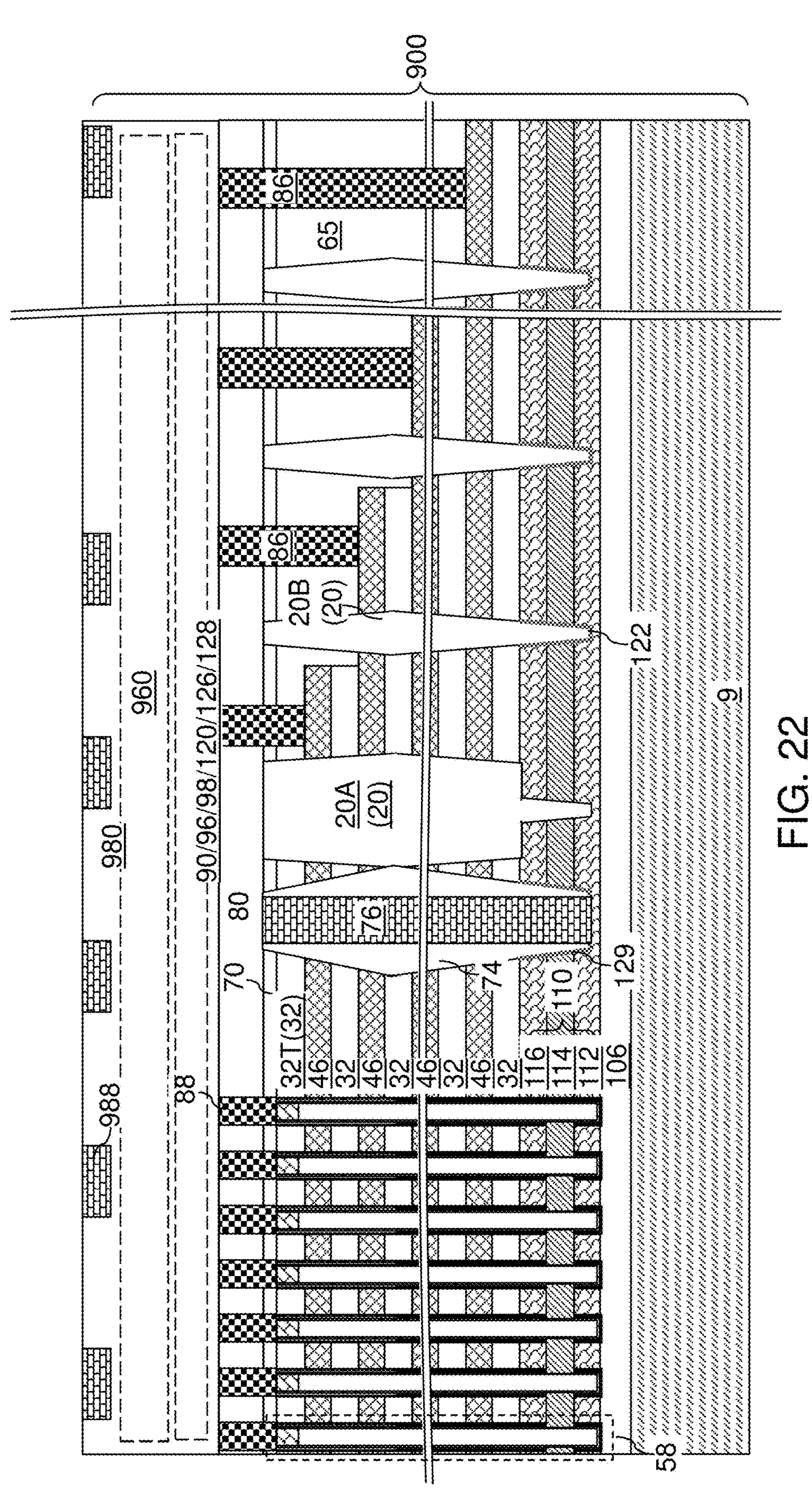
FIG. 22 is a vertical cross-sectional view of the first exemplary structure after formation of a memory die according to the first embodiment of the present disclosure.

Referring to FIG. 22, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

In summary, a memory die 900 is provided, which comprises a memory array, memory-side metal interconnect structures 980, and memory-side bonding pads 988 embedded within memory-side dielectric material layers 960. The memory die 900 comprises a memory device, which may comprise a three-dimensional memory array including an alternating stack of insulating layers 32 and electrically conductive layers 46, and further comprises a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 23:
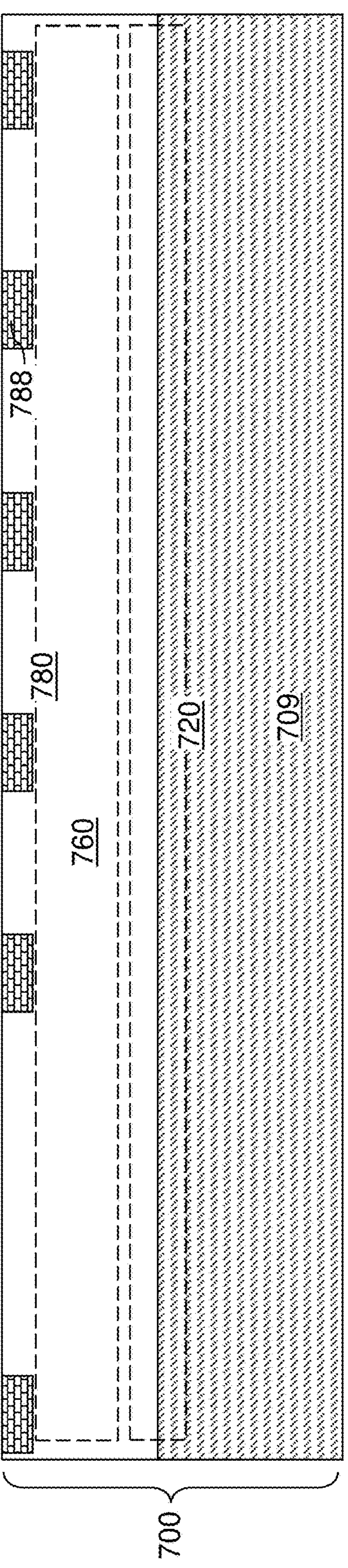
FIG. 23 is a vertical cross-sectional view of a logic die according to the first embodiment of the present disclosure.

Referring to FIG. 23, a logic die 700 is provided. The logic die 700 comprises a peripheral circuit 720 that is formed on a logic-side substrate 709. According to an aspect of the present disclosure, the peripheral circuit 720 can be configured to control operation of the memory array within the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 24:
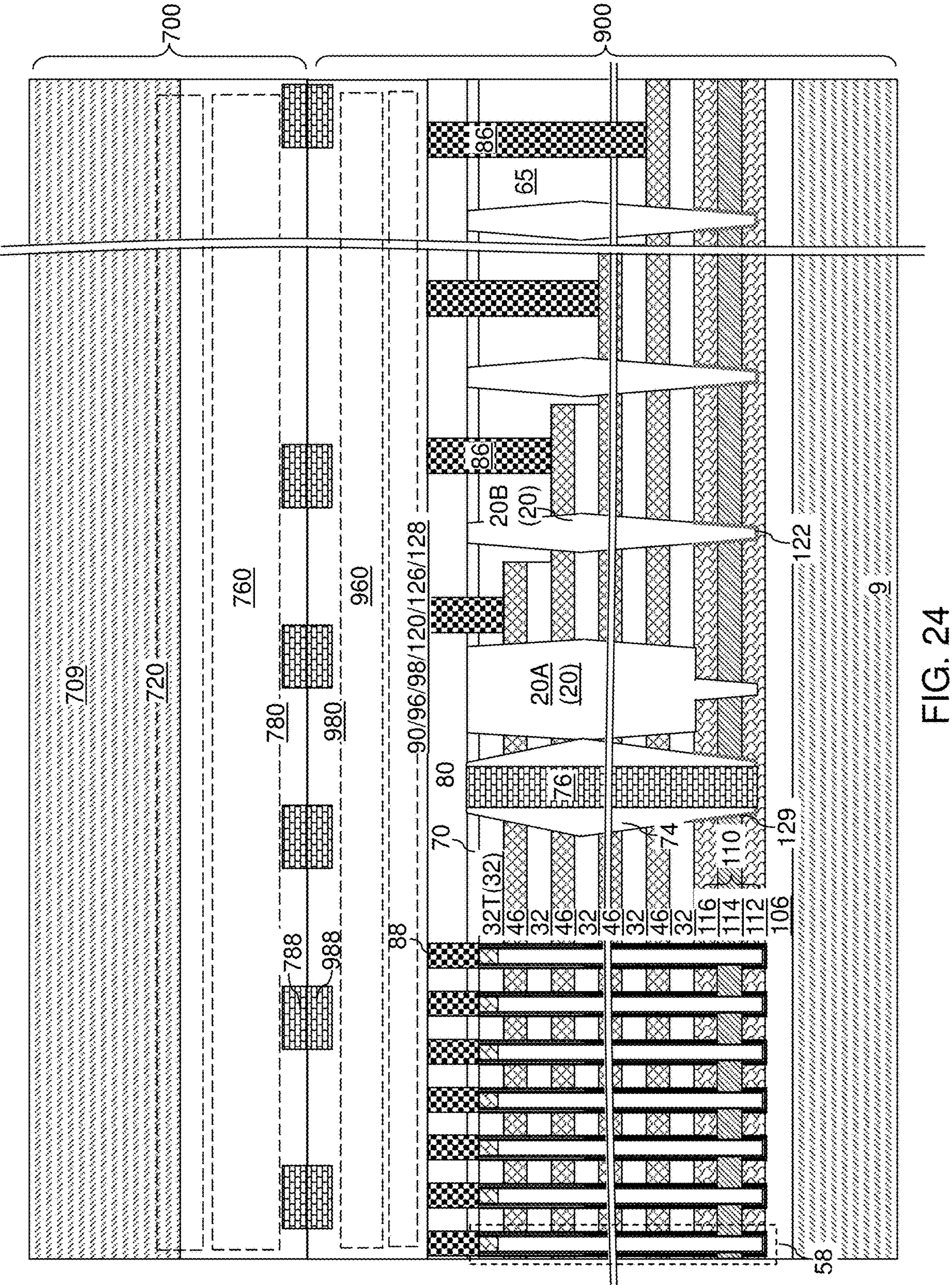
FIG. 24 is a vertical cross-sectional view of the first exemplary structure after formation of a bonded assembly of the memory die and the logic die according to the first embodiment of the present disclosure.

Referring to FIG. 24, a bonded assembly can be formed by bonding a logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 25:
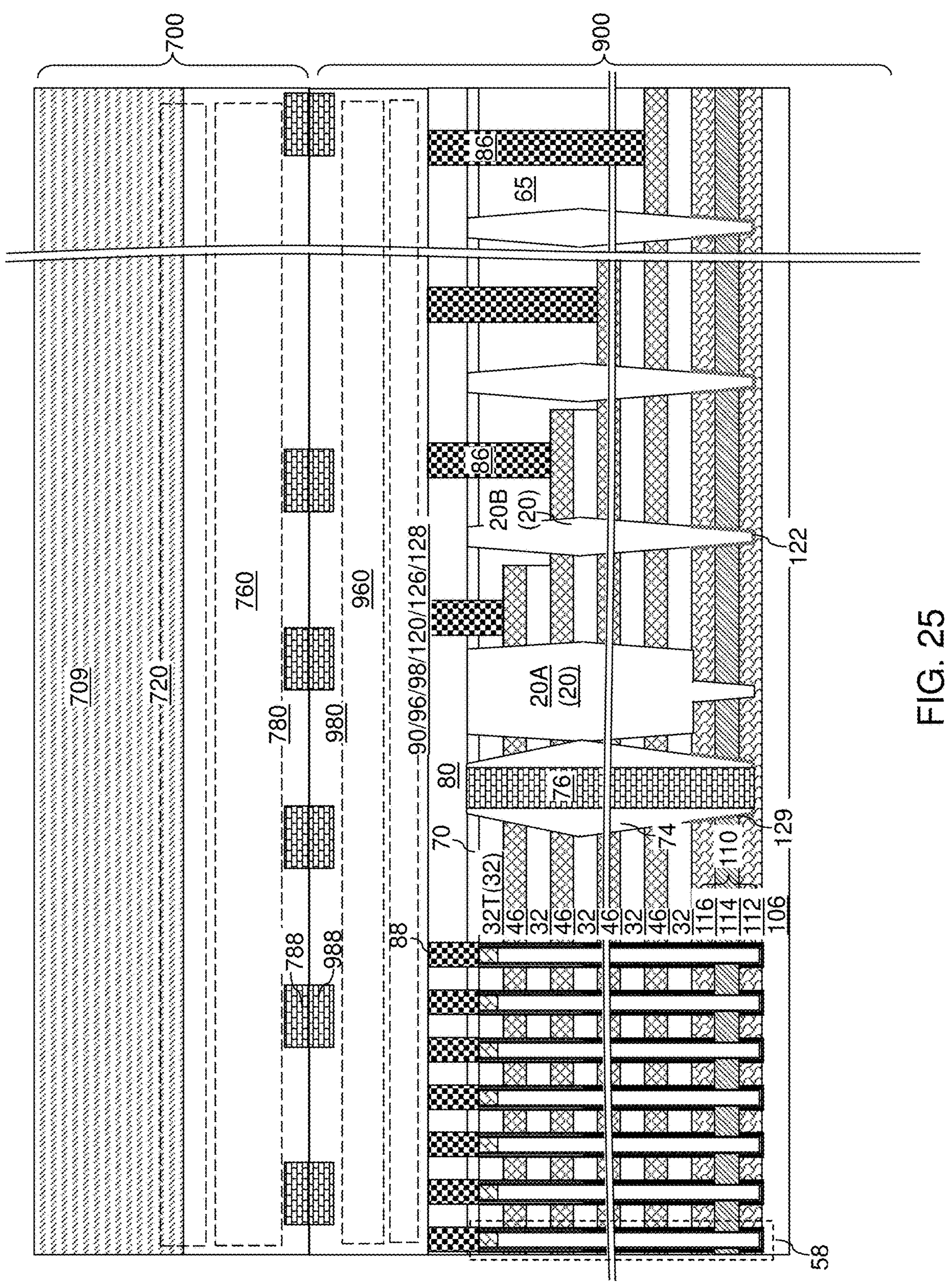
FIG. 25 is a vertical cross-sectional view of the first exemplary structure after removal of a carrier substrate from the memory die according to the first embodiment of the present disclosure.

Referring to FIG. 25, the carrier substrate 9 can be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer.

Figure 26:
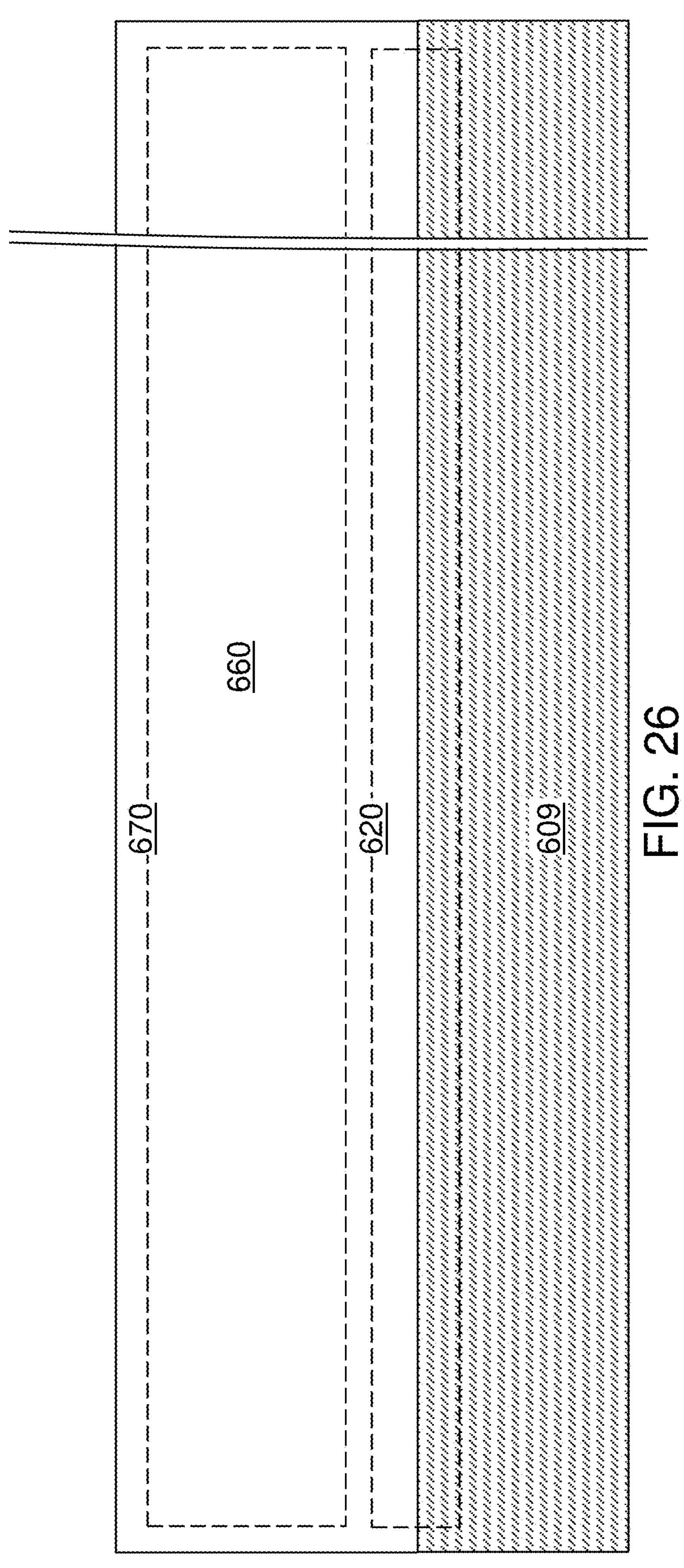
FIG. 26 is a vertical cross-sectional view of an alternative configuration of the first exemplary structure after formation a peripheral circuit according to the first embodiment of the present disclosure.

Referring to FIG. 26, an alternative configuration of the first exemplary structure is illustrated. The alternative configuration of the first exemplary structure can be provided by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620. In other words, the combination of the semiconductor substrate 609, the semiconductor devices 620, the dielectric material layers 660, and the metal interconnect structures 680 can be employed in lieu of the carrier substrate 9.

Figure 27:
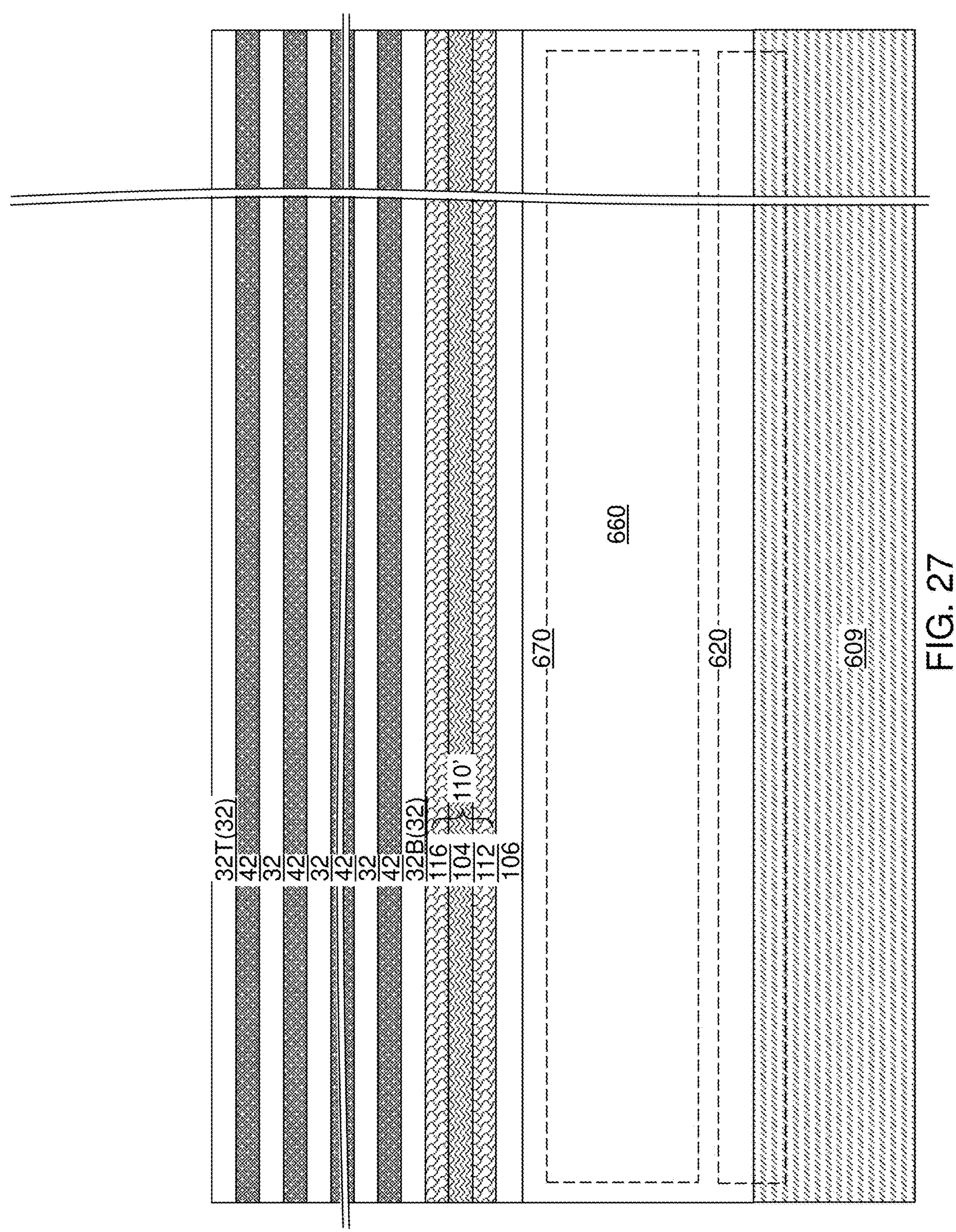
FIG. 27 is a vertical cross-sectional view of an alternative configuration of the first exemplary structure after formation of an alternating stack of insulating layers and sacrificial material layers according to the first embodiment of the present disclosure.

Referring to FIG. 27, the processing steps described with reference to FIG. 1 can be performed to form the optional in-process source-level material layers 110' and the alternating stack (32, 42).

Figure 28:
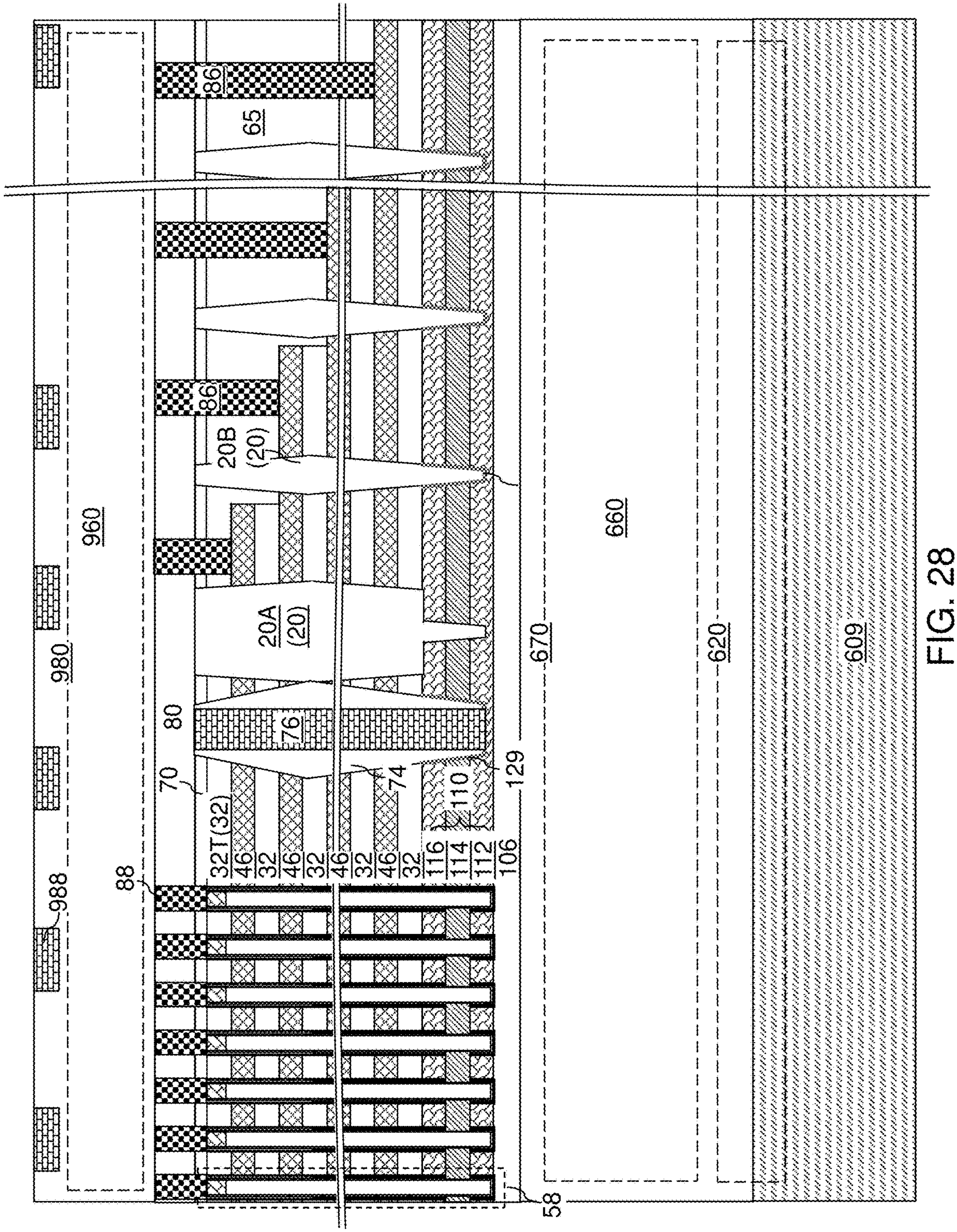
FIG. 28 is a vertical cross-sectional view of the alternative configuration of the first exemplary structure after formation of memory-side metal interconnect structures and memory-side bonding pads according to the first embodiment of the present disclosure.

Referring to FIG. 28, the processing steps described with reference to FIGS. 2-22 can be performed to provide a memory die, which may, or may not, be bonded to a logic die 700. In case the memory die of FIG. 28 is bonded to a logic die 700, the semiconductor devices 620 may comprise a first subset of a peripheral circuit for controlling operation of a three-dimensional memory device, and the logic die 700 may comprise a second subset of the peripheral circuit for controlling operation of a three-dimensional memory device.

Figure 29A:
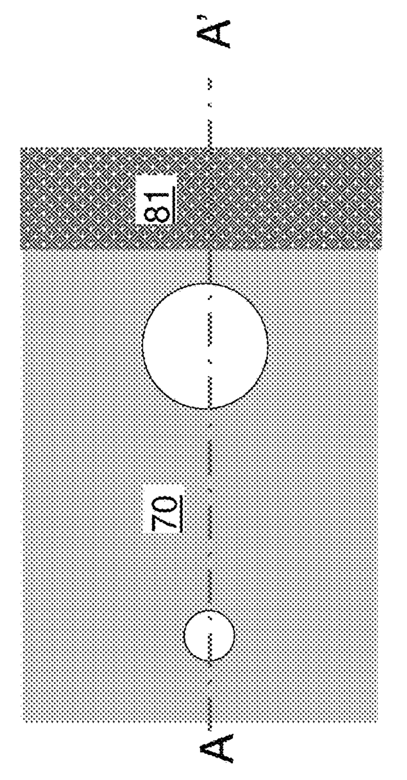
FIG. 29A is a top-down view of a region of a second exemplary structure after additional patterning of the hard mask layer according to a second embodiment of the present disclosure.
Figure 29B:
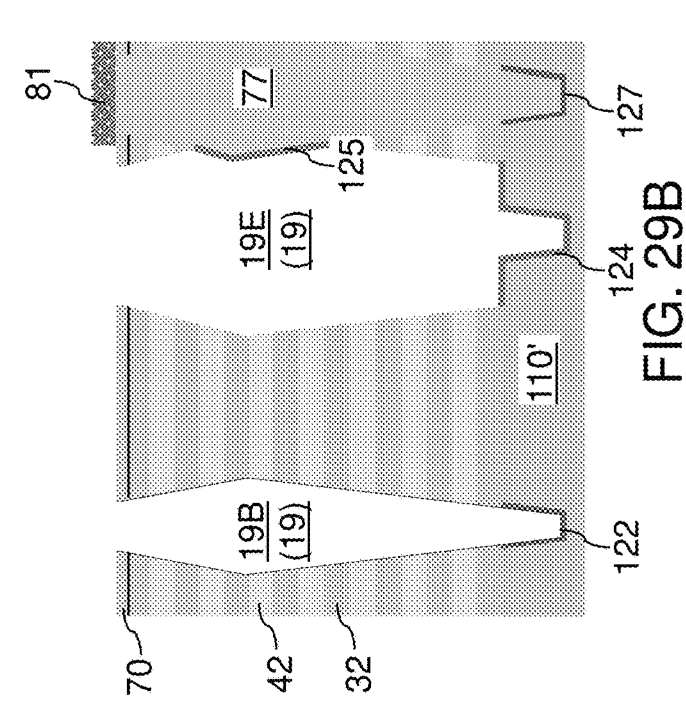
FIG. 29B is a vertical cross-sectional view along the vertical plane A-A' of FIG. 29A.

Referring to FIGS. 29A and 29B, a second exemplary structure may be derived from the first exemplary structure of the first embodiment or any of the alternative embodiments thereof. For example, the second exemplary structure illustrated in FIGS. 29A and 29B may be the same as the first exemplary structure illustrated in FIGS. 12A and 12B, or alternative embodiment thereof at a corresponding processing step.

Figure 30A:
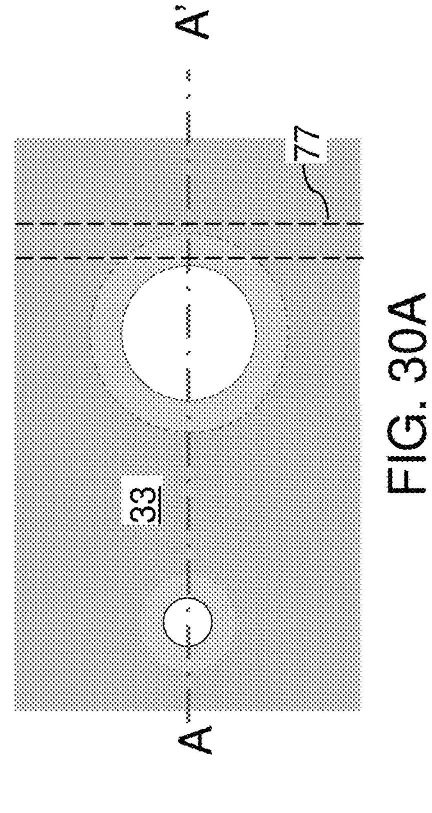
FIG. 30A is a top-down view of a region of the second exemplary structure after deposition of a conformal cover material layer and a non-conformal etch mask layer according to the second embodiment of the present disclosure.
Figure 30B:
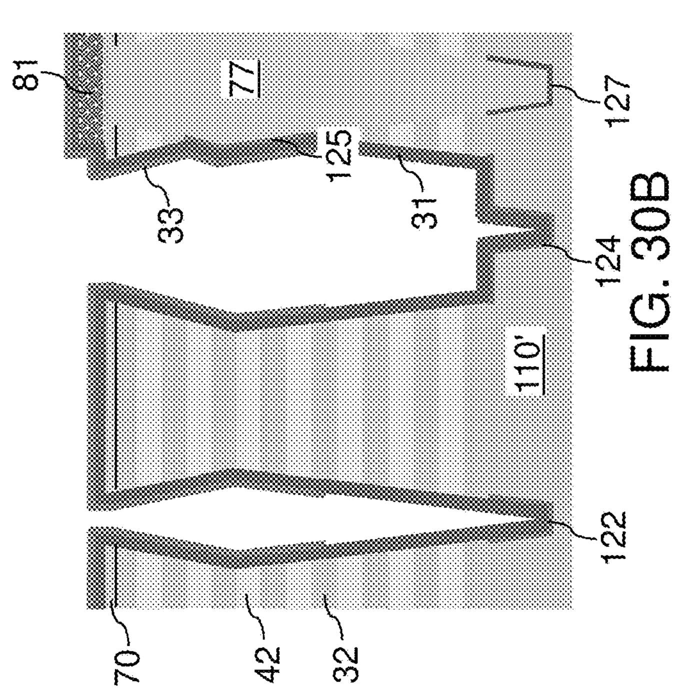
FIG. 30B is a vertical cross-sectional view along the vertical plane A-A' of FIG. 30A.

Referring to FIGS. 30A and 30B, a conformal cover material layer 31 can be conformally deposited on physically exposed surfaces around the support openings 19 and over the insulating cap layer 70 and the hard mask layer 81. The conformal cover material layer 31 comprises a material that can be subsequently removed selective to the materials of the alternating stack (32, 42). For example, the conformal cover material layer 31 may comprise amorphous silicon, and may have a thickness in a range from 5 nm to 50 nm, although lesser and greater thicknesses may also be employed.

A non-conformal etch mask layer 33 can be anisotropically deposited over the conformal cover material layer 31. The non-conformal etch mask layer 33 comprises a material that is different from the material of the conformal cover material layer 31. In an illustrative example, the non-conformal etch mask layer 33 may comprise silicon oxide, silicon nitride, or a dielectric metal oxide. The non-conformal etch mask layer 33 may be deposited by a non-conformal chemical vapor deposition process, a non-conformal atomic layer deposition process, or a physical vapor deposition process. In one embodiment, the non-conformal etch mask layer 33 may be deposited by a coverage control atomic layer deposition (CCALD) process that controls the depth profile of a deposited film. In an illustrative example, the non-conformal etch mask layer 33 may comprise a silicon oxide material deposited by CCALD. In summary, the non-conformal etch mask layer 33 can be anisotropically deposited such that the non-conformal etch mask layer 33 covers the conformal cover material layer 31 in an upper portion of a sidewall of each support opening 19 without covering the conformal cover material layer 31 in a lower portion of the sidewall of each support opening 19.

Figure 31A:
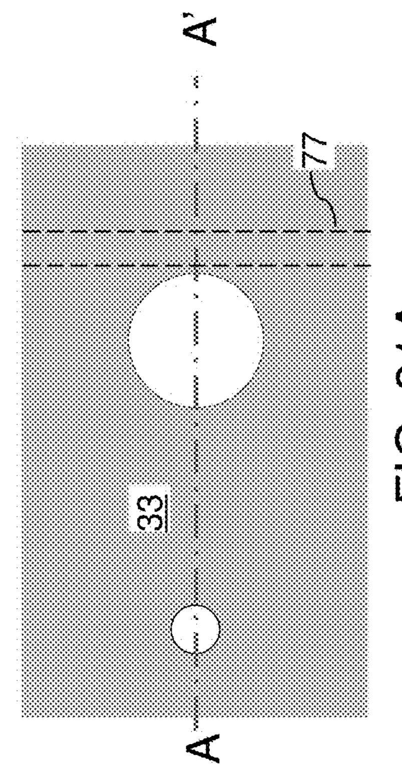
FIG. 31A is a top-down view of a region of the second exemplary structure after removal of unmasked portions of the conformal cover material layer according to the second embodiment of the present disclosure.
Figure 31B:
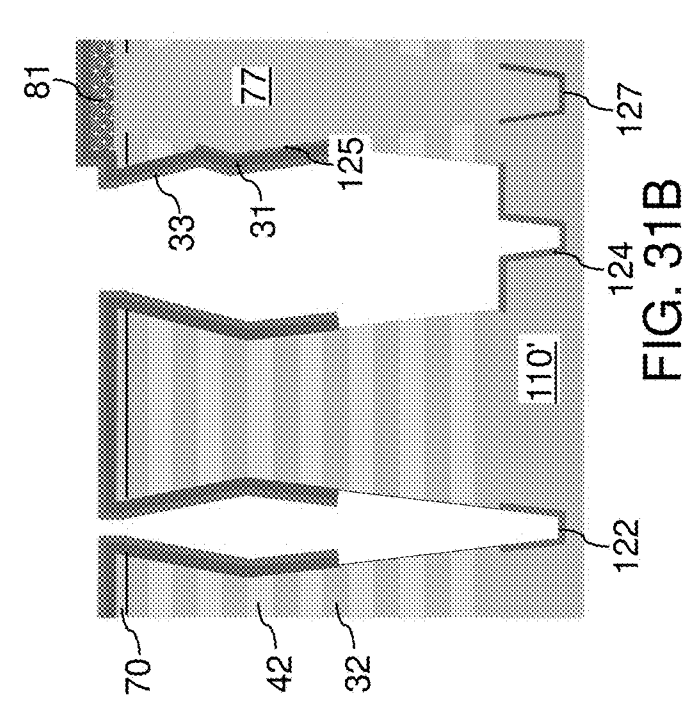
FIG. 31B is a vertical cross-sectional view along the vertical plane A-A' of FIG. 31A.

Referring to FIGS. 31A and 31B, a selective isotropic etch process can be performed to remove unmasked portions of the conformal cover material layer 31 selective to materials of the non-conformal etch mask layer 33 and the alternating stack (32, 42). For example, if the conformal cover material layer 31 comprises amorphous silicon, a wet etch process using hot trimethyl-2 hydroxyethyl ammonium hydroxide ("hot TMY") or tetramethyl ammonium hydroxide (TMAH) may be performed to remove the unmasked portions of the conformal cover material layer 31.

Figure 32A:
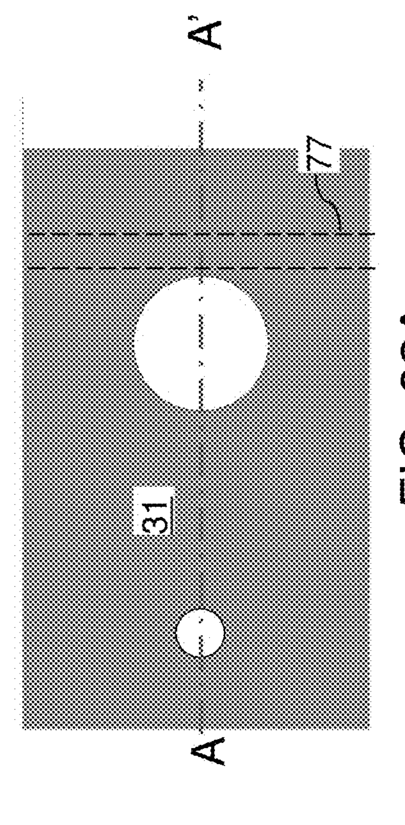
FIG. 32A is a top-down view of a region of the second exemplary structure after removal of the non-conformal etch mask layer according to the second embodiment of the present disclosure.
Figure 32B:
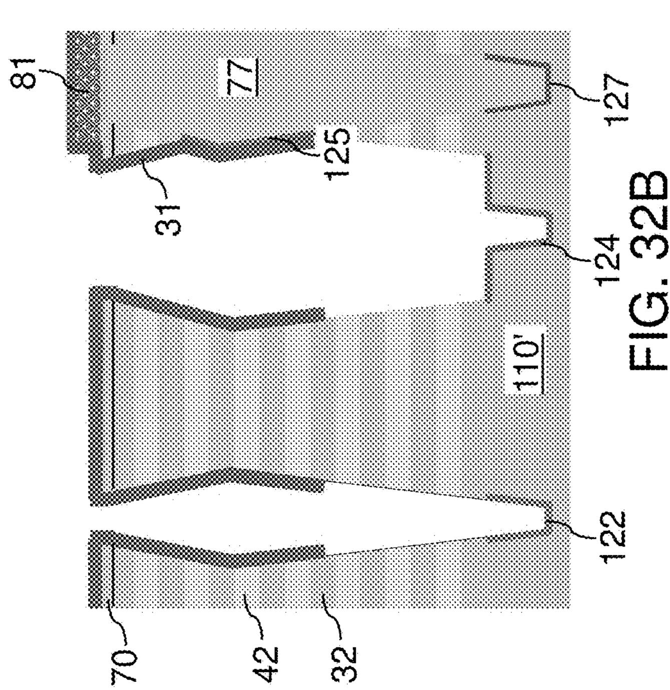
FIG. 32B is a vertical cross-sectional view along the vertical plane A-A' of FIG. 32A.

Referring to FIGS. 32A and 32B, the non-conformal etch mask layer 33 may be selectively removed, for example, by performing an isotropic etch process, such as a wet etch process. If the non-conformal etch mask layer 33 comprises silicon oxide, a wet etch process employing dilute hydrofluoric acid may be performed to remove the non-conformal etch mask layer 33. The dielectric liners 122 and 124 may be thinned but not completely removed during the isotropic etch process.

Figure 33A:
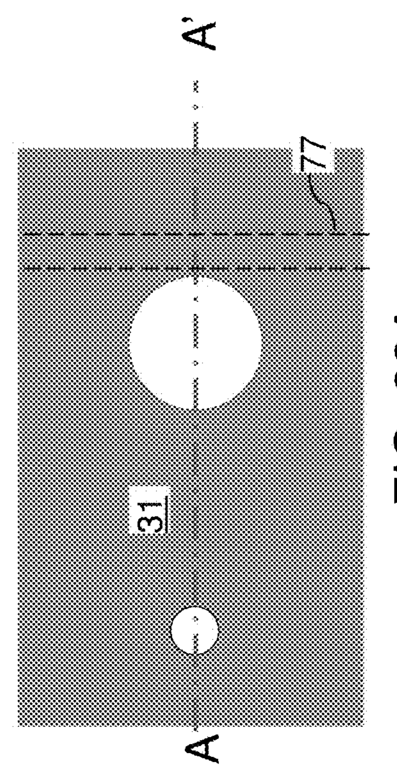
FIG. 33A is a top-down view of a region of the second exemplary structure after formation of annular fin cavities according to the second embodiment of the present disclosure.
Figure 33B:
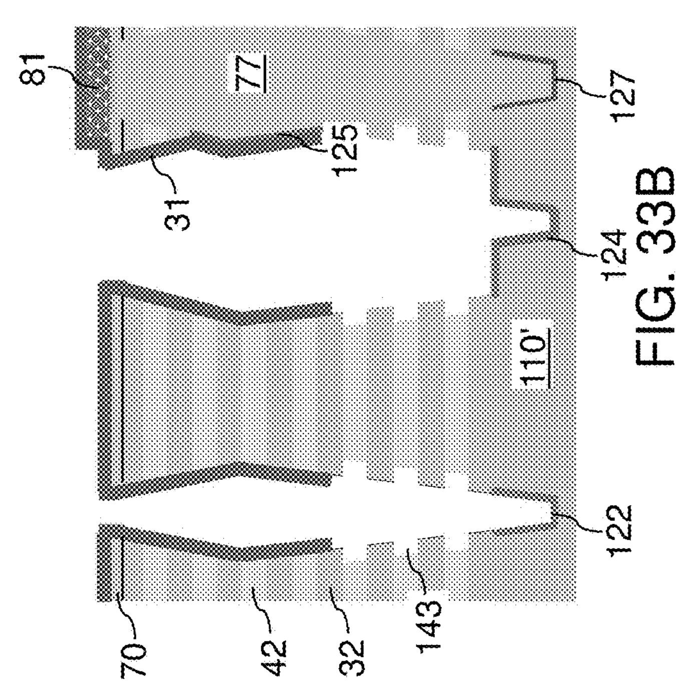
FIG. 33B is a vertical cross-sectional view along the vertical plane A-A' of FIG. 33A.

Referring to FIGS. 33A and 33B, an isotropic etch process that etches the material of the sacrificial material layer 42 selective to the material of the insulating layers 32 and the conformal cover material layer 31 can be performed to laterally recess physically exposed surfaces of the sacrificial material layers 42. For example, if the sacrificial material layers 42 comprise silicon nitride, a timed wet etch process employing hot phosphoric acid may be performed to laterally recess the sacrificial material layers 42 around each support opening 19. Annular fin cavities 143 can be formed in volumes from which the material of the sacrificial material layers 42 is removed. The lateral recess distance of the isotropic etch process may be in a range from 10 nm to 120 nm, such as from 20 nm to 80 nm, although lesser and greater lateral etch distances may also be employed. In summary, the annular fin cavities 143 may be formed around the laterally-expanded first support openings 19E and around the second support openings 19B by etching portions of the sacrificial material layers 42 that are proximal to the laterally-expanded first support openings 19E or to the second support openings 19B selective to the insulating layers 32, the support opening dielectric liners 122, and the first dielectric liners 124.

Figure 34A:
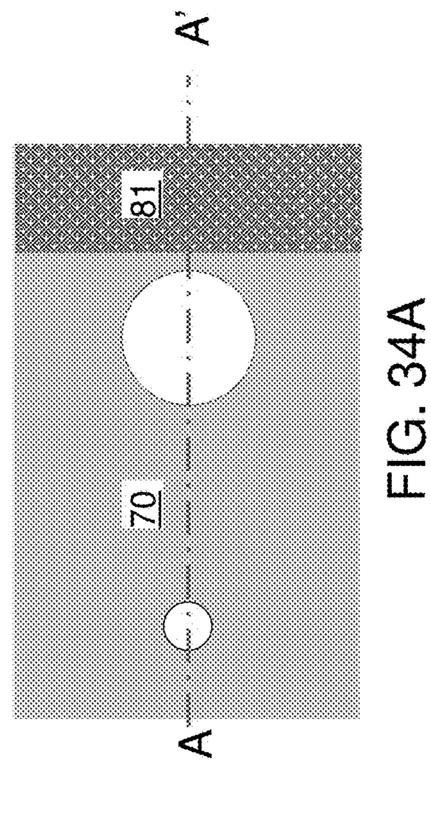
FIG. 34A is a top-down view of a region of the second exemplary structure after removal of the conformal cover material layer according to the second embodiment of the present disclosure.
Figure 34B:
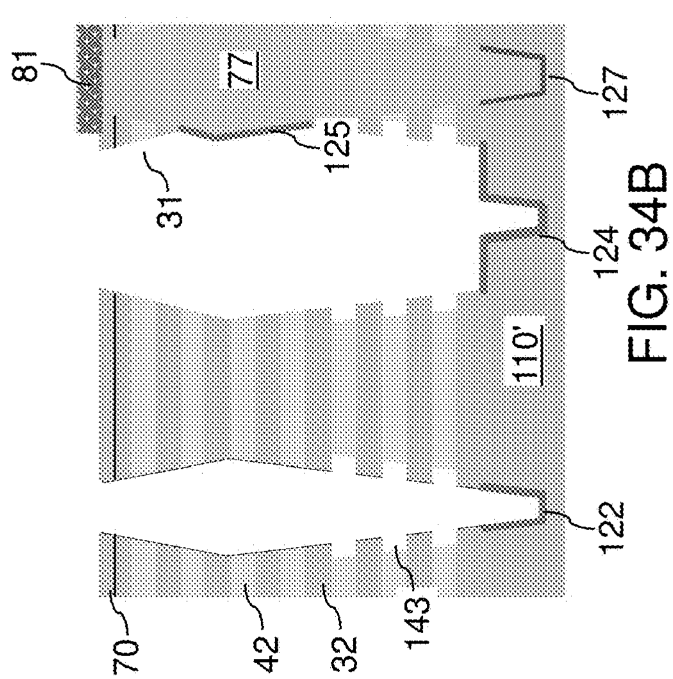
FIG. 34B is a vertical cross-sectional view along the vertical plane A-A' of FIG. 34A.

Referring to FIGS. 34A and 34B, the conformal cover material layer 31 can be removed selective to the materials of the alternating stack (32, 42). For example, if the conformal cover material layer 31 comprises amorphous silicon, a wet etch process employing TMAH or TMY can be performed to remove the conformal cover material layer 31.

Figure 35A:
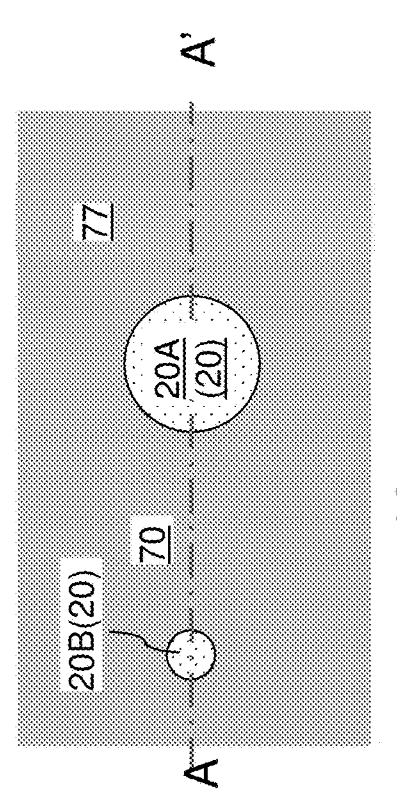
FIG. 35A is a top-down view of a region of the second exemplary structure after formation of dielectric support pillar structures according to the second embodiment of the present disclosure.
Figure 35B:
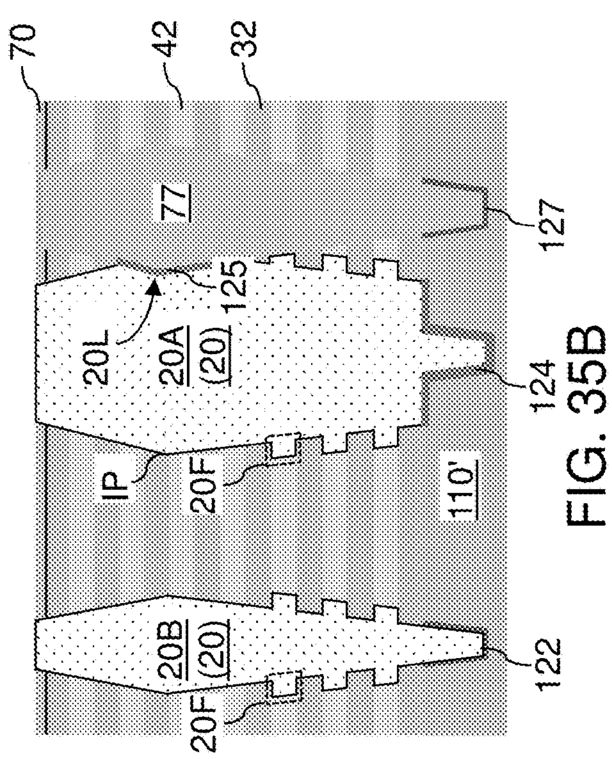
FIG. 35B is a vertical cross-sectional view along the vertical plane A-A' of FIG. 35A.

Referring to FIGS. 35A and 35B, the processing steps described with reference to FIGS. 13A and 13B can be performed to form first dielectric support pillar structures 20A and the second dielectric support pillar structures 20B. In one embodiment, at least one of the first dielectric support pillar structures 20A comprises a respective plurality of laterally-extending dielectric fins 20F. In one embodiment, at least one of the second dielectric support pillar structures 20B comprises a respective plurality of laterally-extending dielectric fins 20F. At least one of the first dielectric support pillar structures 20A comprises a respective first continuously-extending sidewall which comprises surface segments of a respective plurality of laterally-extending dielectric fins 20F.

The laterally-extending dielectric fins 20F are formed only in lower portions of the alternating stack (32, 42), and are not present in upper portions of the alternating stack (32, 42) which were masked by the conformal cover material layer 31. The maximum vertical distance between the uppermost one of the plurality of laterally-extending dielectric fins 20F and a horizontal plane including a bottommost surface of the alternating stack (32, 42) may be less than 80%, and/or less than 60%, and/or less than 40%, of the total thickness of the alternating stack (32, 42).

In one embodiment, a vertical cross-sectional profile of at least one of the first dielectric support pillar structures 20A may comprise a respective inflection point IP at which a tapered surface segment of the first continuously-extending sidewall is adjoined to a reverse-tapered surface segment of the first continuously-extending sidewall. In one embodiment, all of the plurality of laterally-extending dielectric fins 20F may be located underneath a horizontal plane including the inflection point IP. In one embodiment, the bottommost one of the plurality of laterally-extending dielectric fins 20F may be located at a level of the bottommost sacrificial material layer 42 within the alternating stack (32, 42).

In one embodiment, the first dielectric support pillar structures 20A may comprise a respective lateral indentation 20L that is contacted by a respective vertically-extending dielectric liner 125. Each lateral indentation 20L may have a vertical extent that is less than a total vertical extent of the alternating stack (32, 42).

Figure 36A:
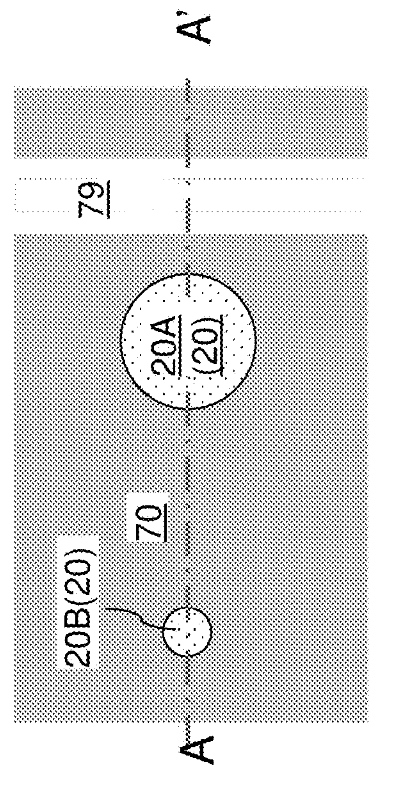
FIG. 36A is a top-down view of a region of the second exemplary structure after removal of the sacrificial isolation trench fill structures according to the second embodiment of the present disclosure.
Figure 36B:
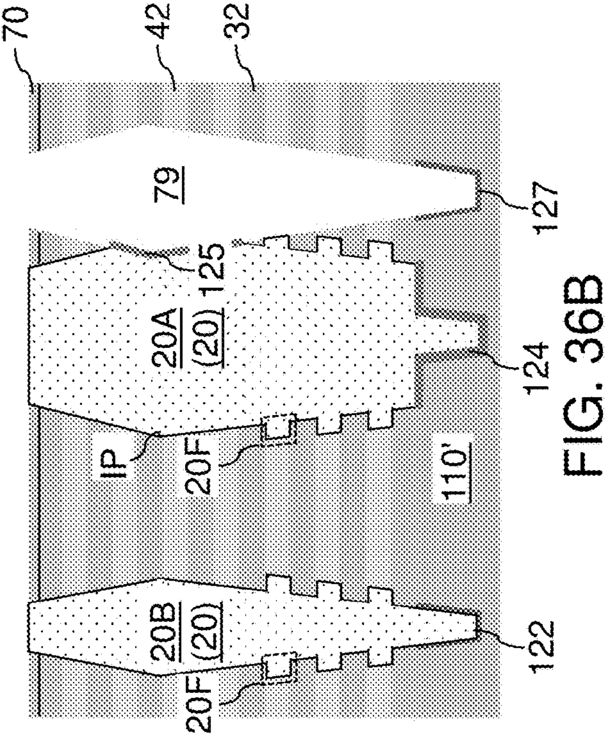
FIG. 36B is a vertical cross-sectional view along the vertical plane A-A' of FIG. 36A.

Referring to FIGS. 36A and 36B, the selective isotropic etch process described with reference to FIGS. 14A and 14B can be performed to remove the sacrificial isolation trench fill structures 77 selective to the materials of the alternating stacks (32, 42), the insulating cap layer 70, the dielectric support pillar structures (20A, 20B), and the trench bottom dielectric liners 127.

Figure 37A:
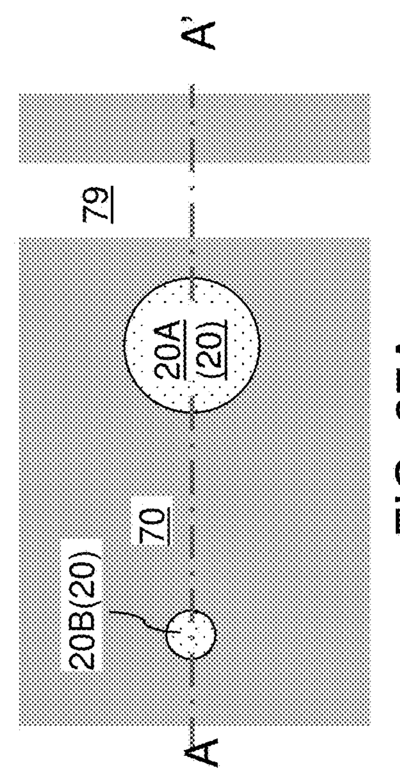
FIG. 37A is a top-down view of a region of the second exemplary structure after replacement of the in-process source-level material layers with source-level material layers and formation of lateral recesses according to the second embodiment of the present disclosure.
Figure 37B:
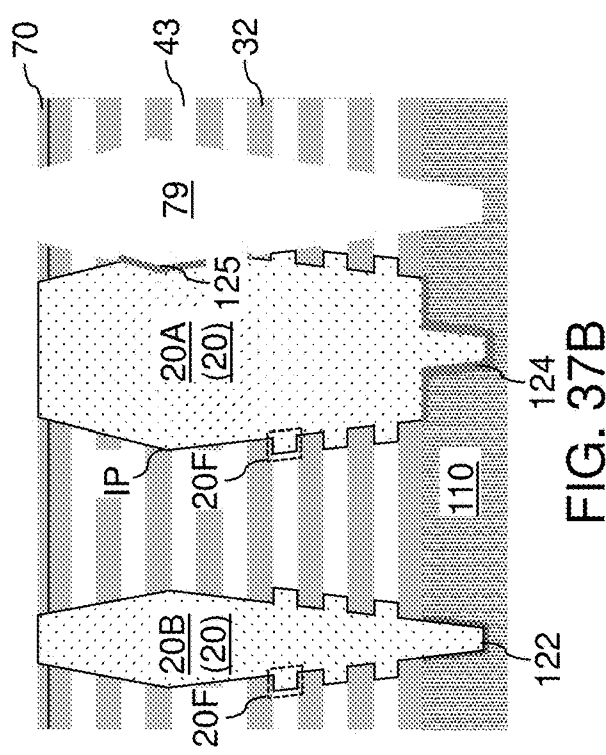
FIG. 37B is a vertical cross-sectional view along the vertical plane A-A' of FIG. 37A.

Referring to FIGS. 37A and 37B, the processing steps described with reference to FIG. 15, can be performed to form the optional source cavity 109. The processing steps described with reference to FIGS. 16A-16D can be performed to form the optional source contact layer 114. The processing steps described with reference to FIGS. 17A-17D can be performed to form laterally-extending cavities 43.

Figure 19:
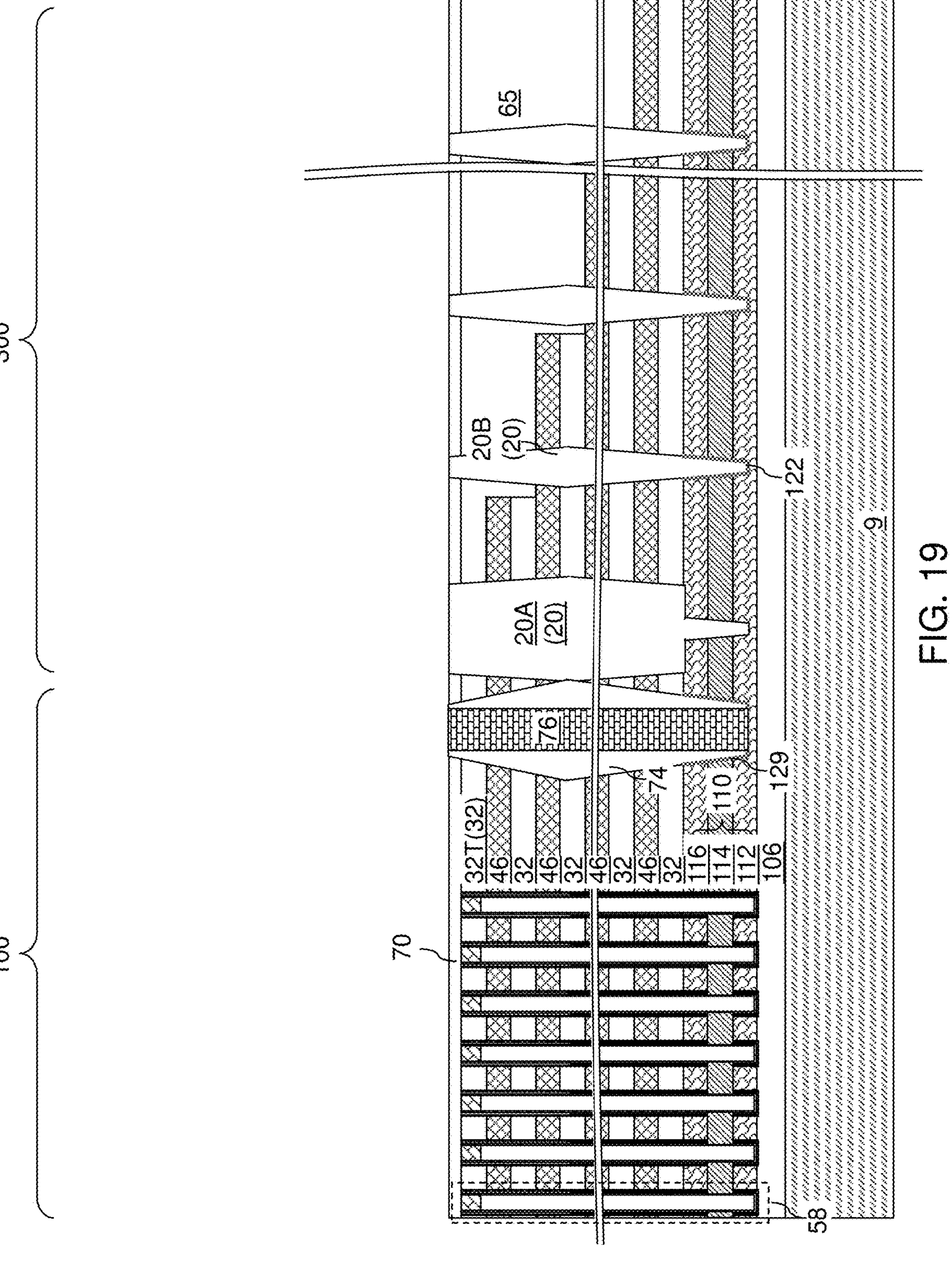
FIG. 19 is a vertical cross-sectional view of the first exemplary structure after formation of isolation trench fill structures according to the first embodiment of the present disclosure.
Figure 38A:
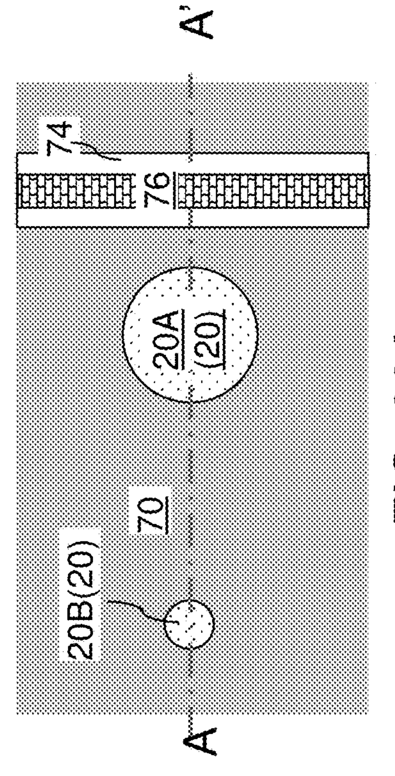
FIG. 38A is a top-down view of a region of the second exemplary structure after formation of electrically conductive layers and isolation trench fill structures according to the second embodiment of the present disclosure.
Figure 38B:
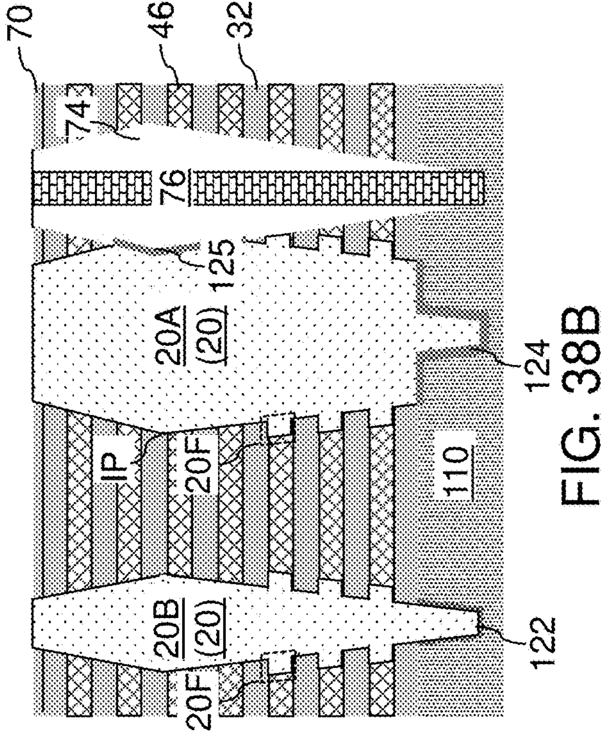
FIG. 38B is a vertical cross-sectional view along the vertical plane A-A' of FIG. 38A.

Referring to FIGS. 38A and 38B, the processing steps described with reference to FIGS. 18 and 19 can be performed to form electrically conductive layers 46 and the isolation trench fill structures (74, 76). Subsequently, the processing steps described with reference to FIGS. 20A-25 or 26-28 may be performed.

Figure 39A:
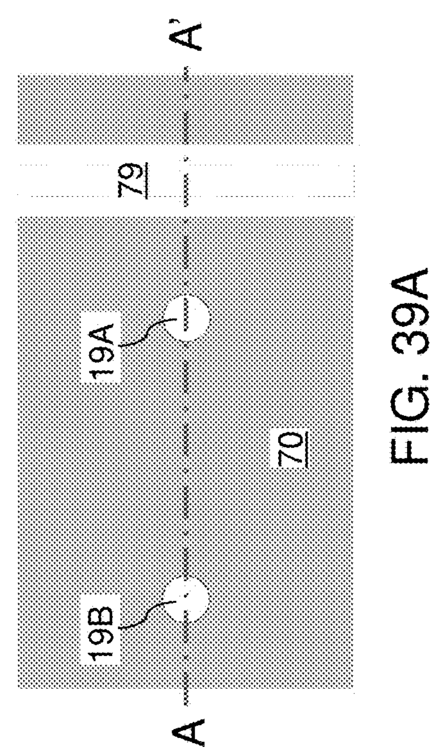
FIG. 39A is a top-down view of a region of a third exemplary structure after formation of support openings and lateral isolation trenches according to a third embodiment of the present disclosure.
Figure 39B:
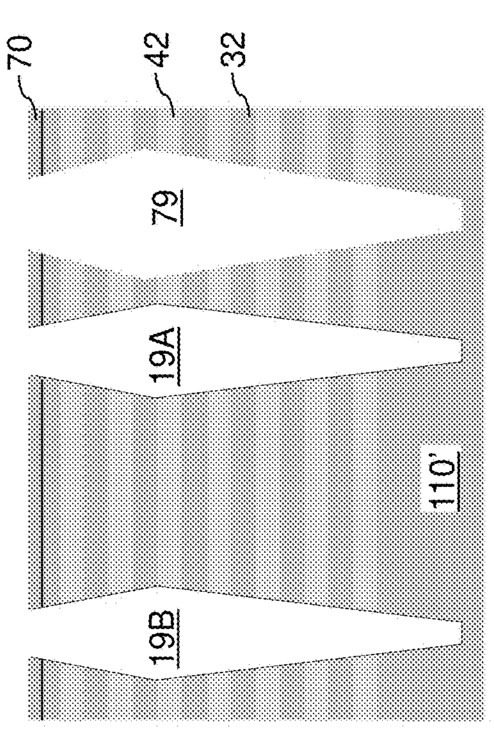
FIG. 39B is a vertical cross-sectional view along the vertical plane A-A' of FIG. 39A.

Referring to FIGS. 39A and 39B, a third exemplary structure according to a third embodiment of the present disclosure is shown, which may be the same as the first exemplary structure illustrated in FIGS. 6A-6D.

Figure 40A:
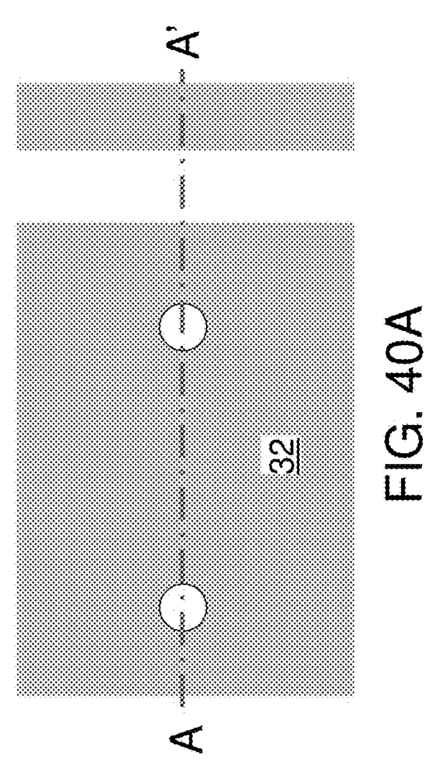
FIG. 40A is a top-down view of a region of a third exemplary structure after deposition of a conformal cover material layer and an optional conformal dielectric liner according to a third embodiment of the present disclosure.
Figure 40B:
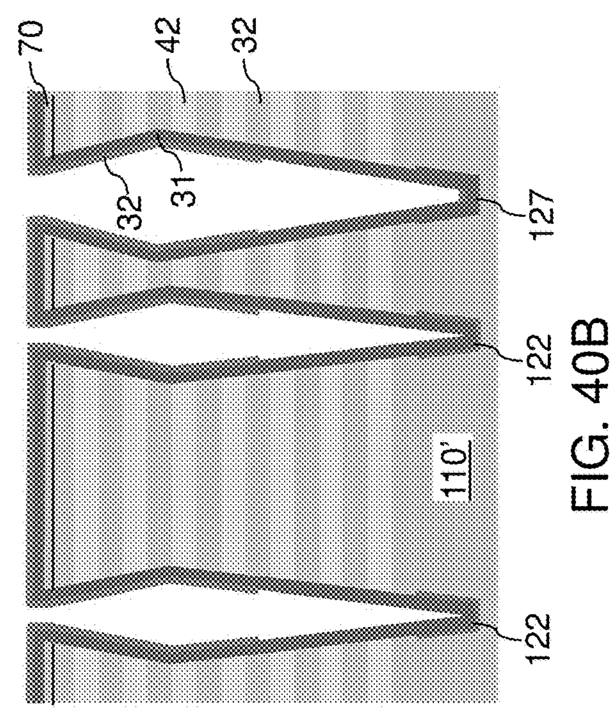
FIG. 40B is a vertical cross-sectional view along the vertical plane A-A' of FIG. 40A.

Referring to FIGS. 40A and 40B, the processing steps described with reference to FIGS. 30A and 30B can be performed. A conformal cover material layer 31 can be conformally deposited on physically exposed surfaces around the support openings 19 and the lateral isolation trenches 79. A non-conformal etch mask layer 33 can be subsequently non-conformally deposited over the conformal cover material layer 31.

Figure 41A:
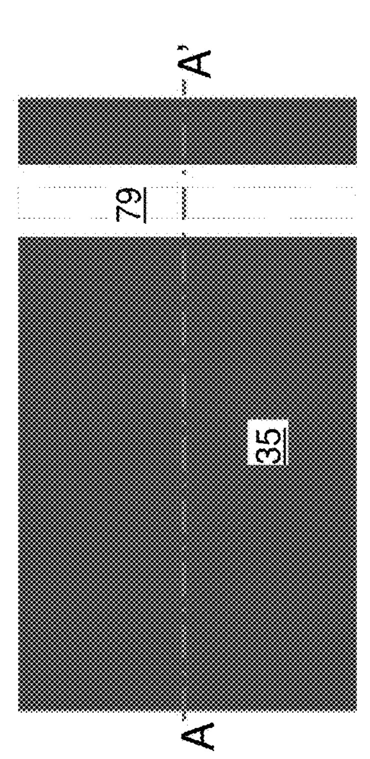
FIG. 41A is a top-down view of a region of the third exemplary structure after formation of a patterned photoresist layer according to the third embodiment of the present disclosure.
Figure 41B:
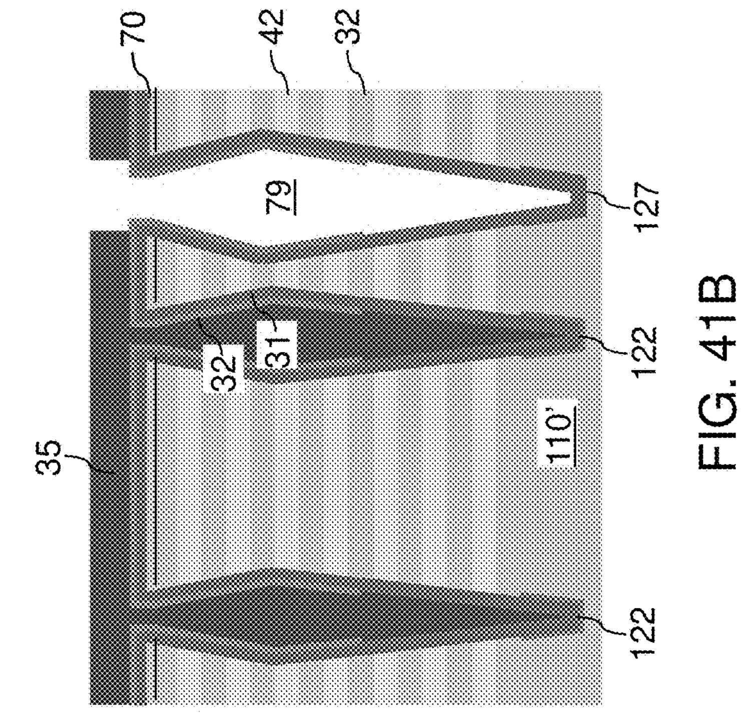
FIG. 41B is a vertical cross-sectional view along the vertical plane A-A' of FIG. 41A.

Referring to FIGS. 41A and 41B, a photoresist layer 35 can be applied over the third exemplary structure, and can be lithographically patterned to form elongated openings in areas of the lateral isolation trenches 79. The photoresist layer 35 may comprise a negative photoresist layer which fills the support openings 19 but not the lateral isolation trenches 79.

Figure 42A:
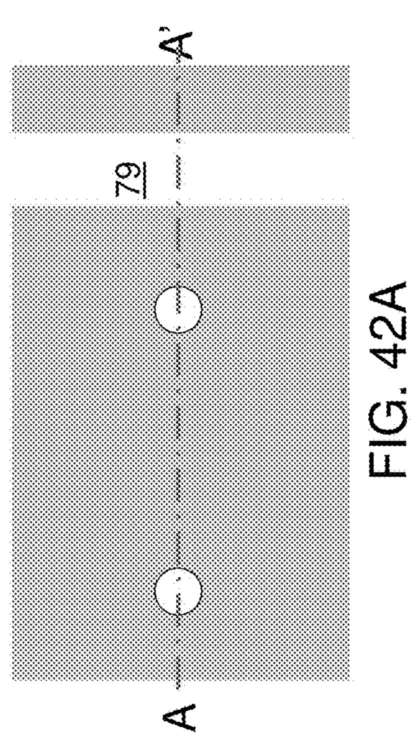
FIG. 42A is a top-down view of a region of the third exemplary structure after removal of unmasked portions of the conformal cover material layer and removal of the patterned photoresist layer according to the third embodiment of the present disclosure.
Figure 42B:
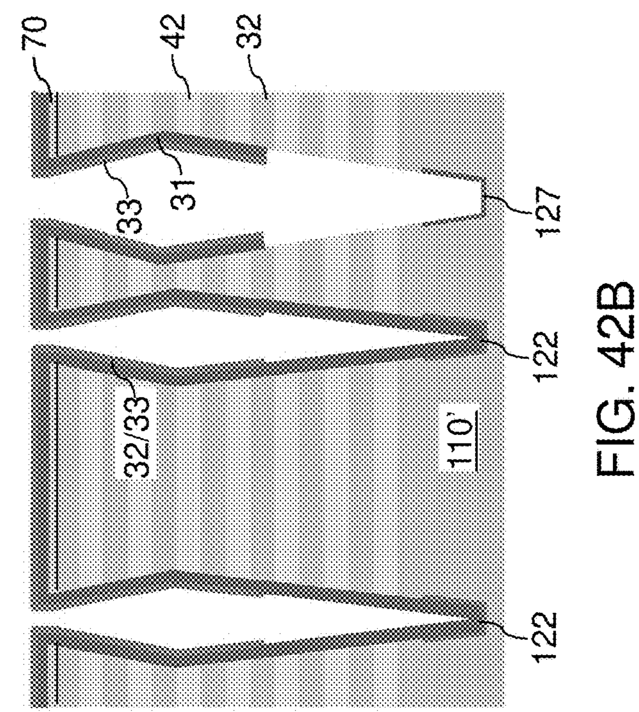
FIG. 42B is a vertical cross-sectional view along the vertical plane A-A' of FIG. 42A.

Referring to FIGS. 42A and 42B, the processing steps described with reference to FIGS. 31A and 31B can be performed. The isotropic etch process can remove unmasked portions of the conformal cover material layer 31 selective to materials of the non-conformal etch mask layer 33 and the alternating stack (32, 42). The photoresist layer 35 is then removed by ashing.

Figure 43A:
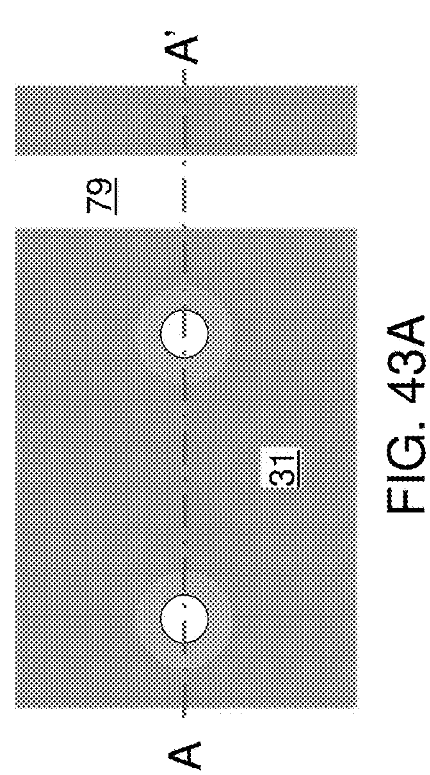
FIG. 43A is a top-down view of a region of the third exemplary structure after lateral expansion of a lower portion of each lateral isolation trench according to the third embodiment of the present disclosure.
Figure 43B:
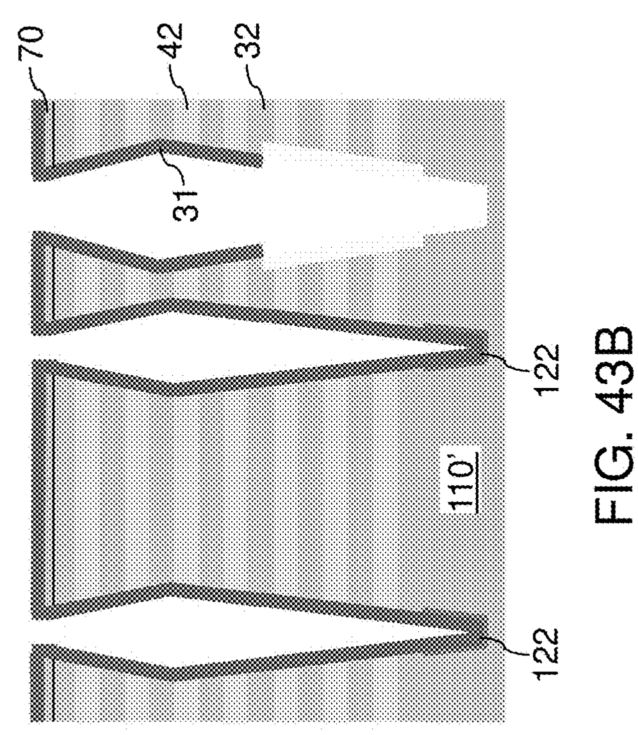
FIG. 43B is a vertical cross-sectional view along the vertical plane A-A' of FIG. 43A.

Referring to FIGS. 43A and 43B, at least one isotropic etch process can be performed to etch portions of the alternating stack (32, 42) that are physically exposed to the lateral isolation trenches 79. The upper portions of the sidewalls of the lateral isolation trenches 79 are covered with the conformal cover material layer 31, which functions as an etch mask layer. The lower portions of the sidewalls of the lateral isolation trenches 79 are physically exposed, and thus, physically exposed sidewalls of a subset of the insulating layers 32 and the sacrificial material layers 42 can be laterally recessed around the bottom portion of each lateral isolation trench 79.

Each lateral isolation trench 79 is laterally expanded only at a lower portion while the upper portion of each lateral isolation trench 79 is not expanded in volume. In one embodiment, the at least one isotropic etch process may etch the materials of the insulating layers 32 and the sacrificial material layers 42 at about the same etch rate. Alternatively, the at least one isotropic etch process may comprise a first isotropic etch process that etches the material of the insulating layers 32 and a second isotropic etch process that etches the material of the sacrificial material layers 42. The duration of each isotropic etch process may be selected such that the total lateral recess distance is in a range from 10 nm to 120 nm, such as from 20 nm to 60 nm, although lesser and greater lateral recess distances may also be employed. The non-conformal etch mask layer 33 and the bottom dielectric liner 127 may be collaterally removed during the isotropic etch process(es) that laterally recess(es) the physically exposed surfaces of the alternating stack (32, 42).

Figure 44A:
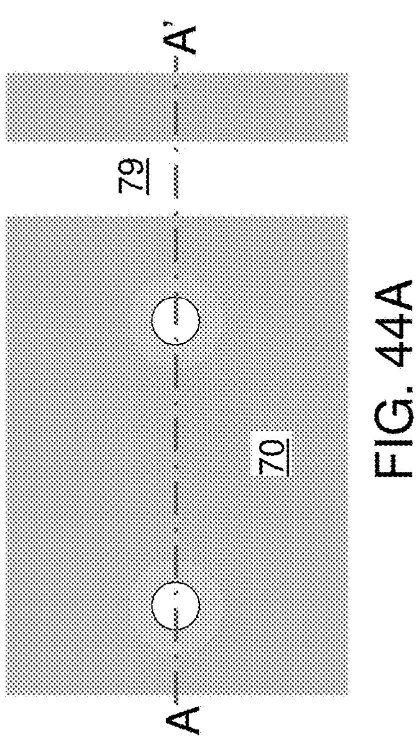
FIG. 44A is a top-down view of a region of the third exemplary structure after removal of the conformal cover material layer according to the third embodiment of the present disclosure.
Figure 44B:
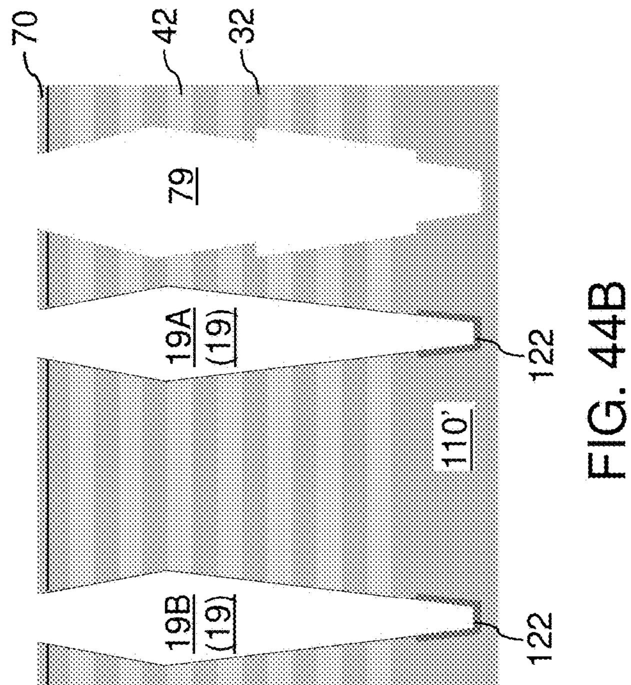
FIG. 44B is a vertical cross-sectional view along the vertical plane A-A' of FIG. 44A.

Referring to FIGS. 44A and 44B, the processing steps described with reference to FIGS. 34A and 34B can be performed to remove the conformal cover material layer 31.

Figure 45A:
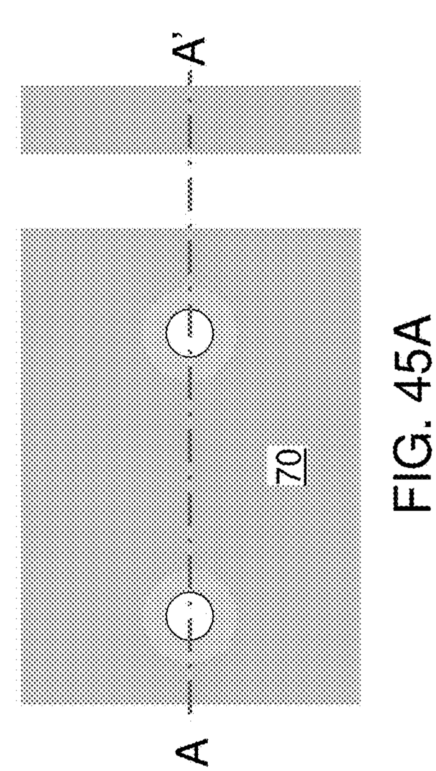
FIG. 45A is a top-down view of a region of the third exemplary structure after formation of a dielectric trench bottom dielectric liner according to the third embodiment of the present disclosure.
Figure 45B:
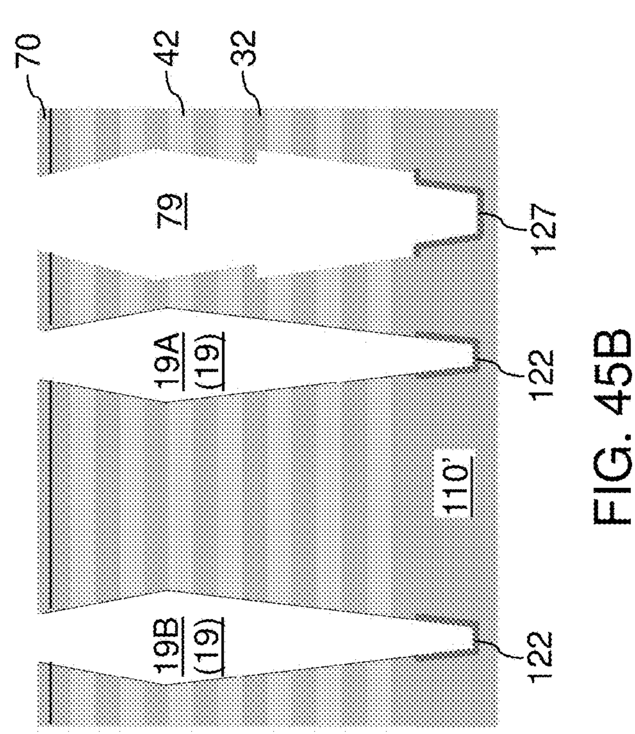
FIG. 45B is a vertical cross-sectional view along the vertical plane A-A' of FIG. 45A.

Referring to FIGS. 45A and 45B, a dielectric conversion process can be performed to covert physically exposed surface portions of the in-process source-level material layers 110' or the semiconductor substrate 9 that underlies the lateral isolation trenches 79 into trench bottom dielectric liners 127. Specifically, a WVG oxidation process may be used to reform a silicon oxide bottom dielectric liner 127 at the bottom of each lateral isolation trench 79.

Figure 46A:
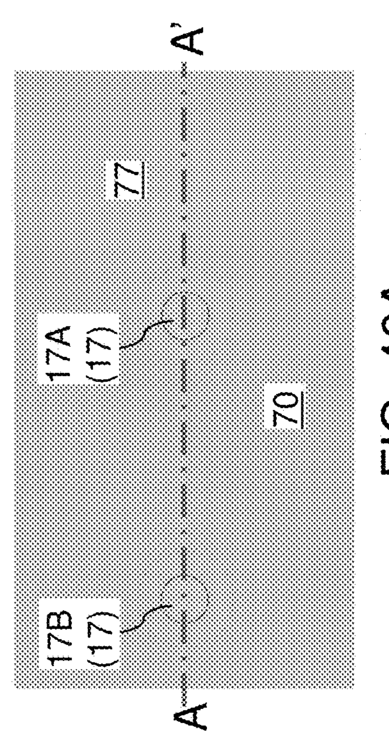
FIG. 46A is a top-down view of a region of the third exemplary structure after formation of sacrificial support opening fill structures and sacrificial isolation trench fill structures according to the third embodiment of the present disclosure.
Figure 46B:
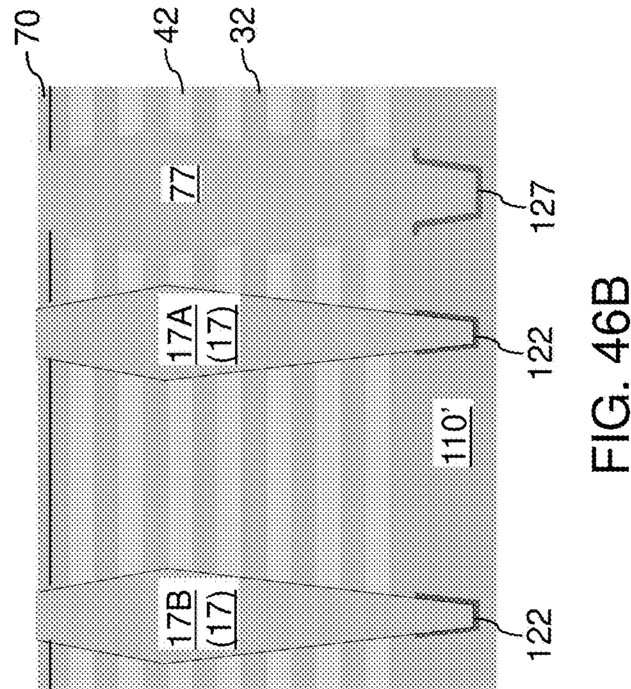
FIG. 46B is a vertical cross-sectional view along the vertical plane A-A' of FIG. 46A.

Referring to FIGS. 46A and 46B, the processing steps described with reference to FIGS. 7A and 7B can be performed to form first sacrificial support opening fill structures 17A, the second sacrificial support opening fill structures 17B, and sacrificial isolation trench fill structures 77.

Referring to FIGS. 47A and 47B, the processing steps described with reference to FIGS. 8A and 8B can be performed to form the hard mask layer 81.

Referring to FIGS. 48A and 48B, the processing steps described with reference to FIGS. 9A and 9B can be performed to form opening in the hard mask layer 81 over the first sacrificial support opening fill structures 17A, and to subsequently remove the first sacrificial support opening fill structures 17A to reopen the first support openings 19A. Voids are formed in the volumes of the first support openings 19A.

Referring to FIGS. 49A and 49B, the processing steps described with reference to FIGS. 10A and 10B can be performed to laterally expand the first support openings 19A to form the laterally expanded first support openings 19E.

Referring to FIGS. 50A and 50B, the processing steps described with reference to FIGS. 11A and 11B can be performed to form first dielectric liners 124 and vertically-extending dielectric liners 125.

Figures 51A, 51B, 52A, 52B:
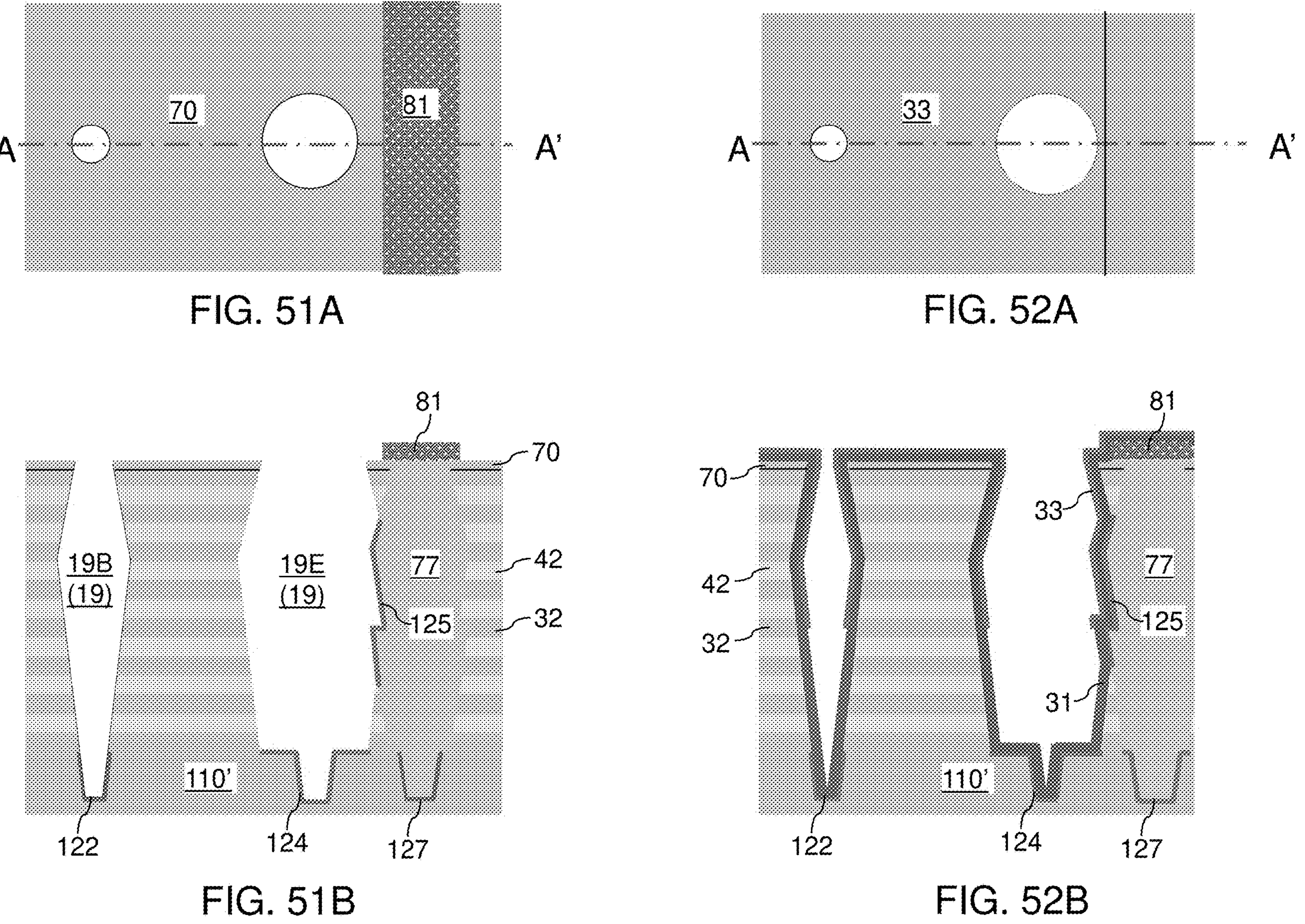
FIG. 51A is a top-down view of a region of the third exemplary structure after additional patterning of the hard mask layer according to the third embodiment of the present disclosure.
FIG. 51B is a vertical cross-sectional view along the vertical plane A-A' of FIG. 51A.
FIG. 52A is a top-down view of a region of the third exemplary structure after deposition of a conformal cover material layer and a non-conformal etch mask layer according to the third embodiment of the present disclosure.
FIG. 52B is a vertical cross-sectional view along the vertical plane A-A' of FIG. 52A.

Referring to FIGS. 51A and 51B, the processing steps described with reference to FIGS. 12A and 12B can be performed to pattern the hard mask layer 81 and to remove the second sacrificial support opening fill structures 17B to reopen the second support openings 19B. Voids are formed in the volumes of the second support openings 19B.

Referring to FIGS. 52A and 52B, the processing steps described with reference to FIGS. 30A and 30B can be performed to reform the conformal cover material layer 31 and the non-conformal etch mask layer 33 in the support openings 19.

The reformed conformal cover material layer 31 described with reference to FIGS. 52A and 52B provides the same function as the conformal cover material layer 31 described with reference to FIGS. 40A and 40B. The reformed conformal cover material layer 31 described with reference to FIGS. 52A and 52B is a different layer from the conformal cover material layer 31 described with reference to FIGS. 40A and 40B, and is formed after removal of the conformal cover material layer 31 described with reference to FIGS. 40A and 40B. As such, the conformal cover material layer 31 described with reference to FIGS. 40A and 40B may be referred to as a first conformal cover material layer, and the reformed conformal cover material layer 31 described with reference to FIGS. 52A and 52B may be referred to as a second conformal cover material layer.

The reformed non-conformal etch mask layer 33 described with reference to FIGS. 52A and 52B provides the same function as the non-conformal etch mask layer 33 described with reference to FIGS. 40A and 40B. The reformed non-conformal etch mask layer 33 described with reference to FIGS. 52A and 52B is different from the non-conformal etch mask layer 33 described with reference to FIGS. 40A and 40B, and is formed after removal of the non-conformal etch mask layer 33 described with reference to FIGS. 40A and 40B. As such, the non-conformal etch mask layer 33 described with reference to FIGS. 40A and 40B may be referred to as a first non-conformal etch mask layer, and the reformed non-conformal etch mask layer 33 described with reference to FIGS. 52A and 52B may be referred to as a second non-conformal etch mask layer.

Figure 53A:
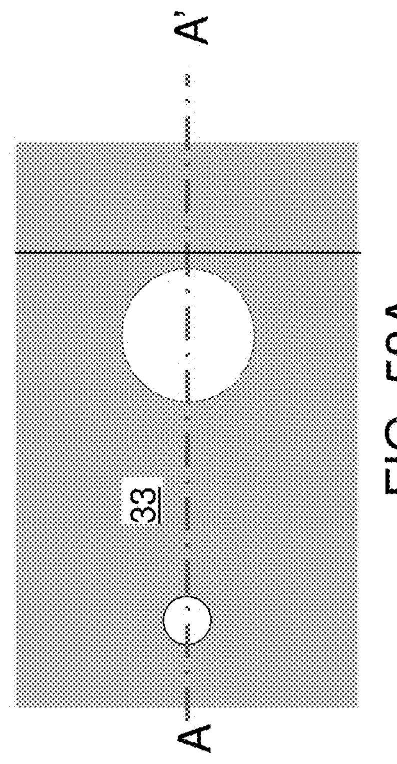
FIG. 53A is a top-down view of a region of the third exemplary structure after removal of unmasked portions of the conformal cover material layer according to the third embodiment of the present disclosure.
Figure 53B:
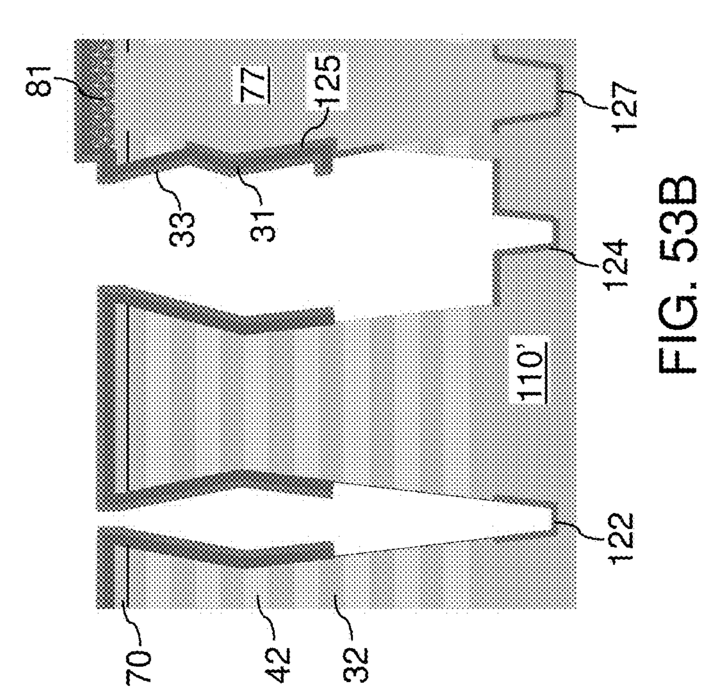
FIG. 53B is a vertical cross-sectional view along the vertical plane A-A' of FIG. 53A.

Referring to FIGS. 53A and 53B, the processing steps described with reference to FIGS. 31A and 31B can be performed. Specifically, an isotropic etch process can be performed to remove unmasked portions of the conformal cover material layer 31 selective to materials of the non-conformal etch mask layer 33 and the alternating stack (32, 42).

Figure 54A:
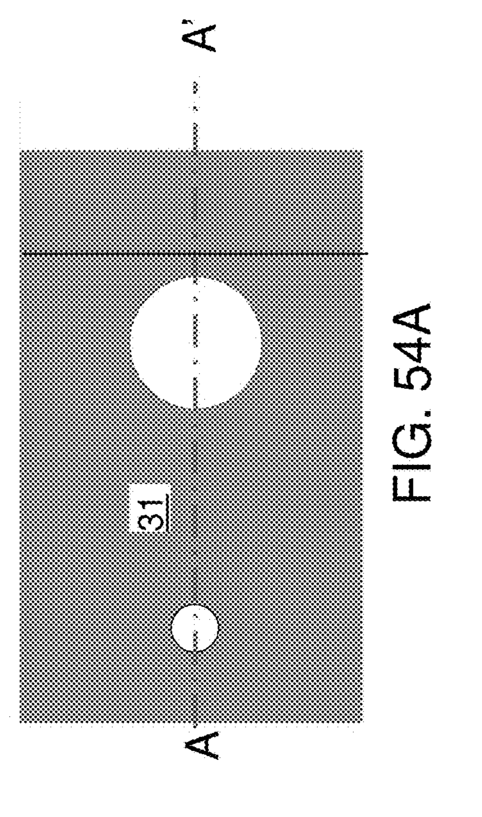
FIG. 54A is a top-down view of a region of the third exemplary structure after removal of the non-conformal etch mask layer according to the third embodiment of the present disclosure.
Figure 54B:
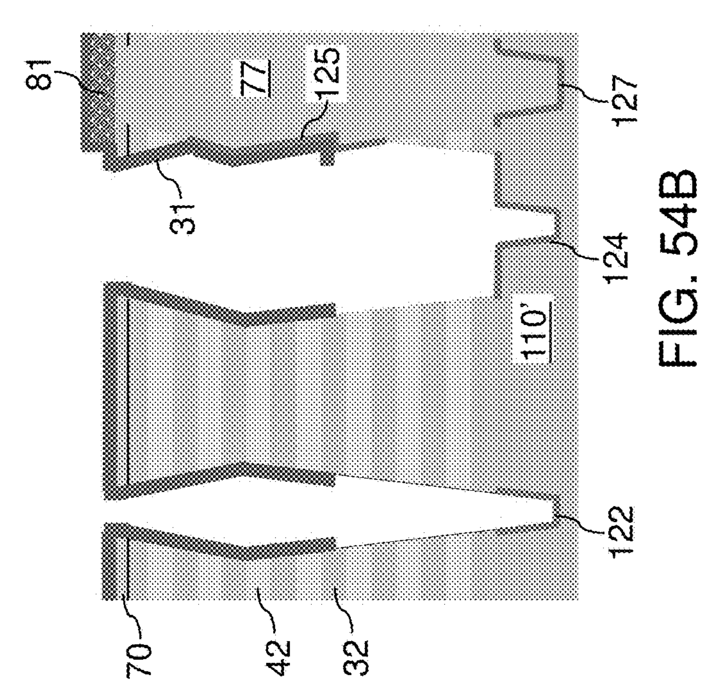
FIG. 54B is a vertical cross-sectional view along the vertical plane A-A' of FIG. 54A.

Referring to FIGS. 54A and 54B, the processing steps described with reference to FIGS. 32A and 32B can be performed. Specifically, the non-conformal etch mask layer 33 may be removed, for example, by performing an isotropic etch process, such as a wet etch process.

Figure 55A:
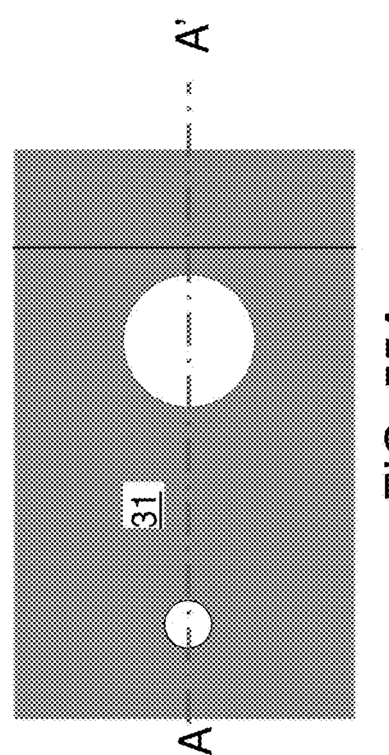
FIG. 55A is a top-down view of a region of the third exemplary structure after formation of annular fin cavities according to the third embodiment of the present disclosure.
Figure 55B:
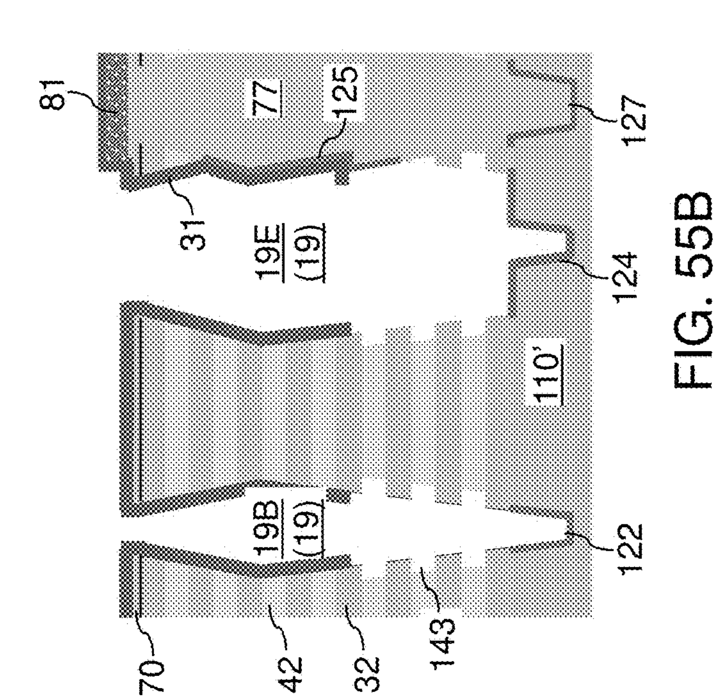
FIG. 55B is a vertical cross-sectional view along the vertical plane A-A' of FIG. 55A.

Referring to FIGS. 55A and 55B, the processing steps described with reference to FIGS. 33A and 33B can be performed. For example, an isotropic etch process that etches the material of the sacrificial material layer 42 selective to the material of the insulating layers 32 and the conformal cover material layer 31 can be performed to laterally recess physically exposed surfaces of the sacrificial material layers 42. Annular fin cavities 143 can be formed in volumes from which the material of the sacrificial material layers 42 is removed. The lateral recess distance of the isotropic etch process may be in a range from 10 nm to 120 nm, such as from 20 nm to 80 nm, although lesser and greater lateral etch distances may also be employed. Generally, annular fin cavities 143 may be formed around the laterally-expanded first support openings 19E and around the second support openings 19B by etching portions of the sacrificial material layers 42 that are proximal to the laterally-expanded first support openings 19E or to the second support openings 19B selective to the insulating layers 32, the support opening dielectric liners 122, and the first dielectric liners 124. In one embodiment, at least one sidewall surface segment of a sacrificial isolation trench fill structure 77 may be physically exposed to one or more of the first support openings 19E.

Figure 56A:
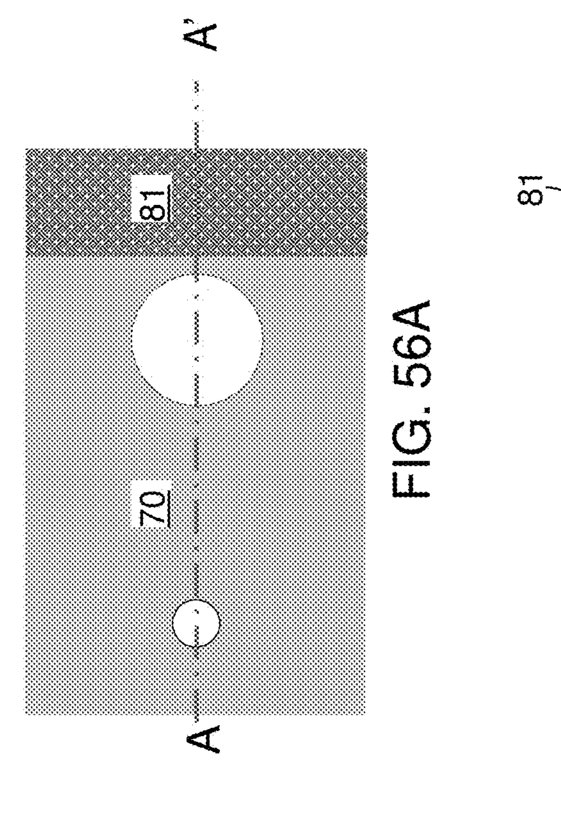
FIG. 56A is a top-down view of a region of the third exemplary structure after removal of the conformal cover material layer according to the third embodiment of the present disclosure.
Figure 56B:
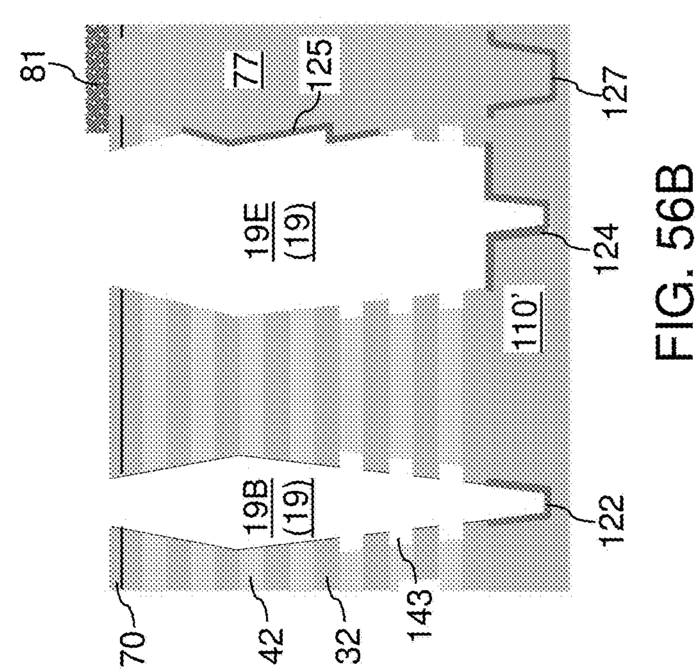
FIG. 56B is a vertical cross-sectional view along the vertical plane A-A' of FIG. 56A.

Referring to FIGS. 56A and 56B, the processing steps described with reference to FIGS. 34A and 34B can be performed. Specifically, the conformal cover material layer 31 can be removed selective to the materials of the alternating stack (32, 42).

Figure 57A:
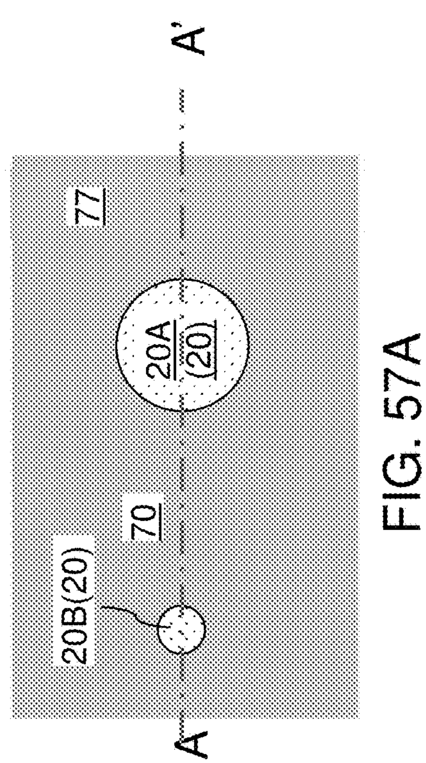
FIG. 57A is a top-down view of a region of the third exemplary structure after formation of dielectric support pillar structures according to the third embodiment of the present disclosure.
Figure 57B:
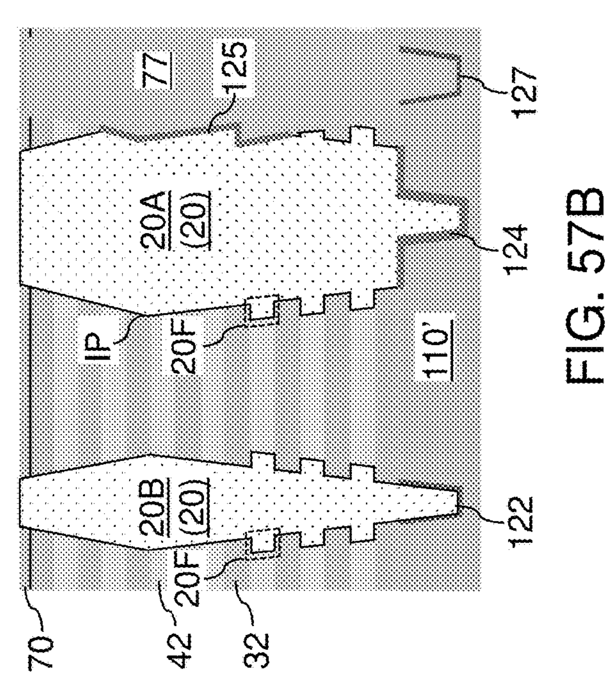
FIG. 57B is a vertical cross-sectional view along the vertical plane A-A' of FIG. 57A.

Referring to FIGS. 57A and 57B, the processing steps described with reference to FIGS. 13A and 13B as well as FIGS. 35A and 35B can be performed to form first dielectric support pillar structures 20A and the second dielectric support pillar structures 20B. In one embodiment, at least one of the first dielectric support pillar structures 20A comprises a respective plurality of laterally-extending dielectric fins 20F. In one embodiment, at least one of the second dielectric support pillar structures 20B comprises a respective plurality of laterally-extending dielectric fins 20F.

Figure 58A:
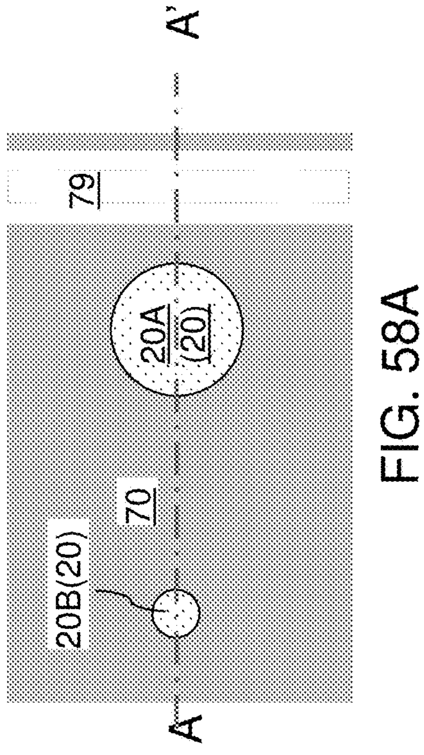
FIG. 58A is a top-down view of a region of the third exemplary structure after removal of the sacrificial isolation trench fill structures according to the third embodiment of the present disclosure.
Figure 58B:
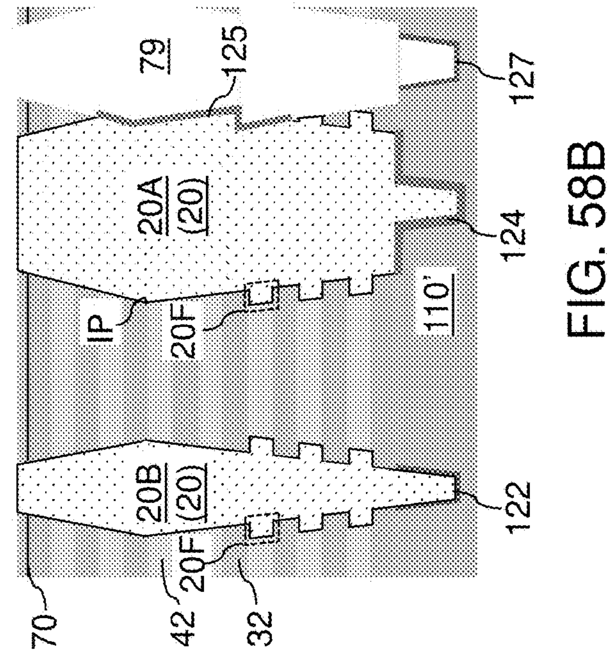
FIG. 58B is a vertical cross-sectional view along the vertical plane A-A' of FIG. 58A.

Referring to FIGS. 58A and 58B, the selective isotropic etch process described with reference to FIGS. 14A and 14B can be performed to remove the sacrificial isolation trench fill structures 77 selective to the materials of the alternating stacks (32, 42), the insulating cap layer 70, the dielectric support pillar structures (20A, 20B), and the trench bottom dielectric liners 127.

Referring to FIGS. 59A and 59B, the processing steps described with reference to FIG. 15, can be performed to form the optional source cavity 109. The processing steps described with reference to FIGS. 16A-16D can be performed to form the optional source contact layer 114. The processing steps described with reference o FIGS. 17A-17D can be performed to form laterally-extending cavities 43.

Referring to FIGS. 60A and 60B, the processing steps described with reference to FIGS. 18 and 19 can be performed to form electrically conductive layers 46 and the isolation trench fill structures (74, 76). Subsequently, the processing steps described with reference to FIGS. 20A-25 or 26-28 may be performed.

Figures 61A, 61B, 62A, 62B:
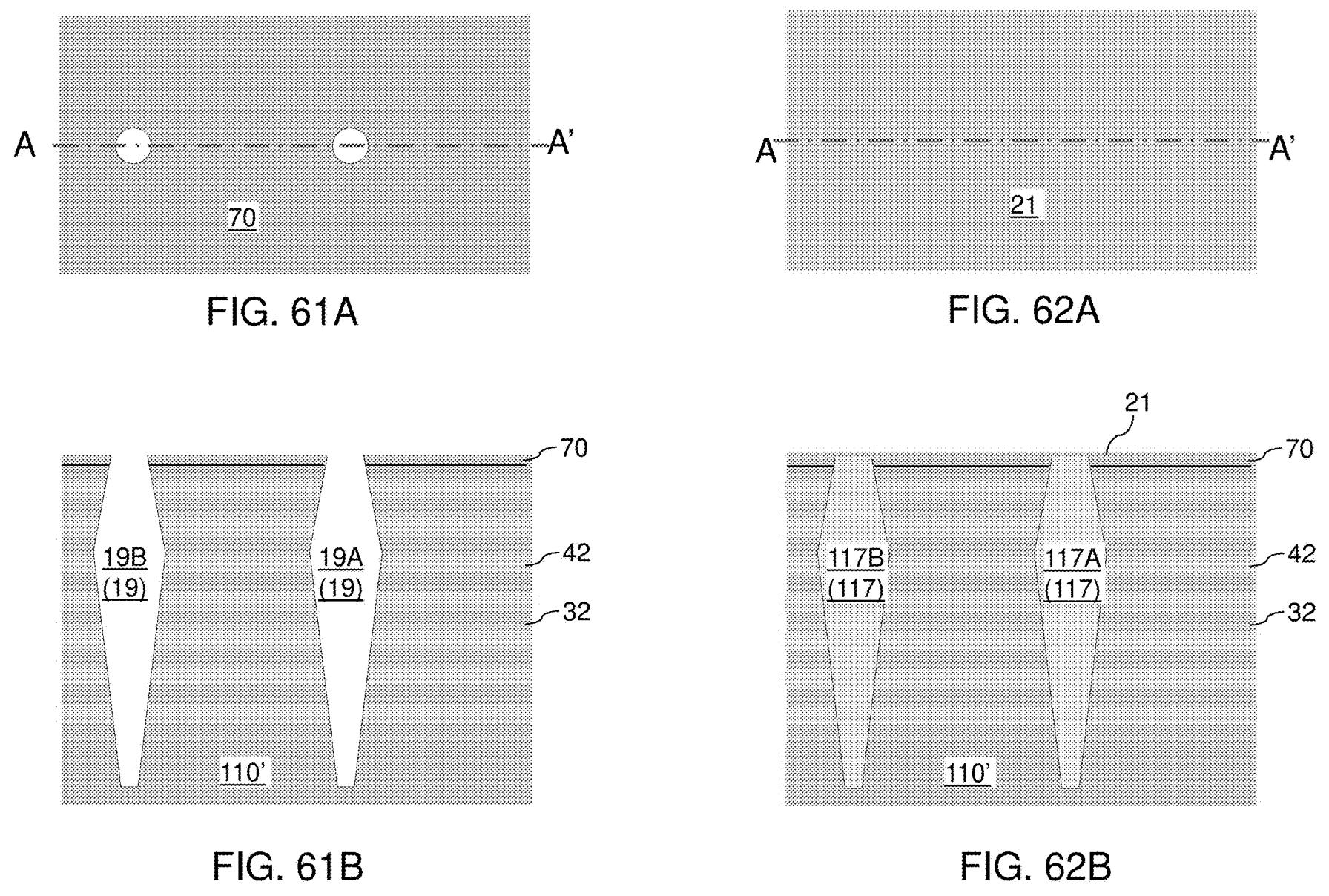

Referring to FIGS. 61A and 61B, a fourth exemplary structure according to a fourth embodiment of the present disclosure is shown, which may be derived from the first exemplary structure illustrated in FIGS. 6A-6D by omitting formation of the lateral isolation trenches 79. In other words, the pattern of the photoresist layer can be modified so that only the support openings 19 are formed and the lateral isolation trenches 79 are not formed by the anisotropic etch process. Thus, in the fourth embodiment the support openings 19 are formed separately from the lateral isolation trenches 79

Referring to FIGS. 62A and 62B, a first sacrificial fill material can be filled in the first support openings 19A and in the second support openings 19B. The first sacrificial fill material may comprise a non-semiconductor material, such as amorphous carbon, diamond-like carbon, or a polymer material. Excess portions of the first sacrificial fill material can be removed from above the horizontal plane including the top surface of the insulating cap layer 70. Each remaining portion of the first sacrificial fill material that fills a first support opening 19A constitutes a first sacrificial support opening fill structure 117A. Each remaining portion of the first sacrificial fill material that fills a second support opening 19B constitutes a second sacrificial support opening fill structure 117B. The first sacrificial support opening fill structures 117A and the second sacrificial support opening fill structures 117B are collectively referred to as sacrificial support opening fill structures 117. A sacrificial cap layer 21 may be optionally formed over the insulating cap layer 70 and the sacrificial support opening fill structures 117. If present, the sacrificial cap layer 21 may comprise a dielectric material, such as silicon oxide, and may have a thickness in a range from 10 nm to 100 nm, although lesser and greater thicknesses may also be employed.

Figures 63A, 63B, 64A, 64B:
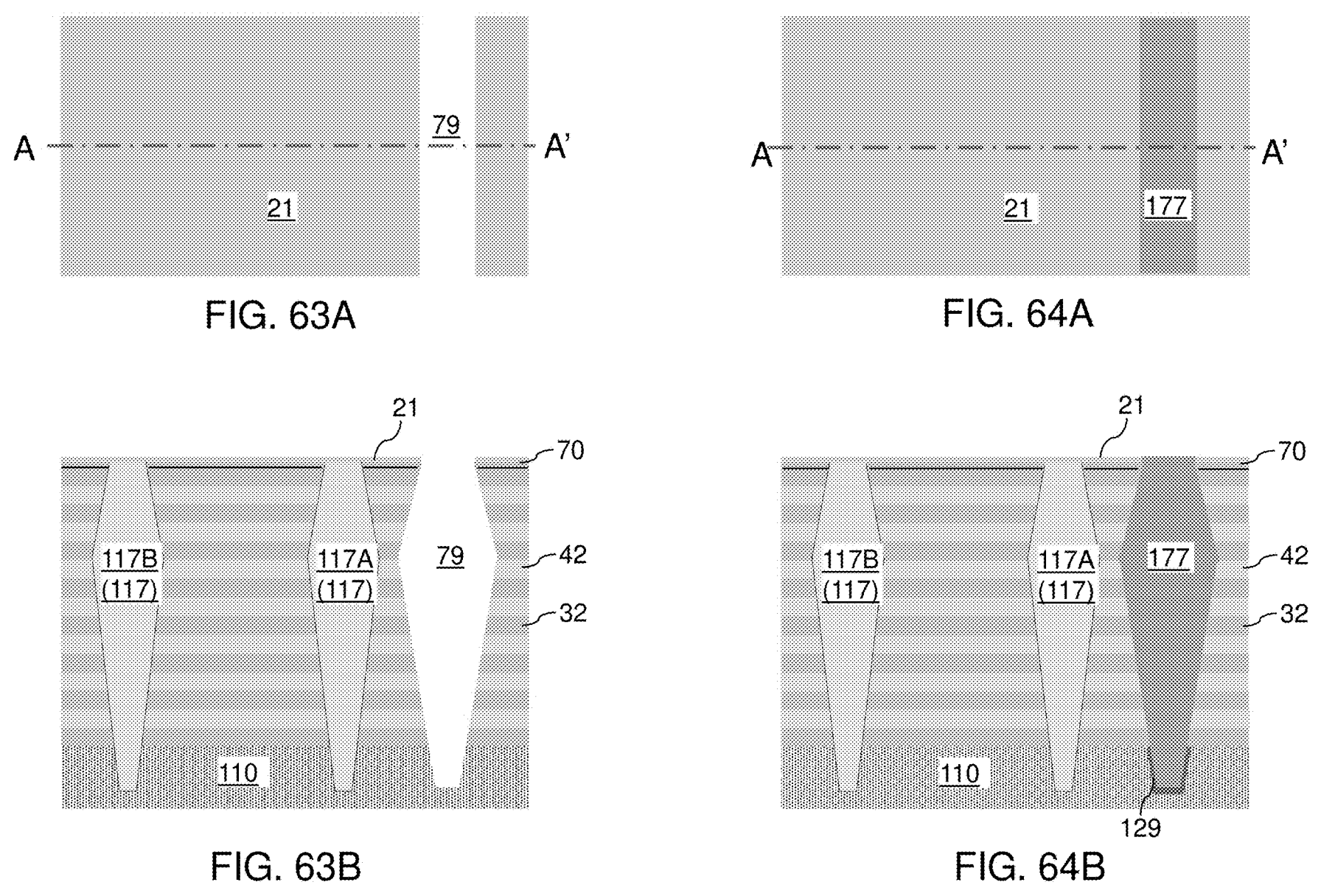

Referring to FIGS. 63A and 63B, a photoresist layer (not shown) can be applied over the sacrificial cap layer 21, and can be lithographically patterned to form elongated openings having the pattern of the lateral isolation trenches 79 described above. An anisotropic etch process can be performed to form lateral isolation trenches 79 through the alternating stack (32, 42) and into the in-process source-level material layers 110' or the semiconductor substrate 9.

The processing steps described with reference to FIGS. 15 and 16A-16D can be performed to form the optional source contact layer 114, thereby converting the in-process source-level material layers 110' into a source layer 110.

Referring to FIGS. 64A and 64B, a dielectric surface conversion process, such as an oxidation process or a nitridation process, may be performed to convert physically exposed surface portions of the source layer 110 or the semiconductor substrate 9 located at the bottom of each lateral isolation trench 79 to form trench bottom dielectric liners 129. Specifically, a WVG oxidation process may be used to reform a silicon oxide trench bottom dielectric liner 129 at the bottom of each lateral isolation trench 79.

A second sacrificial fill material different from the first sacrificial fill material can be deposited in the lateral isolation trenches 79. The second sacrificial fill material may comprise a semiconductor material, such as amorphous silicon. Excess portions of the second sacrificial fill material may be removed from above the horizontal plane including the top surface of the sacrificial cap layer 21 by a planarization process such as a chemical mechanical polishing process. Each remaining portion of the second sacrificial fill material filling a respective lateral isolation trench 79 constitutes a sacrificial isolation trench fill structure 177.

Figure 65A:
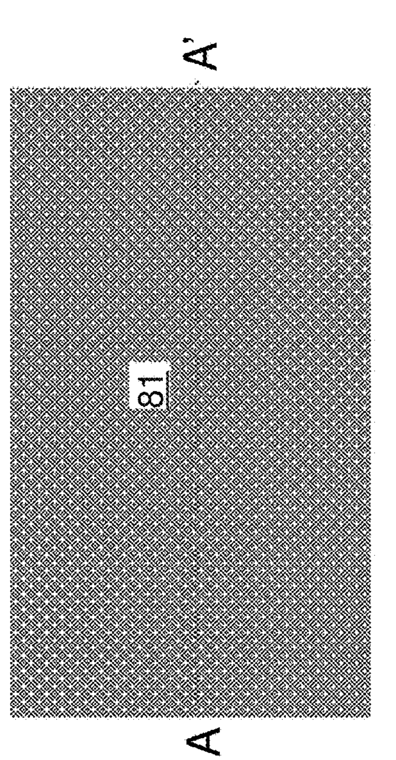
FIG. 65A is a top-down view of a region of the fourth exemplary structure after formation of a hard mask layer according to the fourth embodiment of the present disclosure.
Figure 65B:
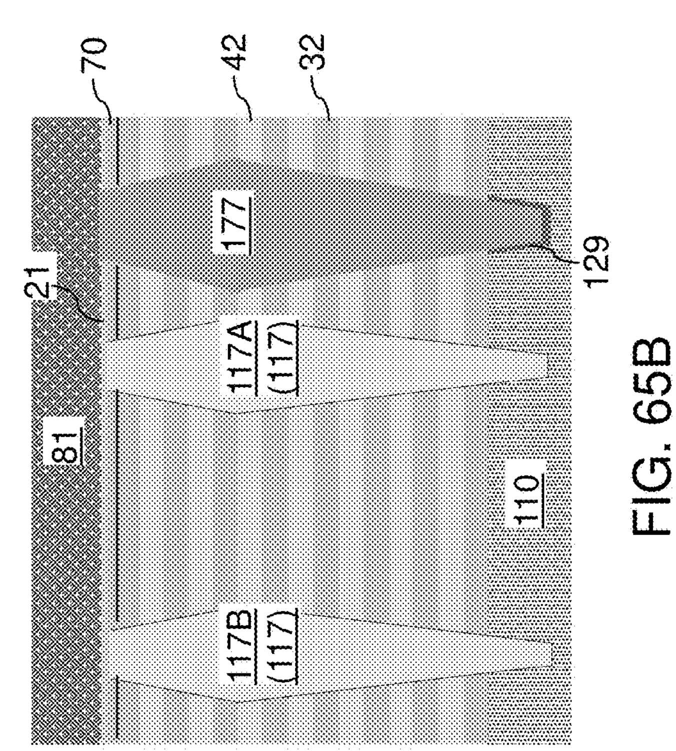
FIG. 65B is a vertical cross-sectional view along the vertical plane A-A' of FIG. 65A.

Referring to FIGS. 65A and 65B, the processing steps described with reference to FIGS. 8A and 8B can be performed to form the hard mask layer 81.

Figure 66A:
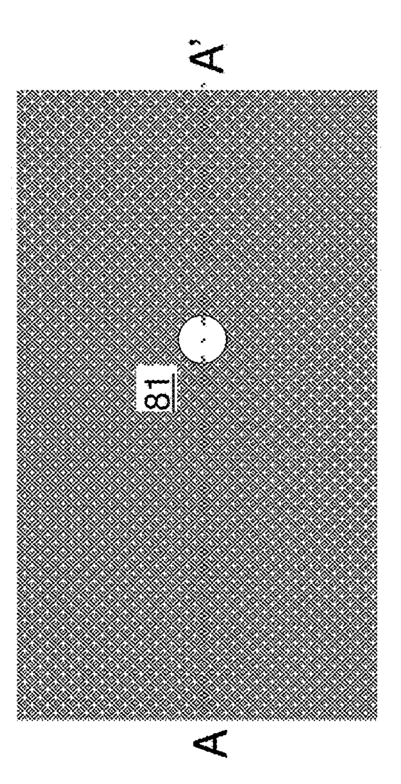
FIG. 66A is a top-down view of a region of the fourth exemplary structure after formation of openings through the hard mask layer and removal of first sacrificial support opening fill structures according to the fourth embodiment of the present disclosure.
Figure 66B:
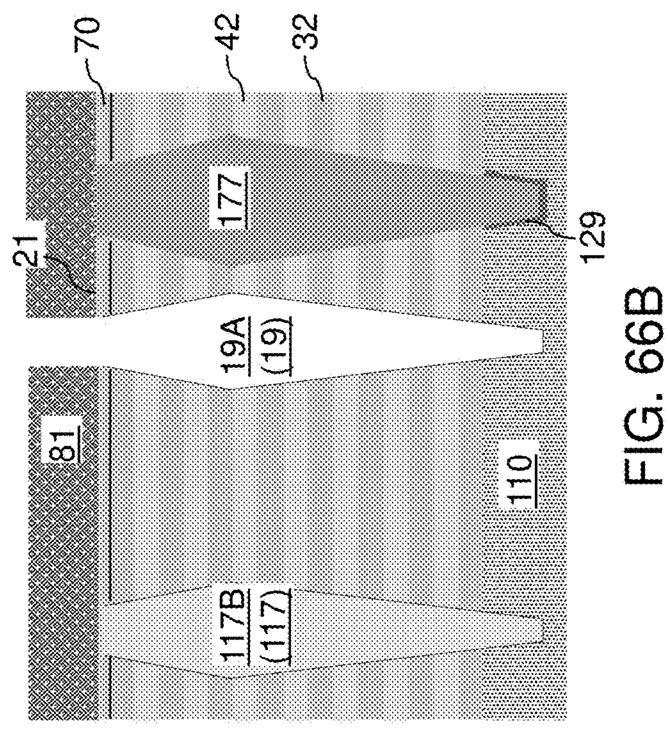
FIG. 66B is a vertical cross-sectional view along the vertical plane A-A' of FIG. 66A.

Referring to FIGS. 66A and 66B, the processing steps described with reference to FIGS. 9A and 9B can be performed to form opening in the hard mask layer 81 over areas of the first sacrificial support opening fill structures 117A. Subsequently, the first sacrificial support opening fill structures 117A can be removed selective to the materials of the alternating stack (32, 42), for example, by ashing, to reopen the first support openings 19A. Voids are formed in the volumes of the first support openings 19A.

Referring to FIGS. 67A and 67B, the processing steps described with reference to FIGS. 10A and 10B can be performed to laterally expand the first support openings 19A to form the laterally expanded first support openings 19E.

Referring to FIGS. 68A and 68B, the hard mask layer 81 can be patterned to expose top surfaces of the second sacrificial support opening fill structures 117B. The second sacrificial support opening fill structures 117B can be subsequently removed, for example, by ashing, to reopen the second support openings 19B. Voids are formed in the volumes of the second support openings 19B.

Figure 69A:
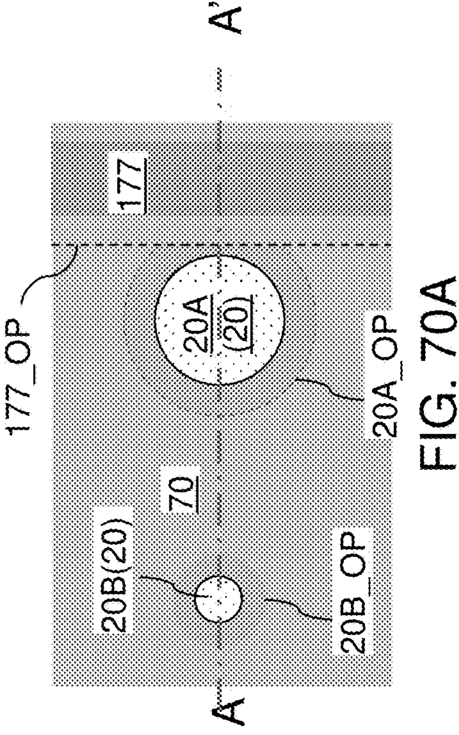
FIG. 69A is a partial see-through top-down view of a region of the fourth exemplary structure after formation of first dielectric liners and vertically-extending dielectric liners according to the fourth embodiment of the present disclosure.
Figure 69B:
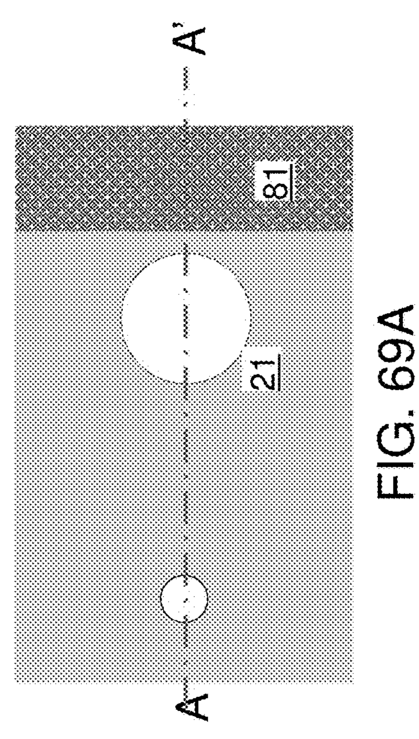
FIG. 69B is a vertical cross-sectional view along the vertical plane A-A' of FIG. 69A.

Referring to FIGS. 69A and 69B, a surface conversion process can be performed to convert physically exposed surface portions of the source layer 110 or the semiconductor substrate 9 into first dielectric liners 124 and to convert physically exposed surface portions of the sacrificial isolation trench fill structures 177 into vertically-extending dielectric liners 125. The surface conversion process may comprise a thermal oxidation process, a thermal nitridation process, a plasma oxidation process, or a plasma nitridation process. The first dielectric liners 124 and the vertically-extending dielectric liners 125 may comprise silicon oxide or silicon nitride, and may have a thickness in a range from 1 nm to 6 nm, although lesser and greater thicknesses may also be employed. Specifically, a WVG oxidation process may be used to reform a silicon oxide liner 124 and 125.

In summary, a surface portion of a semiconductor material layer (which may be, for example, the source layer 110 or the semiconductor substrate 9) that is exposed to a laterally-expanded first support opening 19E can be converted into a first dielectric liner 124, and a surface portion of a sacrificial isolation trench fill structure 177 that is exposed to the laterally-expanded first support opening 19E can be converted into the vertically-extending dielectric liner 125.

Figure 70A:
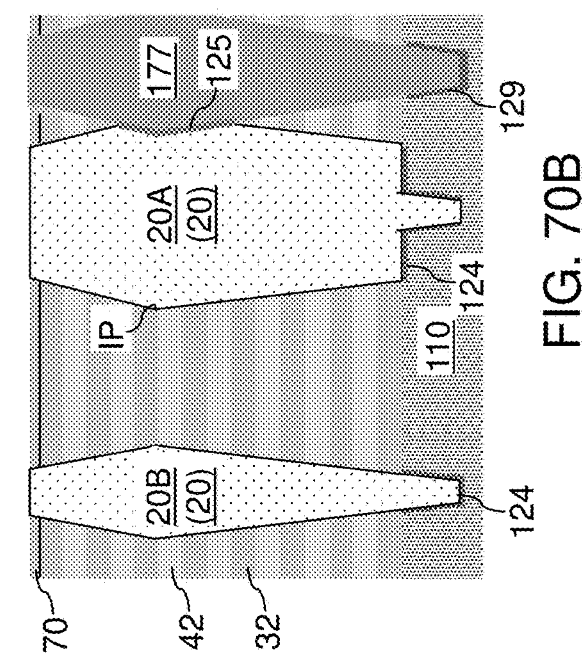
FIG. 70A is a partial see-through top-down view of a region of the fourth exemplary structure after formation of dielectric support pillar structures according to the fourth embodiment of the present disclosure.
Figure 70B:
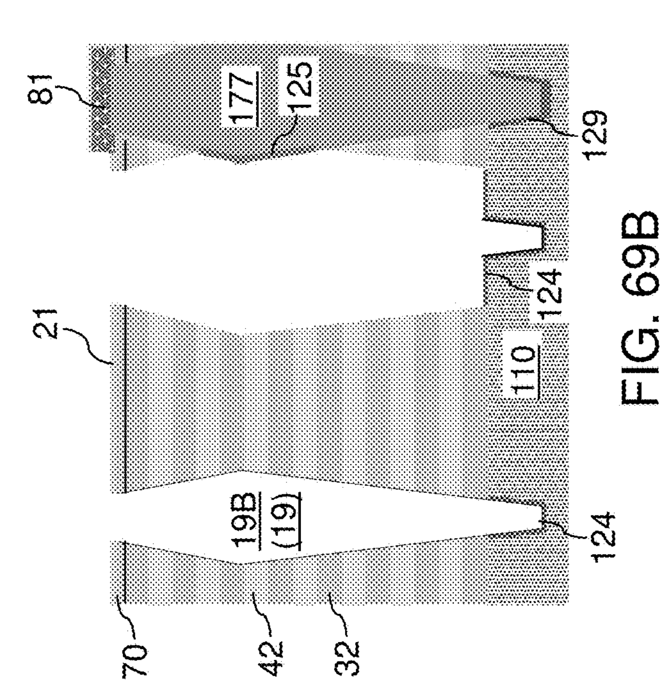
FIG. 70B is a vertical cross-sectional view along the vertical plane A-A' of FIG. 70A.

Referring to FIGS. 70A and 70B, the processing steps described with reference to FIGS. 13A and 13B may be performed to form the first dielectric support pillar structures 20A and the second dielectric support pillar structures 20B, which are collectively referred to as dielectric support pillar structures 20.

Figure 71A:
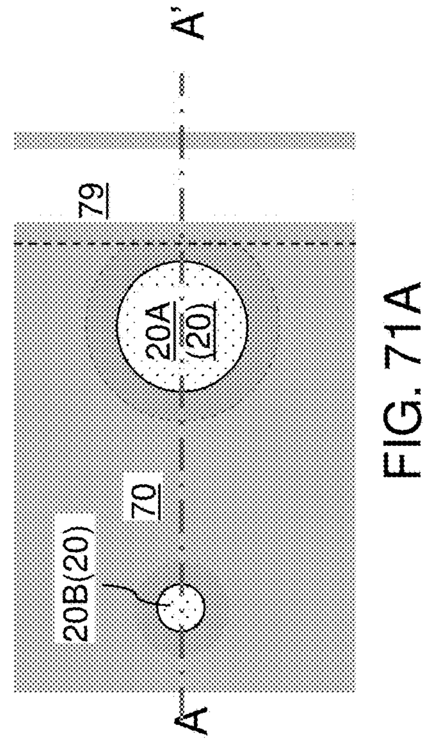
FIG. 71A is a top-down view of a region of the fourth exemplary structure after removal of the sacrificial isolation trench fill structures according to the fourth embodiment of the present disclosure.
Figure 71B:
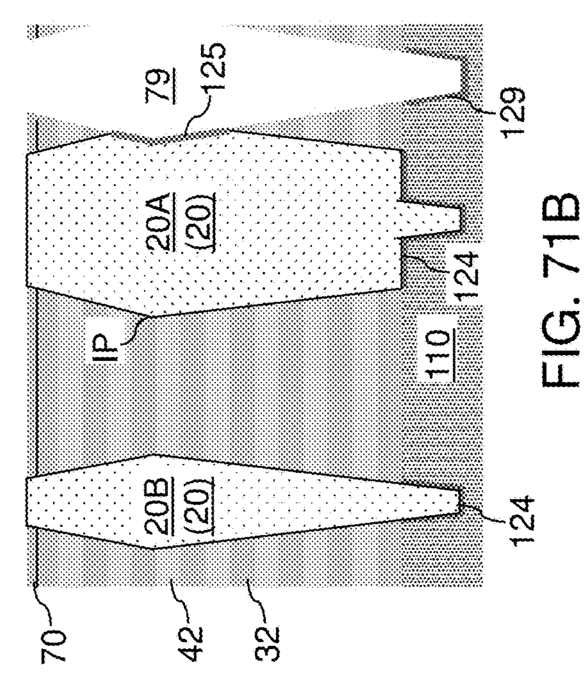
FIG. 71B is a vertical cross-sectional view along the vertical plane A-A' of FIG. 71A.

Referring to FIGS. 71A and 71B, a selective isotropic etch process can be performed to remove the sacrificial isolation trench fill structures 177 selective to the materials of the alternating stacks (32, 42), the insulating cap layer 70, the dielectric support pillar structures (20A, 20B), and the trench bottom dielectric liners 129.

Figure 72A:
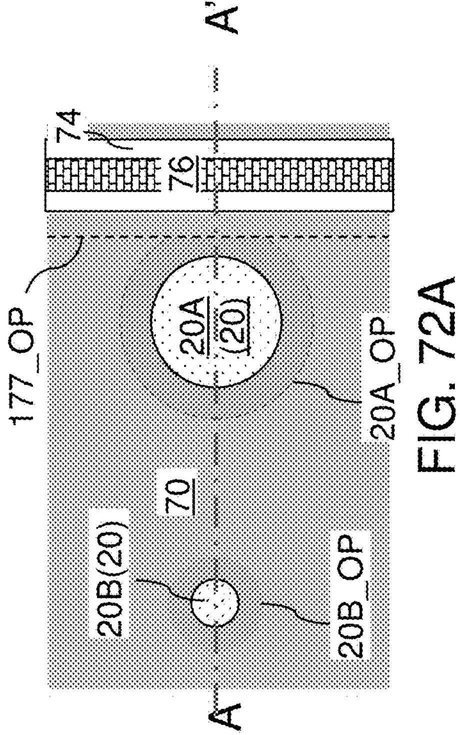
FIG. 72A is a top-down view of a region of the fourth exemplary structure after formation of the isolation trench fill structures according to the fourth embodiment of the present disclosure.
Figure 72B:
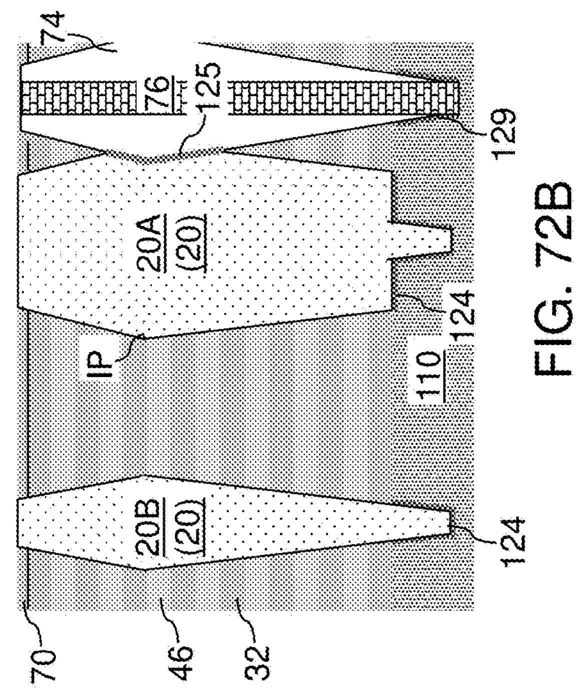
FIG. 72B is a vertical cross-sectional view along the vertical plane A-A' of FIG. 72A.

Referring to FIGS. 72A and 72B, the processing steps described with reference o FIGS. 17A-17D can be performed to form laterally-extending cavities 43. The processing steps described with reference to FIGS. 18 and 19 can be performed to form electrically conductive layers 46 and the isolation trench fill structures (74, 76). Subsequently, the processing steps described with reference to FIGS. 20A-25 or 26-28 may be performed.

Figure 73A:
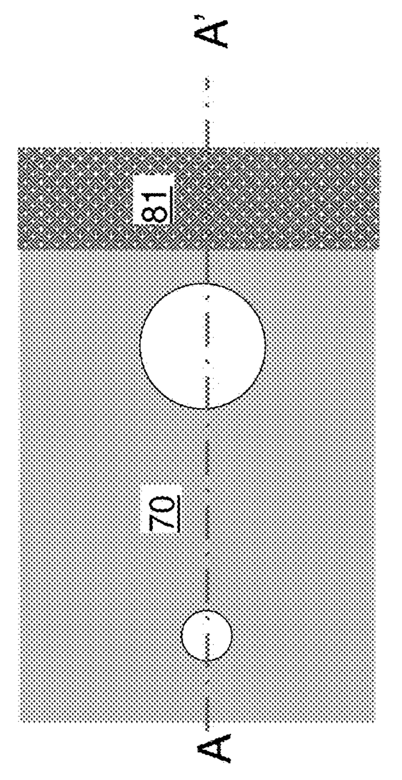
FIG. 73A is a top-down view of a region of a fifth exemplary structure after formation of first dielectric liners and vertically-extending dielectric liners according to a fifth embodiment of the present disclosure.
Figure 73B:
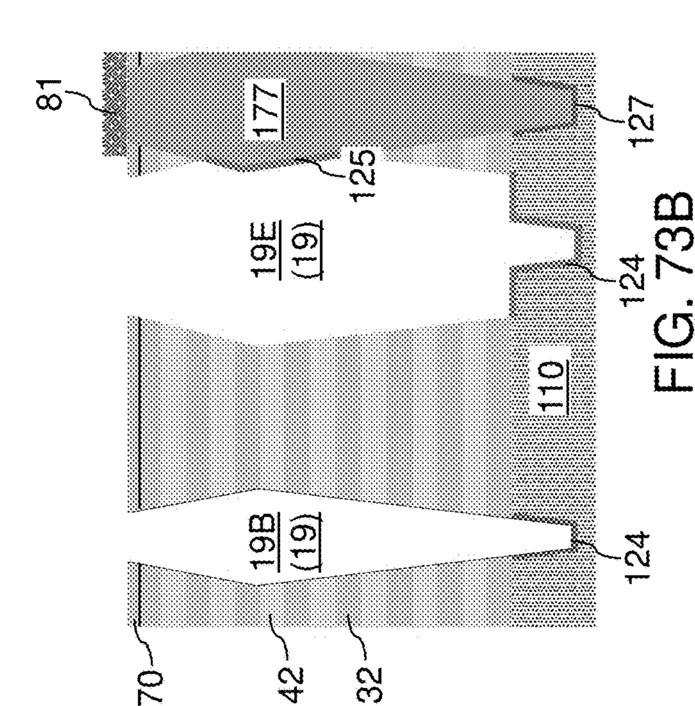
FIG. 73B is a vertical cross-sectional view along the vertical plane A-A' of FIG. 73A.

Referring to FIGS. 73A and 73B, a fifth exemplary structure according to a fifth embodiment of the present disclosure may be the same as the fourth exemplary structure illustrated in FIGS. 69A and 69B. In the fifth embodiment, the support openings 19 are formed separately from the lateral isolation trenches 79, and are filled with a carbon sacrificial material 117, as described in the fourth embodiment. The sacrificial cap layer 21 is an optional structure, and may or may not be employed in the fourth or fifth exemplary structure.

Figure 74A:
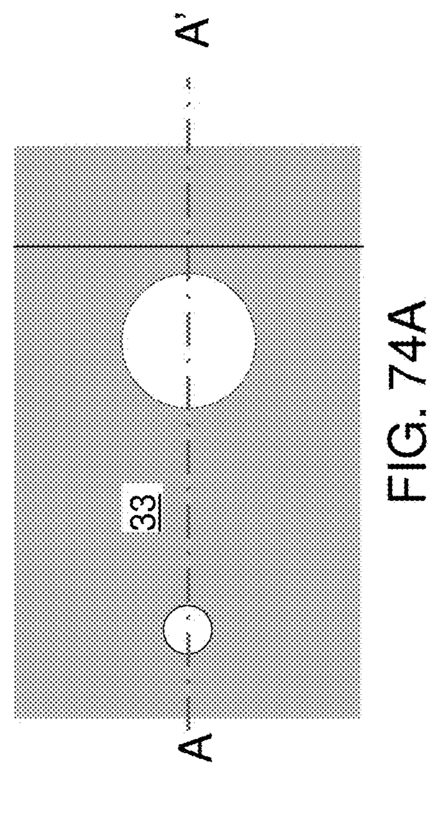
FIG. 74A is a top-down view of a region of the fifth exemplary structure after formation of deposition of a conformal cover material layer and a non-conformal etch mask layer according to the fifth embodiment of the present disclosure.
Figure 74B:
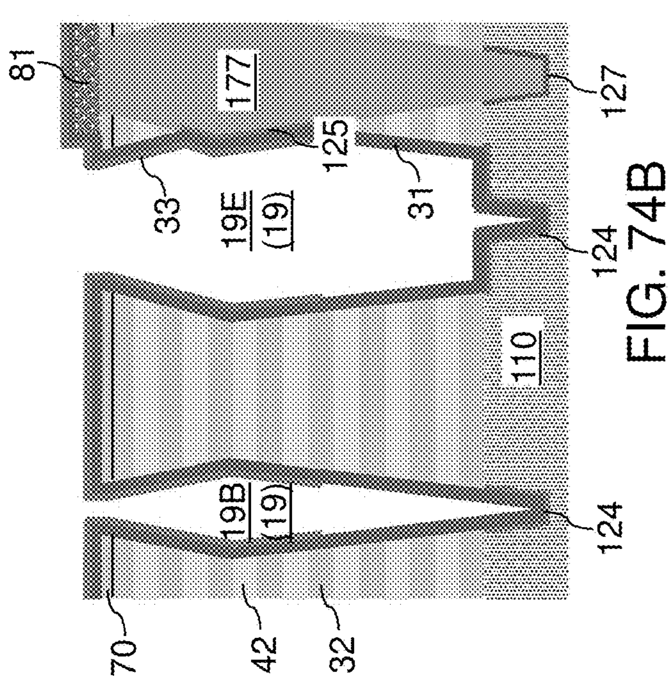
FIG. 74B is a vertical cross-sectional view along the vertical plane A-A' of FIG. 74A.

Referring to FIGS. 74A and 74B, the processing steps described with reference to FIGS. 30A and 30B can be performed to form the conformal cover material layer 31 and the non-conformal etch mask layer 33. Vertically-extending portions of the conformal cover material layer 31 and the non-conformal etch mask layer 33 can be formed on physically exposed surfaces around the support openings 19.

Figure 75A:
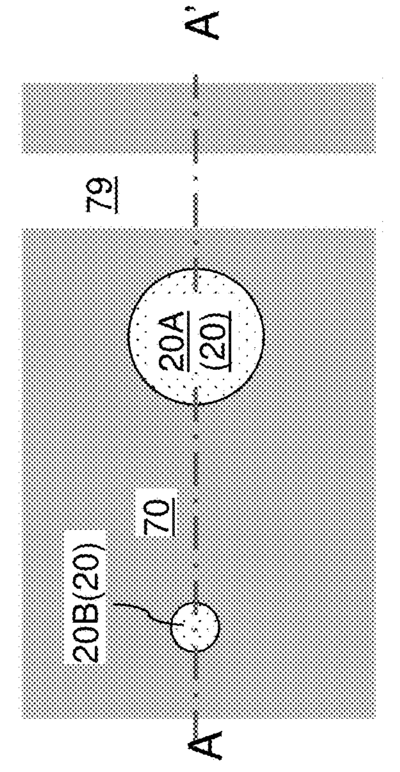
FIG. 75A is a top-down view of a region of the fifth exemplary structure after formation of laterally-extending cavities according to the fifth embodiment of the present disclosure.
Figure 75B:
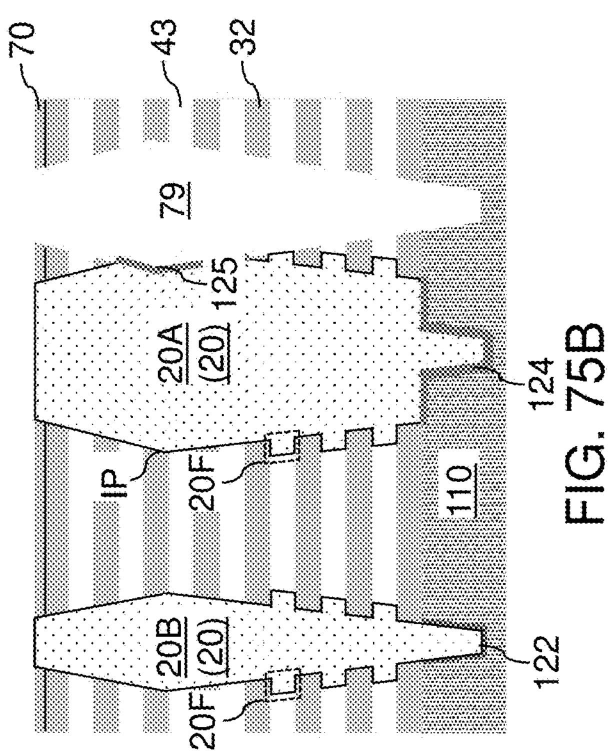
FIG. 75B is a vertical cross-sectional view along the vertical plane A-A' of FIG. 75A.

Referring to FIGS. 75A and 75B, the processing steps described with reference to FIGS. 31A-36B can be performed to form the dielectric support pillar structures 20, and to remove the sacrificial isolation trench fill structures 177. The processing steps described with reference to FIGS. 17A-17D can be performed to remove the sacrificial material layers 42. Laterally-extending cavities 43 can be formed in the volumes from which the sacrificial material layers 42 are removed.

Figure 76A:
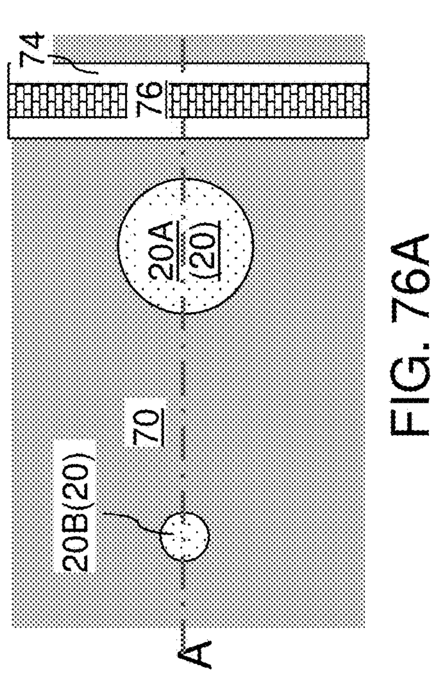
FIG. 76A is a top-down view of a region of the fifth exemplary structure after formation of isolation trench fill structures according to the fifth embodiment of the present disclosure.
Figure 76B:
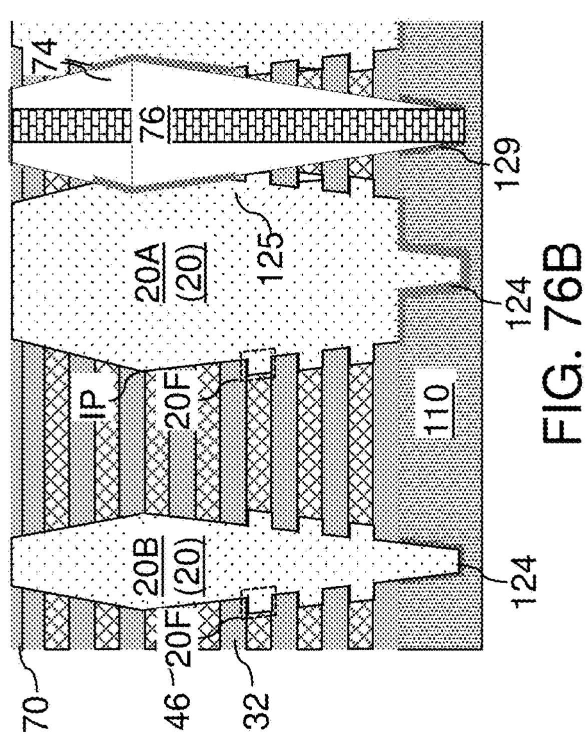
FIG. 76B is a vertical cross-sectional view along the vertical plane A-A' of FIG. 76A.

Referring to FIGS. 76A and 76B, the processing steps described with reference to FIGS. 18 and 19 can be performed to form electrically conductive layers 46 and the isolation trench fill structures (74, 76). Subsequently, the processing steps described with reference to FIGS. 20A-25 or 26-28 may be performed.

Figure 77A:
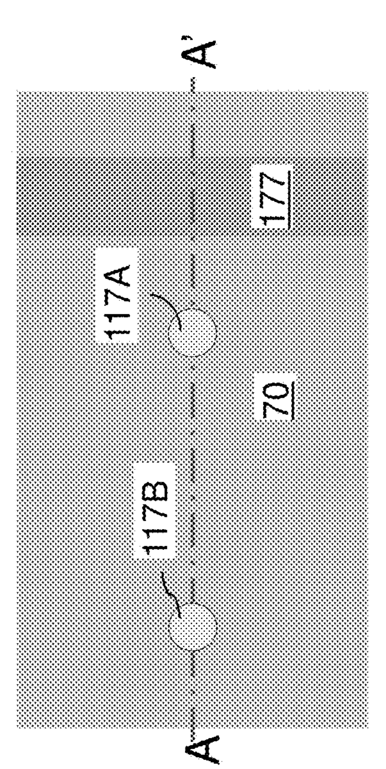
FIG. 77A is a top-down view of a region of a sixth exemplary structure after formation of sacrificial isolation trench fill structures according to a sixth embodiment of the present disclosure.
Figure 77B:
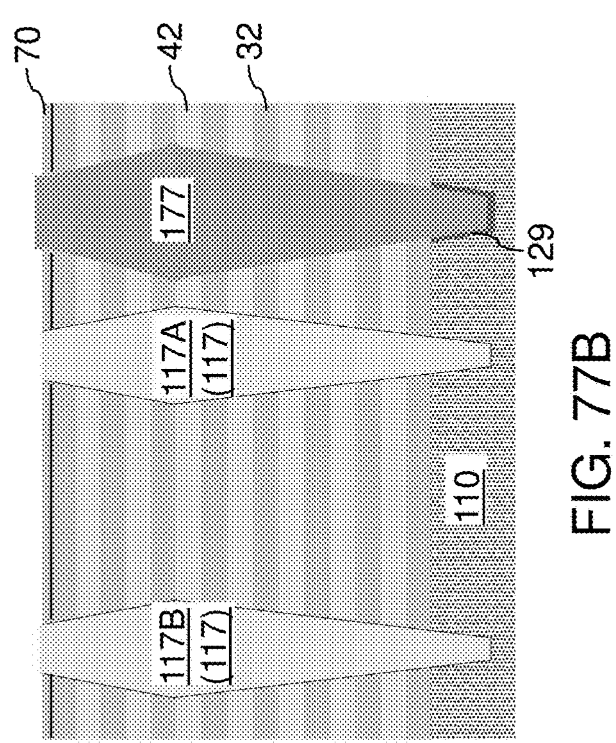
FIG. 77B is a vertical cross-sectional view along the vertical plane A-A' of FIG. 77A.

Referring to FIGS. 77A and 77B, a sixth exemplary structure according to a sixth embodiment of the present disclosure is illustrated, which may be the same as the fourth exemplary structure illustrated in FIGS. 64A and 64B. The sacrificial cap layer 21 is an optional element in the fourth, fifth, and sixth exemplary structures, and thus, may or may not be employed.

Figure 78A:
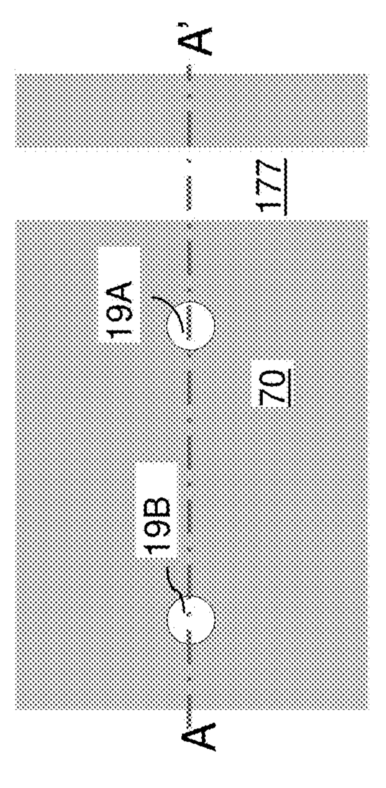
FIG. 78A is a top-down view of a region of the sixth exemplary structure after removal of the sacrificial support opening fill structures and sacrificial isolation trench fill structures according to the sixth embodiment of the present disclosure.
Figure 78B:
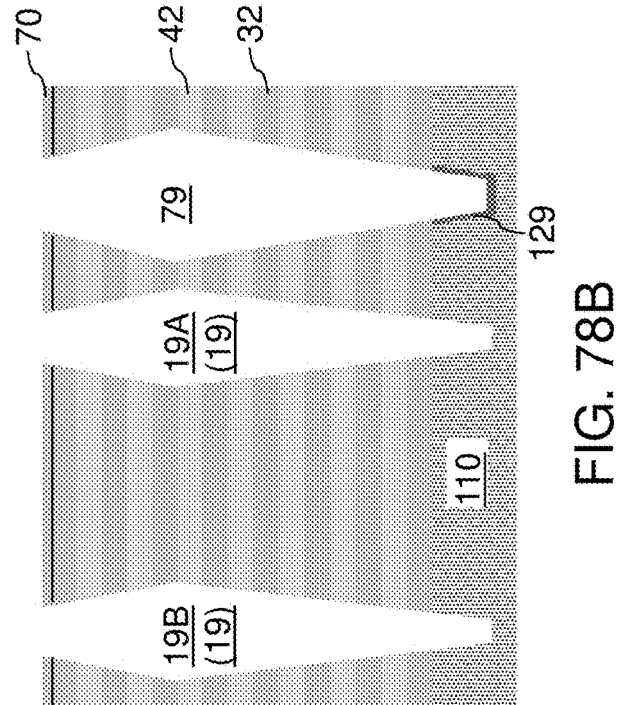
FIG. 78B is a vertical cross-sectional view along the vertical plane A-A' of FIG. 78A.

Referring to FIGS. 78A and 78B, the sacrificial support opening fill structures 117 and the sacrificial isolation trench fill structures 177 can be removed by performing at least one selective removal processes. For example, a combination of an isotropic etch process and an ashing process may be employed to remove the sacrificial support opening fill structures 117 and the sacrificial isolation trench fill structures 177. Voids are formed in the volumes of the lateral isolation trenches 79 and support openings 19.

Referring to FIGS. 79A and 79B, the processing steps described with reference to FIGS. 40A and 40B can be performed to form a conformal cover material layer 31 and a non-conformal etch mask layer 33.

Referring to FIGS. 80A and 80B, the processing steps described with reference to FIGS. 41A-43B can be performed to expand lower portions of the lateral isolation trenches 79.

Figure 81A:
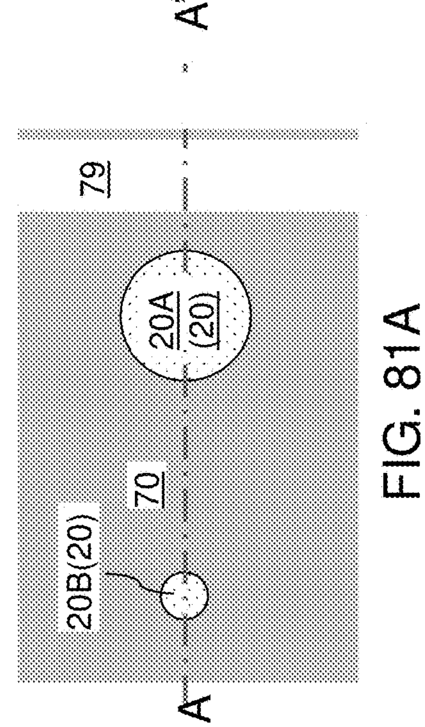
FIG. 81A is a top-down view of a region of the sixth exemplary structure after formation of laterally-extending cavities according to the sixth embodiment of the present disclosure.
Figure 81B:
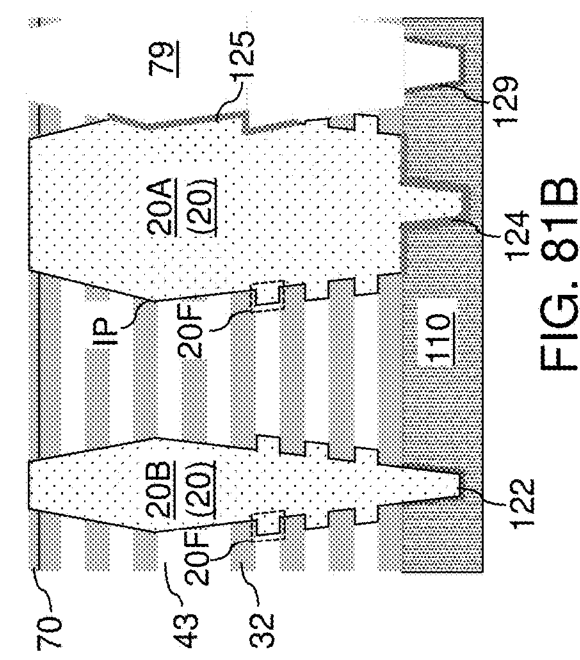
FIG. 81B is a vertical cross-sectional view along the vertical plane A-A' of FIG. 81A.

Referring to FIGS. 81A and 81B, the processing steps described with reference to FIGS. 44A-58B can be performed to form dielectric support pillar structures 20. The processing steps described with reference to FIGS. 17A-17D can be performed to remove the sacrificial material layers 42. Laterally-extending cavities 43 can be formed in the volumes from which the sacrificial material layers 42 are removed.

Figure 82A:
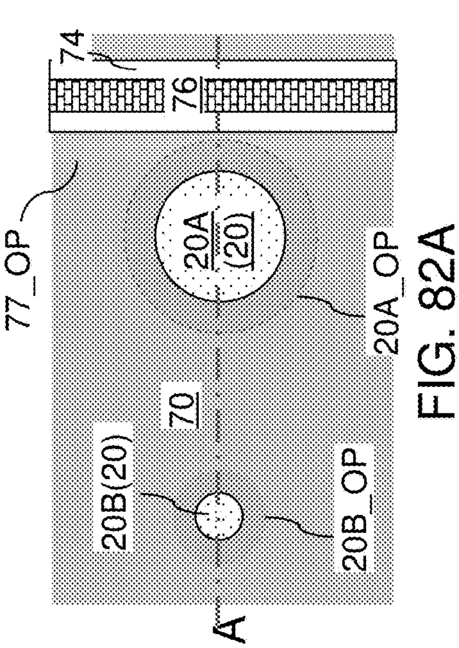
FIG. 82A is a top-down view of a region of the sixth exemplary structure after formation of isolation trench fill structures according to the sixth embodiment of the present disclosure.
Figure 82B:
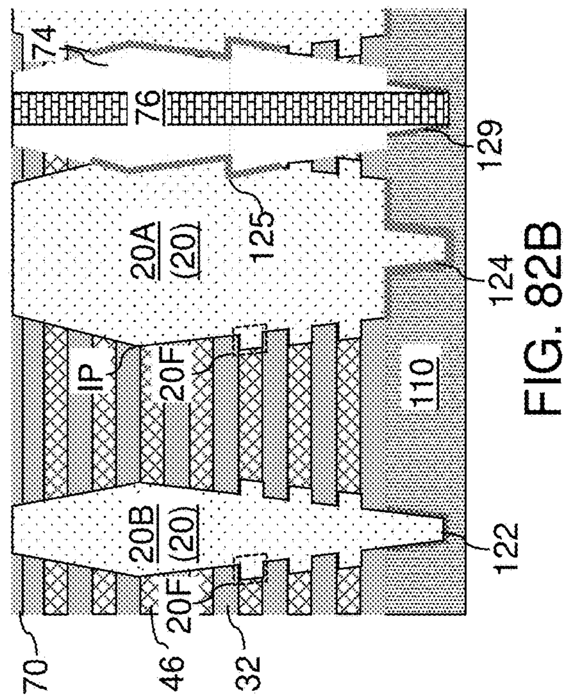
FIG. 82B is a vertical cross-sectional view along the vertical plane A-A' of FIG. 82A.

Referring to FIGS. 82A and 82B, the processing steps described with reference to FIGS. 18 and 19 can be performed to form electrically conductive layers 46 and the isolation trench fill structures (74, 76). Subsequently, the processing steps described with reference to FIGS. 20A-25 or 26-28 may be performed.

Referring to all drawings and according to various embodiments of the present disclosure, a three-dimensional memory device comprises: first and second an alternating stacks (32, 46) of insulating layers 32 and electrically conductive layers 46; a lateral isolation trench 79 separating the first alternating stack from the second alternating stack; memory openings 49 vertically extending through the alternating stack (32, 46); memory opening fill structures 58 located in the memory openings 49 and comprising a vertical semiconductor channel 60 and a respective vertical stack of memory elements (such as portions of a memory material layer 54) located at levels of the electrically conductive layers 46; a first dielectric support pillar structure 20A extending through the first alternating stack and having a first width; and a second dielectric support pillar structure 20B extending through the first alternating stack and having a second width narrower than the first width, wherein the second dielectric pillar structure 20B is located further from the lateral isolation trench 79 than the first dielectric support pillar structure 20A.

In one embodiment, the first dielectric support pillar structure 20A comprises: a first continuously-extending sidewall 20S1 that extends vertically through each layer within the first alternating stack (32, 46), an annular horizontal bottom surface 20B having an outer periphery that is adjoined to a bottom edge of the first continuously-extending sidewall 20S1, and downward-protruding portion 20P that protrudes downward from the annular horizontal bottom surface 20B into the semiconductor material layer (which may be, for example, the source layer 110 or the semiconductor substrate 9).

In one embodiment, the three-dimensional memory device further comprises a first dielectric liner 124 that comprises: an annular dielectric plate portion contacting the annular horizontal bottom surface; a cylindrical dielectric portion connected to an inner periphery of the annular dielectric plate portion; and a bottom dielectric plate portion connected to a bottom periphery of the cylindrical dielectric portion. In one embodiment, the first dielectric liner 124 consists essentially of a dielectric oxide or a dielectric nitride of a semiconductor material in the semiconductor material layer (which may be, for example, the source layer 110 or the semiconductor substrate). The entire first dielectric support pillar structure 20A consists essentially of a first dielectric material (e.g., silicon oxide); and the second dielectric support pillar structure 20B consists essentially of the same first dielectric material.

In one embodiment, the first continuously-extending sidewall 20S1 is free of any horizontally-extending surface segment. In another embodiment, the first dielectric support pillar structure 20A comprises a plurality of laterally-extending dielectric fins 20F; and the first continuously-extending sidewall 20S1 comprises surface segments of the plurality of laterally-extending dielectric fins 20F. In one embodiment, a maximum vertical distance between the plurality of laterally-extending dielectric fins 20F and a horizontal plane including a bottommost surface of the first alternating stack (32, 46) is less than 80% of a total thickness of the first alternating stack (32, 46). In one embodiment, a vertical cross-sectional profile of the first dielectric support pillar structure 20A comprises an inflection point IP at which a tapered surface segment of the first continuously-extending sidewall is adjoined to a reverse-tapered surface segment of the first continuously-extending sidewall; and an entirety of the plurality of laterally-extending dielectric fins 20F is located underneath a horizontal plane including the inflection point IP. In one embodiment, a bottommost one of the plurality of laterally-extending dielectric fins 20F is located at a levels of a bottommost one of the electrically conductive layer 46 within the first alternating stack (32, 46).

In one embodiment, the semiconductor structure comprises an isolation trench fill structure (74, 76) comprising an insulating spacer 74 located in the lateral isolation trench 79. In one embodiment, the first dielectric support pillar structure 20A comprises a lateral indentation having a vertical extent that is less than a total vertical extent of the first alternating stack (32, 46) in proximity to the isolation trench fill structure (74, 76). In one embodiment, the semiconductor structure comprises a vertically-extending dielectric liner 125 that contacts the lateral indentation of the first dielectric support pillar structure 20A and a surface segment of the insulating spacer 74. In one embodiment, the insulating spacer 74 comprises a stepped outer sidewall having a horizontal step and a straight inner sidewall.

In one embodiment, the second dielectric support pillar structure 20B comprises a second continuously-extending sidewall 20S2 that extends vertically through each layer within the first alternating stack (32, 46) to a bottommost surface of the second dielectric support pillar structure 20B without any horizontally-extending surface segment therein.

The various embodiments of the present disclosure may be employed to enhance structural support for the insulating layers 32, during replacement of the sacrificial material layers 42 with electrically conductive layers 46 by increasing the lateral dimensions of a subset of the dielectric support pillar structures 20, i.e., the first dielectric support pillar structures 20A, that are proximal to lateral isolation trenches 79.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A three-dimensional memory device, comprising:

first and second alternating stacks of insulating layers and electrically conductive layers;

a lateral isolation trench separating the first alternating stack from the second alternating stack;

memory openings vertically extending through the first and second alternating stacks;

memory opening fill structures located in the memory openings and comprising a vertical semiconductor channel and a respective vertical stack of memory elements located at levels of the electrically conductive layers;

a first dielectric support pillar structure extending through the first alternating stack and having a first width; and a second dielectric support pillar structure extending through the first alternating stack and having a second width narrower than the first width, wherein the second dielectric pillar structure is located further from the lateral isolation trench than the first dielectric support pillar structure.

2. The three-dimensional memory device of claim 1, wherein the first dielectric support pillar structure comprises:

a first continuously-extending sidewall that extends vertically through each layer within the first alternating stack;

an annular horizontal bottom surface having an outer periphery that is adjoined to a bottom edge of the first continuously-extending sidewall; and a downward-protruding portion that protrudes downward from the annular horizontal bottom surface into a semiconductor material layer that underlies the first and the second alternating stacks.

3. The semiconductor structure of claim 2, further comprising a first dielectric liner that comprises:

an annular dielectric plate portion contacting the annular horizontal bottom surface;

a cylindrical dielectric portion connected to an inner periphery of the annular dielectric plate portion; and a bottom dielectric plate portion connected to a bottom periphery of the cylindrical dielectric portion.

4. The semiconductor structure of claim 3, wherein:

the first dielectric liner consists essentially of a dielectric oxide of a semiconductor material in the semiconductor material layer;

the first dielectric support pillar structure consists essentially of a first dielectric material; and the second dielectric support pillar structure consists essentially of the first dielectric material.

5. The semiconductor structure of claim 3, wherein the first continuously-extending sidewall is free of any horizontally-extending surface segment.

6. The semiconductor structure of claim 2, wherein:

the first dielectric support pillar structure comprises a plurality of laterally-extending dielectric fins; and the first continuously-extending sidewall comprises surface segments of the plurality of laterally-extending dielectric fins.

7. The semiconductor structure of claim 6, wherein a maximum vertical distance between the plurality of laterally-extending dielectric fins and a horizontal plane including a bottommost surface of the first alternating stack is less than 80% of a total thickness of the first alternating stack.

8. The semiconductor structure of claim 6, wherein:

a vertical cross-sectional profile of the first dielectric support pillar structure comprises an inflection point at which a tapered surface segment of the first continuously-extending sidewall is adjoined to a reverse-tapered surface segment of the first continuously-extending sidewall; and an entirety of the plurality of laterally-extending dielectric fins is located underneath a horizontal plane including the inflection point.

9. The semiconductor structure of claim 6, wherein a bottommost one of the plurality of laterally-extending dielectric fins is located at a level of a bottommost one of the electrically conductive layer within the first alternating stack.

10. The semiconductor structure of claim 2, wherein the second dielectric support pillar structure comprises a second continuously-extending sidewall that extends vertically through each layer within the first alternating stack to a bottommost surface of the second dielectric support pillar structure without any horizontally-extending surface segment therein.

11. The semiconductor structure of claim 1, further comprising an isolation trench fill structure comprising an insulating spacer located in the lateral isolation trench.

12. The semiconductor structure of claim 11, wherein the first dielectric support pillar structure comprises a lateral indentation having a vertical extent that is less than a total vertical extent of the first alternating stack in proximity to the isolation trench fill structure.

13. The semiconductor structure of claim 12, further comprising a vertically-extending dielectric liner that contacts the lateral indentation of the first dielectric support pillar structure and a surface segment of the insulating spacer.

14. The semiconductor structure of claim 11, wherein the insulating spacer comprises a stepped outer sidewall having a horizontal step and a straight inner sidewall.

15. A method of forming a three-dimensional memory device, comprising:

forming an alternating stack of insulating layers and sacrificial material layers;

forming memory openings through the alternating stack;

forming memory opening fill structures in the memory openings, wherein each of the memory opening fill structures comprises a vertical semiconductor channel and a respective vertical stack of memory elements;

forming a first support opening and a second support opening through the alternating stack;

laterally expanding the first support opening without expanding the second support opening;

forming a first dielectric support pillar structure and a second dielectric support pillar structure in the laterally-expanded first support opening and in the second support opening, respectively; and replacing the sacrificial material layers with electrically conductive layers.

16. The method of claim 15, wherein an annular horizontal surface of a semiconductor material layer underlying the alternating stack is physically exposed after the laterally expanding the first support opening.

17. The method of claim 16, further comprising:

forming a lateral isolation trench through the alternating stack; and forming a sacrificial semiconductor isolation trench fill structure in the lateral isolation trench, wherein a surface segment of the sacrificial semiconductor isolation trench fill structure is physically exposed in the first support opening after laterally expanding the first support opening.

18. The method of claim 17, further comprising:

converting a surface portion of the semiconductor material layer that is exposed to the laterally-expanded first support opening into a first dielectric liner; and converting a surface portion of the sacrificial semiconductor isolation trench fill structure that is exposed to the laterally-expanded first support opening into a vertically-extending dielectric liner.

19. The method of claim 16, wherein:

the first support opening vertically extends through each layer within the alternating stack and into an upper portion of the semiconductor material layer; and the step of laterally expanding the first support opening comprises performing at least one isotropic etch process that removes portions of the insulating layers and the sacrificial material layers that are proximal to the first support opening without etching the semiconductor material layer.

20. The method of claim 15, further comprising:

anisotropically depositing a non-conformal etch mask layer that covers an upper portion of a sidewall of the first support opening without covering a lower portion of the sidewall of the first support opening after laterally expanding the first support opening; and forming annular fin cavities around the laterally-expanded first support opening by etching portions of the sacrificial material layers that are proximal to the laterally-expanded first support opening selective to the insulating layers.

* * * * *